United States Patent [19]

Oki et al.

[11] Patent Number: 5,728,592
[45] Date of Patent: Mar. 17, 1998

[54] METHOD FOR FABRICATING A THIN FILM TRANSISTOR MATRIX DEVICE

[75] Inventors: Ken-ichi Oki; Ken-ichi Yanai; Tamotsu Wada; Koji Ohgata; Yutaka Takizawa; Masahiro Okabe; Tsutomu Tanaka, all of Kawasaki, Japan

[73] Assignee: Fujitsu Ltd., Kawasaki, Japan

[21] Appl. No.: 499,000

[22] Filed: Jul. 6, 1995

Related U.S. Application Data

[62] Division of Ser. No. 134,824, Oct. 12, 1993, abandoned.

[30] Foreign Application Priority Data

| Oct. 9, 1992 | [JP] | Japan | 4-271630 |
| Jul. 8, 1993 | [JP] | Japan | 5-168807 |
| Sep. 7, 1993 | [JP] | Japan | 5-221645 |

[51] Int. Cl.$^6$ .............. H01L 21/84; H01L 21/288; H01L 21/31
[52] U.S. Cl. .............. 437/21; 437/41; 437/51; 437/181; 257/59; 257/749; 349/42; 349/147
[58] Field of Search .............. 257/59, 72, 749; 359/54, 59, 61, 87, 88; 437/181, 21, 40 TFT, 40 TFI, 41 TFT, 41 TFI, 51, 230, 237; 430/20; 349/42, 43, 46, 139, 147, 148, 152

[56] References Cited

U.S. PATENT DOCUMENTS

| 4,778,560 | 10/1988 | Takeda et al. | 437/181 |
| 4,894,690 | 1/1990 | Okabe et al. | 257/59 |
| 4,990,460 | 2/1991 | Moriyama | 437/40 TFI |
| 5,032,531 | 7/1991 | Tsutsui et al. | 437/181 |
| 5,032,536 | 7/1991 | Oritsuki et al. | 437/181 |
| 5,084,905 | 1/1992 | Sasaki et al. | 257/347 |
| 5,107,355 | 4/1992 | Satoh et al. | 359/54 |
| 5,124,823 | 6/1992 | Kawasaki et al. | 257/72 |
| 5,156,986 | 10/1992 | Wei et al. | 257/347 |
| 5,206,749 | 4/1993 | Zavracky et al. | 257/347 |
| 5,212,574 | 5/1993 | Katayama et al. | 359/59 |
| 5,314,770 | 5/1994 | Yamasita et al. | 430/20 |
| 5,561,075 | 10/1996 | Nakazawa | 257/72 |

FOREIGN PATENT DOCUMENTS

| 0483824 | 5/1992 | European Pat. Off. | 257/347 |
| 63-9977 | 1/1988 | Japan | 257/72 |
| 1-29821 | 1/1989 | Japan | 257/59 |
| 1-31457 | 2/1989 | Japan | 437/40 TFT |
| 3-135079 | 6/1991 | Japan | 437/181 |
| 4-34418(A) | 2/1992 | Japan . | |

Primary Examiner—Charles L. Bowers, Jr.
Assistant Examiner—Leon Radomsky
Attorney, Agent, or Firm—Staas & Halsey

[57] ABSTRACT

A thin film transistor matrix device is fabricated by forming a transparent conductor film and a metal film on an insulating substrate in this order. The metal film and the transparent conductor film are together patterned to form picture element electrodes, and drain bus lines or gate bus lines. Source electrodes and drain electrodes may also be formed from the transparent conductor film and metal film. A semiconductor layer, an insulating film and a conductor film may be formed on the entire surface in this order. In this case, the conductor film, the insulator film and the semiconductor layer are patterned to form an active layer from the semiconductor layer, gate insulating films from the insulating film, and gate electrodes and gate bus lines from the conductor film. By patterning the conductor film, the insulating film and the semiconductor layer, the metal film of the picture element electrodes and drain bus lines is exposed. Alternatively, the metal film may be patterned with the semiconductor layer, insulating film and conductor film to expose the transparent conductor film. A current is applied to the drain bus lines or gate bus lines in an electrolyte solution to selectively form a film on the drain bus lines or gate bus lines. The film may be a protecting film serving as a mask to allow the metal film on the picture element electrodes to be etched.

23 Claims, 61 Drawing Sheets

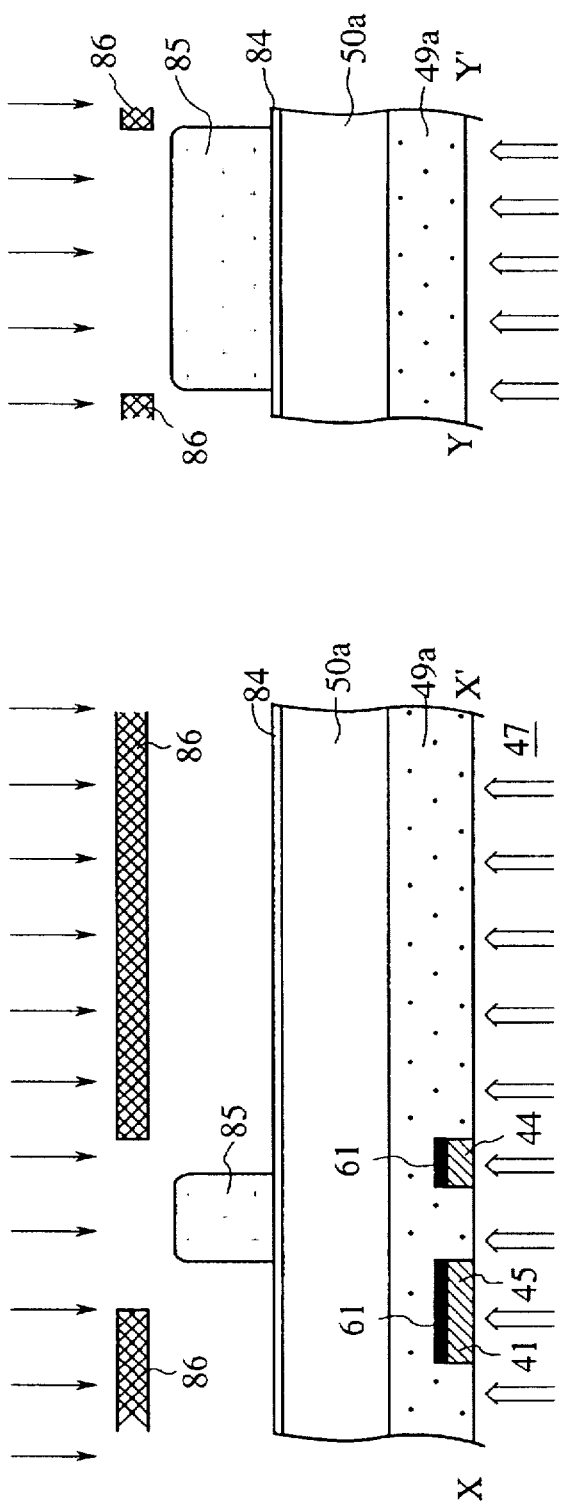
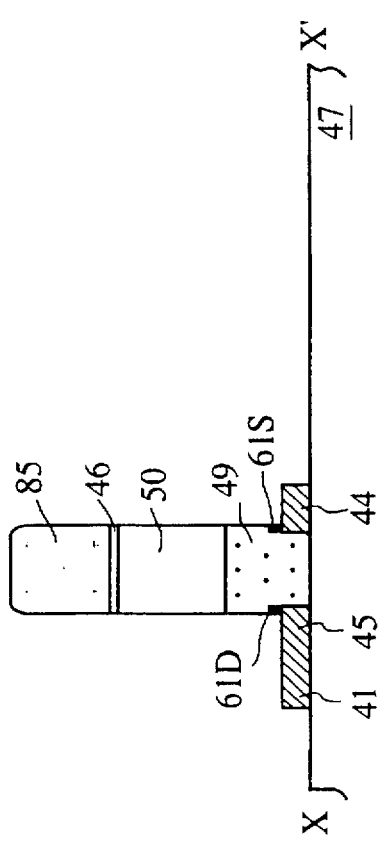
FIG. 49A1  FIG. 49A2  FIG. 49B1  FIG. 49B2

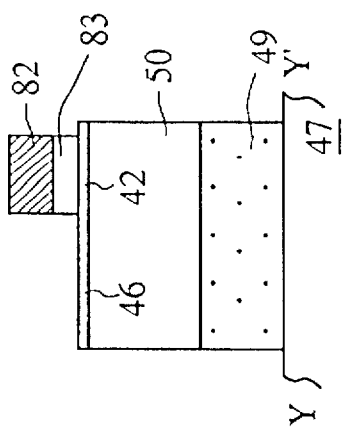
FIG. 50A2
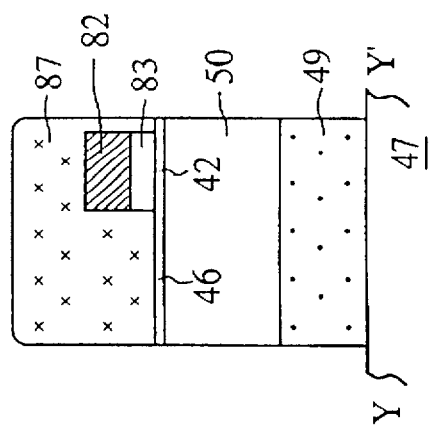
FIG. 50B2
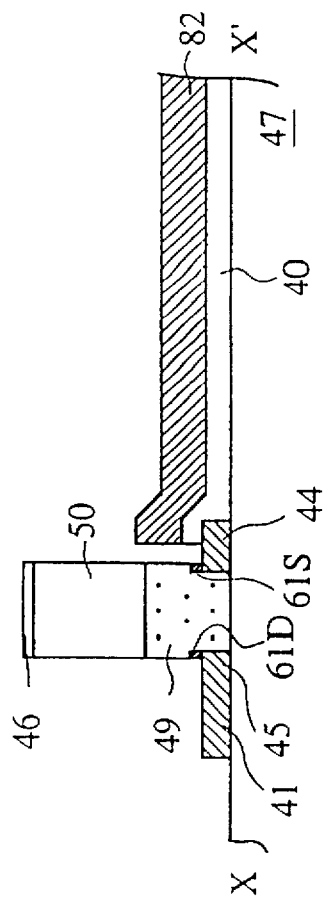
FIG. 50A1
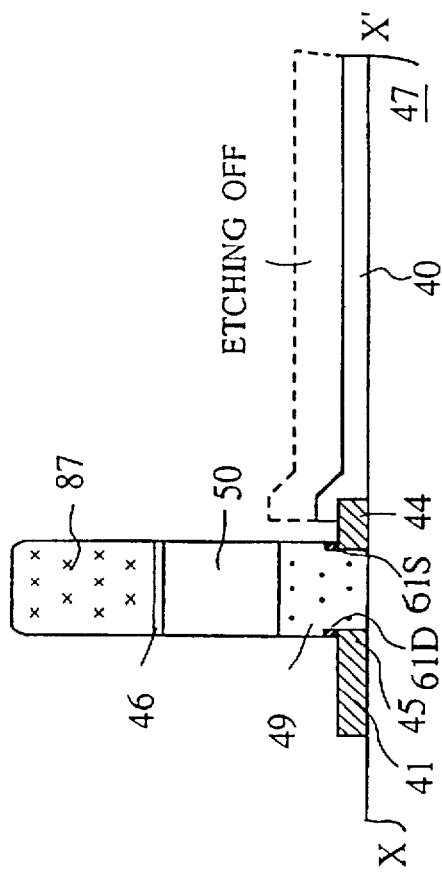
FIG. 50B1

METHOD FOR FABRICATING A THIN FILM TRANSISTOR MATRIX DEVICE

This application is a division of application Ser. No. 08/134,824, filed Oct. 12, 1993, abandoned.

BACKGROUND OF THE INVENTION

This invention relates to a TFT (thin film transistor) matrix device and a method for fabricating the same, specifically to a TFT matrix device for use in active matrix liquid crystal display devices which control displays by TFTs disposed for the respective picture elements.

Active matrix liquid display devices, along with simple matrix liquid display devices, are used in thin information terminal display devices. An active matrix liquid display device can drive a number of picture elements arranged in a matrix independently from each other.

The active matrix liquid display has an advantage that even if an increase in a number of picture elements accompanies an increase in a line number to be driven, problems, such as drops of duty ratios of drive signals, drops of contrast, decreases of vision angles, etc., do not occur. Accordingly, active matrix liquid crystal devices can provide color displays as good as CRTs (cathode-ray tubes) and has increasing applications as thin flat displays in projection-type televisions, lap-top personal computers.

But a TFT matrix substrate for use in an active matrix liquid crystal display device requires a complicated structure in which TFTs are provided for respective picture elements as the switch devices, which makes fabrication steps of the active matrix liquid display device complicated. A resultant problem is that, in the case that an active matrix liquid crystal display device is large-sized, its fabrication yield much lowers, and its cost rises. In view of this problem, studies are made to simplify structures of active matrix liquid display devices to decrease their fabrication costs.

As screens of active matrix display devices are up-sized, lengths of bus lines for transmitting signals from outside drive circuits are longer, and liquid crystal capacities and parasitic capacities which are loads of the bus lines. Consequently signal delays which are determined by resistances and load capacities of the bus lines are increased, and the signal delays lead to deterioration of display qualities. Thus to suppress drops of the display qualities it is now necessary to decrease resistances of the bus lines and suppress signal delays.

A conventional TFT matrix device will be explained with reference to FIGS. 56 to 60C.

FIG. 56 is a plan view of a conventional TFT matrix device, FIGS. 57A to 58B are sectional views of a TFT region in its fabrication steps, FIG. 59A is a sectional view of the drain bus line region, and FIGS. 60A to 60C are sectional views of a drain bus line region and the picture element electrode region in its fabrication steps.

A plurality of picture element electrode 100 of FIG. 56 are arranged in a matrix. Drain bus lines 101 are provided vertically, and gate bus lines 102 are provided horizontally, as viewed in FIG. 56. A plurality of TFT 103 are positioned near the intersections between the drain bus lines 101 and the gate bus lines 102.

Next, the method of forming each TFT region will be explained in good detail with reference to the sectional view (FIGS. 57A to 58B) along the line X-X' of FIG. 56.

A light shielding film 105 is formed on a glass substrate 106 at a set position, and then an inter-layer insulating film 106 is formed on the entire surface of the glass substrate 106. The glass substrate 104 with the inter-layer insulating film 106 thereon will be hereinafter called transparent insulating substrate 107.

Then, a transparent conductor film of, e.g., ITO (Indium Tin Oxide) film is formed on the transparent insulating substrate 107, and then an impurity-content amorphous silicon film is formed on the transparent conductor film.

Subsequently, the impurity-content amorphous silicon film and the transparent conductor film are patterned to form a source electrode 108S and a drain electrode 108D of the transparent conductor film, and a source electrode contact layer 109S and a drain electrode contact layer 109D of the impurity-content amorphous silicon film. A region between the edges of the source electrode 108 and the drain electrode 108D, which are opposed to each other above the light shielding film 105, will be a channel region of TFT to be formed (FIG. 57A).

Then, on the entire surface are formed an amorphous silicon film 110a, a SiN (silicon nitride) film 111a, and an Al (aluminum) film 112a in this stated order, and then a resist film 113 is deposited on the Al film 112a. The resist film 113 is patterned in a set configuration (FIG. 57B). Subsequently, with the patterned resist film 113 as the mask, an Al film 112a, an SiN film 111a, an amorphous silicon film 110a, a source electrode contact layer 109S and a drain electrode contact layer 109D are etched into a mesa to form a gate electrode 112 of the Al film 112a, a gate insulating film 111 of the SiN film 111a, and an active layer, or an operational semiconductor layer 110 of the amorphous silicon film 110a (FIG. 58A).

Thus is fabricated a staggered TFT including the source electrode 108S and the drain electrode 108D formed opposed to each other on the transparent insulating substrate 107, the operational semiconductor layer 110 connected to the source electrode 108S and the drain electrode 108D respectively through the source electrode contact layer 109S and the drain electrode contact layer 109D, and the gate electrode 112 formed on the channel region of the operational semiconductor layer 110 between the source electrode 108S and the drain electrode 108D through the gate insulating film 111 (FIG. 58B).

In the thus-fabricated staggered TFT 102, as apparent in FIG. 58B, the side surfaces of the gate electrode 112, those of the gate insulating film 111, those of the operational semiconductor layer 110, and those of the source electrode contact layer 109S or the drain electrode contact layer 109D are in the same plane. Accordingly, there is a possibility that leak currents might flow through the side surfaces between the gate electrode 112 and the source electrode 108S or the drain electrode 108D.

Next, the method for forming the drain bus line region will be explained in good detail with reference to a sectional view (FIG. 59A) along the line Y-Y' in FIG. 56.

This forming method is involved in the simple method for fabricating a TFT matrix device disclosed in Japanese Patent Laid-Open Publication No. 501562/1984, Japanese Patent Laid-Open Publication No. 500745/1987, etc.

The source electrode 108S and the drain electrode 108D of the transparent conductor film, the drain bus line 101, and the picture element electrode 100 are patterned on the transparent insulating substrate 107 using a first mask, and then on the entire surface the amorphous silicon film 110a, the SiN film 111a, and the Al film 112a are formed in the stated order. The impurity-content amorphous silicon film forming the source electrode contact layer and the drain electrode contact layer are not explained here.

Subsequently, using a second mask, the Al film 112a, the SiN film 111a and the amorphous silicon film 110a are etched off to pattern the gate bus line 102 serving also as the gate electrode 112 of the Al film 112a, and separate the TFT 103. Thus as shown in FIG. 57A, the drain bus line 101 is formed of the transparent conductor film as the picture element electrode 100.

Thus, because the drain bus line 101 is formed of the transparent conductor film having a higher specific resistance compared with a metal film, the drain bus line 101 has high resistances. When a film thickness of the transparent conductor film is increased for lower resistances, the coverage of the operational conductor layer 110 formed on the transparent conductor film is lowered, which affects on characteristics of the TFT 103. As a result, a thickness of the transparent conductor film is limited to about 200 nm, and the drain bus line 101 cannot help having a high resistance.

As means against high resistances of the drain bus line 101 sometimes the drain bus line as in FIG. 57B is used.

In this case, the electrode layer patterned using the first mask is provided by a superposed layers comprising the transparent conductor film and the metal film 114. In the same way as FIG. 57A, the gate bus line 102 functioning as the gate electrode 112 is patterned using the second mask, and the SiN film 111a and the amorphous silicon film 110a are etched to separate the TFT 103. Then that part of the metal film 114 on the picture element electrode 100 is etched to make the picture element electrode region transparent.

That is, for a lower resistance of the drain bus line, that of the Al film 112a in a region 115 on the drain bus line 101 between two adjacent gate bus lines 102 is left, whereby the metal film 114 below the Al film 112a at the region 115 is left.

Thus, the drain bus line 101 has a superposed layer structure comprising the transparent conductor film and the metal film 114 thereon in the region 115 between intersections of the drain bus line 101 with the adjacent gate bus lines 102, and in regions 116 at these intersections. In this means, the drain bus line has lower resistance values than in the conventional art of FIG. 57A.

But, when the Al film 112a left in the region 115 on the drain bus line 101 is electrically connected to at least one gate bus line 102, a capacity coupling between the bus lines is increased, resultantly causing problems of deformations in a drive waveform, and short circuits between the bus lines. So that, it is necessary to provide regions 117, 118 without the Al film 112a left between the region 115 on the drain bs line 101 and the gate bus line 102.

In the presence of the regions 117, 118 without the Al film 112a left, those parts of the metal film 114 on the transparent conductor film are concurrently etched off in the step of etching off that part of the metal film 114 on the picture element electrode 100 to make the picture element electrode region transparent. As shown in FIG. 59B, the drain bus line 101 includes only the transparent conductor film alone in the regions 117, 118, so that increases of a resistance value of the drain bus line 101 due to a resistance of the transparent conductor film in these regions 117,118 cannot be prevented.

Thus, in either case of FIGS. 59A and 59B, the drain bus lines 101 cannot be prevented from having high resistance values.

Next, the method for forming the drain bus line region and the picture element electrode regions will be explained in good detail with reference to the sectional view (FIGS. 60A to 60C) along the line Z-Z' in FIG. 56.

A TFT matrix device usually includes transparent picture element electrode regions for bright displays, and drain bus line regions for low resistances. For this reason, the picture element electrodes are formed of a transparent conductor film, and the drain bus lines are formed of a transparent conductor film with a metal film thereon.

First, a transparent conductor film is formed on the entire surface of a transparent conductor substrate 107, and a first resist film 119 is patterned in a set configuration. Subsequently, with the first resist film 119 as the mask, the transparent conductor film is etched to form picture element electrodes 100 and drain bus lines 101 (FIG. 60A).

Then, a metal film 120 is formed on the entire surface (FIG. 60B). Subsequently, a second resist film 121 is patterned in a configuration of the drain bus lines on the metal film 120. Then with the second resist film 121 as the mask, the metal film 120 on the picture element electrodes 100 is etched off (FIG. 60C).

Thus, the picture element electrodes 100 are formed of the transparent conductor film alone, whereby transparency of the picture element electrode region is ensured, while the metal film 120 is formed on the drain bus lines 101, whereby the drain bus lines 101 having the same structure as in FIG. 59B are formed, and their resistance value is decreased.

But in the conventional method of FIGS. 60A to 60C, the picture element electrodes 100 and the drain bus lines 101 are formed by two lithography steps using the two different resist films 119, 121. For this reason, a design has to be made, taking into consideration an alignment margin between the first and the second resist films 119, 121, and a larger area is required for the bus lines with a resultant problem of decreased opening ratios.

As described above, the conventional TFT matrix device has a problem that leak currents flow between the gate electrode 112 and the source electrode 108S or the drain electrode 108D along the side surfaces of the gate electrodes 112, the gate insulating film 111 and the operational semiconductor layer 110, and the source electrode contact layer 109S or the drain electrode contact layer 109D, which are in one plane as shown in FIG. 58B.

Another problem is that, as in FIGS. 59A and 59B, the drain bus lines 101 cannot be prevented from having high resistances.

Further another problem is that, as in FIGS. 60A to 60C, in the case that transparency of the picture element electrodes 100 is ensured, and a resistance of the drain bus line 101 is decreased, a larger area is needed to form the drain bus line 101, intruding an area of the picture element electrodes 100 with a result of decreased opening ratios.

SUMMARY OF THE INVENTION

An object of this invention is to provide a TFT matrix device and a method for fabricating the same, which can suppress leak currents which occur between the gate electrode and the source electrode or the drain electrode along the mesa side surfaces of the TFT, can reduce resistances of the drain bus lines, can reduce an area required to form the drain bus lines to increase an area of the picture element electrodes, can have high display quality, and can be produced with high yields.

The above-described object is achieved by a thin film transistor matrix device comprising an insulating substrate; a plurality of picture element electrodes arranged in a matrix on the insulating substrate; source electrodes connected to the respective picture element electrodes; drain electrodes opposed to the respective source electrodes; active layer, or operational semiconductor layers sandwiched by the source electrodes and the drain electrodes; and gate electrodes formed on the operational semiconductor layers through gate insulating films, each gate electrode being narrowed with respect to the associated gate insulating film so that side edges, or side walls of the gate electrode forms a step with respect to side walls of the associated gate insulating film which is a substrate of the gate electrode.

In the above-described thin film transistor matrix device, the gate electrodes are coated with a protecting film.

In the above-described thin film transistor matrix device, only side walls of the gate electrodes are coated with the protecting film.

In the above-described thin film transistor matrix device, side walls of the protecting film on the side walls of the gate electrodes form one plane together with side walls of the gate insulating film.

In the above-described thin film transistor matrix device, the protecting film coats also side walls of the gate insulating film and side walls of the operational semiconductor layer.

The above-described object is achieved by a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided in a first direction between the picture element electrodes, and connected commonly to drain electrodes of the respective thin film transistors; gate bus lines intersecting the drain bus lines in a second direction which normally intersects the first direction, and connected commonly to the gate electrodes, a first metal film being formed on parts of the drain bus lines at intersections where the drain bus lines intersect the gate bus lines through an insulating film, a second metal film interconnecting the first metal being formed on parts of the drain bus lines between the intersections where the drain bus lines intersect the gate bus lines.

In the above-described thin film transistor matrix device, a third metal film is formed on the drain bus lines.

In the above-described thin film transistor matrix device, the second metal film on said parts of the drain bus lines has surfaces thereof coated with a protecting film.

In the above-described thin film transistor matrix device, the gate bus lines have surfaces thereon coated with the protecting film.

In the above-described thin film transistor matrix device, the protecting film is a resin film.

In the above-described thin film transistor matrix device, the protecting film is an oxide film.

In the above-described thin film transistor matrix device, the protecting film is a polymer film.

The above-described object is achieved by a method for fabricating a thin film transistor matrix device comprising an insulating substrate; a plurality of picture element electrodes arranged in a matrix on the insulating substrate; source electrodes connected to the respective picture element electrodes; drain electrodes opposed to the respective source electrodes; active layers sandwiched by the source electrodes and the drain electrodes; gate insulating films formed on the active layers; and gate electrodes formed on the gate insulating films, the method comprising: a first step of forming a transparent conductor film on the insulating substrate and then patterning the transparent conductor film in a set configuration to form the source electrodes and the drain electrodes which are formed of the transparent conductor film; a second step of forming a semiconductor layer, an insulating film and a conductor film on the entire surface in the stated order; a third step of etching isotropically the conductor film with a resist of a set configuration formed on the conductor film as a mask to form the gate electrodes of the conductor film narrower than its pattern of the resist, and etching anisotropically the insulating film and the semiconductor layer with the resist as a mask to form the gate insulating film of the insulating film, and the operational semiconductor layer of the semiconductor layer; a fourth step of forming a protecting film for coating the gate electrodes.

The above-described object is achieved by a method for fabricating a thin film transistor matrix device comprising an insulating substrate; a plurality of picture element electrodes arranged in a matrix on the insulating substrate; source electrodes connected to the respective picture element electrodes; drain electrodes opposed to the respective source electrodes; operational semiconductor layers sandwiched by the source electrodes and the drain electrodes; and gate electrodes formed on the operational semiconductor layers through gate insulating films, the method comprising: a first step of forming a transparent conductor film on the insulating substrate and then patterning the transparent conductor film in a set configuration to form the source electrodes and the drain electrodes which are formed of the transparent conductor film; a second step of forming a semiconductor layer, an insulating film and a conductor film on the entire surface in the stated order; a third step of etching the conductor film with a resist of a set configuration formed on the conductor film as a mask to form the gate electrodes of the conductor film; a fourth step of forming a protecting film for coating the gate electrodes; and a fifth step of etching the insulating film and the semiconductor layer with the protecting film as a mask to form the gate insulating film of the insulating film, and the operational semiconductor layer of the semiconductor layer.

In the above-described method for fabricating a thin film transistor matrix device, the fifth step is followed by a sixth step of fluidizing the protecting film to coat even side edges of the the gate insulating film and the active layer.

In the above-described method for fabricating a thin film transistor matrix device, the protecting film is an electrodeposited resin film.

In the above-described method for fabricating a thin film transistor matrix device, the fifth step is followed by a sixth step of removing the protecting film.

In the above-described method for fabricating a thin film transistor matrix device, the fourth step is for removing the resist formed in the third step and then forming the protecting film for coating the entire surfaces of the gate electrodes.

In the above-described method for fabricating a thin film transistor matrix device, the fourth step is for forming the protecting film for coating only side walls of the gate electrodes with the resist formed in the third step left.

In the above-described method for fabricating a thin film transistor matrix device, the third and the fourth steps are for etching the conductor film with the resist formed in the set configuration on the conductor film as a mask to form the gate electrodes of the conductor film, concurrently forming the protecting film on side walls of the gate electrodes.

In the above-described method for fabricating a thin film transistor matrix device, the fourth step is for forming the protecting film of an electrodeposited resin film on the entire surfaces of the gate electrodes or the side walls of the gate electrodes by electrodeposition process.

In the above-described method for fabricating a thin film transistor matrix device, the fourth step is for forming the protecting film of an anodic oxidation film on the entire surfaces of the gate electrodes or the side walls of the gate electrodes by anodic oxidation process.

In the above-described method for fabricating a thin film transistor matrix device, the fourth step is for exposing the entire surfaces of the gate electrodes or the side walls of the gate electrodes to plasma of a protecting film forming gas to form the protecting film of a polymer film.

In the above-described method for fabricating a thin film transistor matrix device, the third and the fourth steps are for etching the conductor film in the set configuration to form the gate electrodes of the conductor film, and concurrently forming the protecting film of a polymer film on the side walls of the gate electrodes by using plasma of a mixed gas of an etching gas and a protecting film forming gas with the resist formed on the conductor film.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the thin film transistors, the method comprising steps of: forming a transparent conductor film and a metal film on the insulating substrate in the stated order, and patterning the metal film and the transparent conductor film into a configuration which contains at least the picture element electrodes, and the bus drain lines or the gate bus lines; applying a current to the drain bus lines or the gate bus lines in an electrolyte solution to form a protecting film on the drain bus lines or the gate bus lines and on patterns electrically connected to the drain bus lines or the gate bus lines; and etching off the metal film on the picture element electrodes with the protecting film as a mask.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the thin film transistors, the method comprising: a first step of forming a transparent conductor film and a metal film on the insulating substrate in the stated order, and patterning the metal film and the transparent conductor film in a set configuration to form the picture element electrodes, the source electrodes, the drain electrodes and the drain bus lines which are formed of the transparent conductor film and have the metal film on upper surfaces thereof; a second step of forming a semiconductor layer, an insulating film and a conductor film on the entire surface in the stated order, patterning the conductor film, the insulating film and the semiconductor layer in a set configuration to form the operational semiconductor layer of the semiconductor layer, the gate insulating films of the insulating film, and the gate electrodes and the gate bus lines of the conductor film, while to expose the metal film on the picture element electrodes and the drain bus lines; a third step of applying a current to the drain bus lines in an electrolyte solution to selectively form a protecting film on the metal film on the drain bus lines; and a fourth step of etching off the metal film on the picture element electrodes with the protecting film as a mask to expose the transparent conductor film of the picture element electrodes.

In the above-described method for fabricating a thin film transistor matrix device, the third step is for applying a current to the drain bus lines and the gate bus lines in the electrolyte solution to selectively form protecting films on the metal film on the drain bus lines, and on the conductor film of the gate bus lines.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drains of the respective thin film transistors; gate bus lines intersecting the drain bus lines between the picture element electrodes in a second direction which normally intersects the first direction, and commonly connected to the gate electrodes of the respective thin film transistors, the method comprising: a first step of forming a transparent conductor film and a metal film on the insulating substrate in the stated order, and patterning the metal film and the transparent conductor film in a set configuration to form the picture element electrodes, the source electrodes, the drain electrodes and the drain bus lines which are formed of the transparent conductor film and have the metal film on upper surfaces thereof; a second step of applying a current to the drain bus lines in an electrolyte solution to selectively form a protecting film on the metal film on the drain bus lines; a third step of etching off the metal film on the picture element electrodes with the protecting film as a mask to expose the transparent conductor film of the picture element electrodes; and a fourth step of forming a semiconductor layer, an insulating film and a conductor film on the entire surface in the stated order, and patterning the conductor film, the insulating film and the semiconductor layer in a set configuration to form the operational semiconductor layer of the semiconductor layer, the gate insulating film of the insulating film, the gate electrodes and the gate bus lines of the conductor film, while to expose the transparent conductor film of the picture element electrodes.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drains of the respective thin film transistors; gate bus lines intersecting the drain bus lines between the picture element electrodes in a second direction which normally intersects the first direction, and commonly connected to the gate electrodes of the respective thin film transistors, the method comprising: a first step of forming a conductor film on the insulating substrate, and patterning the conductor film in a set configuration to form the gate electrodes and the gate bus lines which are formed of the conductor film; a second step of forming an gate insulating film and a semiconductor layer on the entire surface in the stated order, and patterning the semiconductor layer in a set configuration to form the operational semiconductor layer of the semiconductor layer; a third step of forming a transparent conductor film and a metal film on the entire surface in the stated order and patterning the metal film and the transparent conductor film in a set configuration to form the picture element electrodes, the source electrodes, the drain electrodes and the drain bus lines which are formed of the transparent conductor film and have the metal film on upper surfaces thereof; a fourth step of applying a current to the drain bus lines in an electrolyte solution to selectively form a protecting film on the metal film on the drain bus lines; and a fifth step of etching off the metal film on the picture element electrodes to expose the transparent conductor film of the picture element electrodes.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the thin film transistors; gate bus lines intersecting the drain buns lines between the picture element electrodes in a second direction, and commonly connected to gate electrodes of the thin film transistors, the method comprising: a first step of forming a transparent conductor film and a first metal film on the insulating substrate in the stated order, and patterning the first metal film and the transparent conductor film in a set configuration to form the picture element electrodes, the gate electrodes and the gate bus lines which are formed of the transparent conductor film and have the first metal film on upper surfaces thereof; a second step of applying a current to the gate bus lines in an electrolyte solution to selectively form a protecting film on the first metal film of the gate bus lines; a third step of etching off the first metal film on the picture element electrodes with the protecting film as a mask to expose the transparent conductor film of the picture element electrodes; a fourth step of forming a gate insulating film and a semiconductor layer on the entire surface, and patterning the gate insulating film and the semiconductor layer in a set configuration to form the operational semiconductor layer of the semiconductor layer; and a fifth step of forming a second metal film on the entire surface and patterning the second metal film in a set configuration to form the source electrodes, the drain electrodes and the drain bus lines which are formed of the second metal film.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the respective thin film transistors, the method comprising: a first step of forming a first metal film on the insulating substrate and patterning the first metal film in a set configuration to form the source electrodes, the drain electrodes and the drain bus lines which are formed of the first metal; a second step of forming a semiconductor layer, an insulating film and a conductor film on the entire surface in the stated order, and patterning the conductor film, the insulating film and the semiconductor layer in a set configuration to form the operational semiconductor layer of the semiconductor layer, the gate insulating film of the insulating film, the gate electrodes and the gate bus lines of the conductor film; a third step of forming a transparent conductor film and a second metal film on the entire surface in the stated order, and patterning the second metal film and the transparent conductor film in a set configuration to form the picture element electrodes which are formed of the transparent conductor film and have the second metal film on upper surfaces thereof, while to leave the transparent conductor film and the second metal film on the gate bus lines; a fourth step of applying a current to the gate bus lines in an electrolyte solution to selectively form an protecting film on the second metal film on the gate bus lines, and on the gate electrodes; and a fifth step of etching off the second metal film on the picture element electrodes with the protecting film as a mask to expose the transparent conductor film of the picture element electrodes.

In the above-described thin film transistor matrix device, the third step is for forming a transparent conductor film and a second metal film on the entire surface in the stated order, and patterning the second metal film and the transparent conductor film in the set configuration to form the picture element electrodes of the transparent conductor film, while to leave the transparent conductor film and the second metal film on the gate bus lines and the drain bus lines; and the fourth step is for applying a current to the gate bus lines and the drain bus lines in the electrolyte solution to selectively form the protecting film on the second metal film on the gate bus lines and the drain bus lines, and on the gate electrodes.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction, and commonly connected to gate electrodes of respective the thin film transistors, the method comprising: a first step of forming a transparent conductor film and a first metal film on the insulating substrate in the stated order and patterning the first metal film and the transparent conductor film in a set configuration to form the picture element electrodes, the source electrodes, the drain electrodes and the drain bus lines which are formed of the transparent conductor film and have the first metal film on upper surfaces thereof; a second step of applying a current to the drain bus lines in an electrolyte solution to selectively form a second metal film on the first metal film on the drain bus lines; a third step of forming a semiconductor layer, an insulating film and a conductor film on the entire surface in the stated order, and patterning the semiconductor layer, the insulating film and the conductor film in a set configuration to form the operational semiconductor layer of the semiconductor layer, the gate insulating film of the insulating film, the gate electrodes and the gate bus lines of the conductor film, while to expose the first metal on the picture element electrodes, and the second metal film above the drain bus lines; and a fourth step of etching off the first metal film on the picture element electrodes with the second metal film as a mask to expose the transparent conductor film of the picture element electrodes.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which is normally intersects the first direction, and commonly connected to gate electrodes of the respective thin film transistors, the method comprising: a first step of forming a transparent conductor film on the insulating substrate and patterning the transparent conductor film in a set configuration to form the picture element electrodes, the source electrodes, the drain electrodes and the drain bus lines of the transparent conductor film; a second step of applying a current to the drain bus lines in an electrolyte solution to selectively form a metal film on the transparent conductor film of the drain bus lines; and a third step of forming a semiconductor layer, an insulating film and a conductor film on the entire surface in the stated order, and patterning the conductor film the insulating film and the semiconductor layer in a set configuration to form the operational semiconductor layer of the semiconductor layer, the gate insulating film of the insulating film, the gate electrodes and the gate bus lines of the conductor film, while to expose the transparent conductor film of the picture element electrodes.

The above-described object is achieved by a method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the respective thin film transistors, the method comprising: a first step of forming a transparent conductor film and a first metal film on the insulating substrate in the stated order, and patterning the first metal film and the transparent conductor film in a set configuration to form the picture element electrodes, the source electrodes, the drain electrodes and the drain bus lines which are formed of the transparent conductor film and have the first metal film on upper surfaces thereof; a second step of forming a semiconductor film, an insulating film and a conductor film on the entire surface in the stated order and patterning the conductor film, the insulating film, the semiconductor layer and the first metal film in a set configuration to form the operational semiconductor layer of the semiconductor layer, the gate insulating film of the insulating film, and the gate electrodes and the gate bus lines of the conductor film, while to expose the transparent conductor film of the picture element electrodes and of the drain bus lines; and a third step of applying a current to the drain ba lines in an electrolyte solution to selectively form a second metal film on a surface of the transparent conductor film of the drain bus lines.

In the above-described thin film transistor matrix device, the step of forming the protecting film is a step of forming an electrodeposited resin film as the protecting film by using electrodeposition process.

In the above-described thin film transistor matrix device, the step of forming the protecting film is a step of forming an anodic oxidation film as the protecting film by using anodic oxidation process.

In the above-described thin film transistor matrix device, the step of forming the protecting film is a step of forming a metal film as the protecting film by using electrodeposition process.

In the above-described thin film transistor matrix device, the step of forming the protecting film is a step of forming an electrodeposited resist by using electrodeposition process.

In the above-described method for fabricating a thin film transistor matrix device, the electrodeposited resist is electrodeposited, then bus line terminals of the drain bus lines or the gate bus lines are shielded from the ultraviolet rays which are irradiated to the electrodeposited resist to harden the electrodeposited resist, and when developed, the electrodeposited resist on the bus line terminals is removed; when the first or the second metal film on the picture element electrodes is etched off with the electrodeposited resist as a mask, the first or the second metal film on the bus line terminals is also etched off to expose the transparent conductor film of the bus line terminals.

In the above-described method for fabricating a thin film transistor matrix device, when the electrodeposited resist is electrodeposited, an electrodeposition voltage is set at about 3–50 V.

In the above-described method for fabricating a thin film transistor matrix device, when the electrodeposited resist is electrodeposited, a temperature of an electrodeposited resist is set at about 5°–20° C.

In the above-described method for fabricating a thin film transistor matrix device, after the electrodeposited resist is electrodeposited, the electrodeposited resist is dried at about 40°–75° C.

In this invention, the gate electrode is made narrower with respect to the gate insulating film to form a step between the side walls of the gate electrode with respect to those of the gate insulating film, whereby leak currents from the source electrode or the drain electrode to the gate electrode along the mesa side surfaces of the TFT can be simply suppressed. Accordingly a TFT matrix device having little wasteful current consumption can be realized.

Also in this invention, the first metal film is formed on the drain bus line at its intersection with the gate bus line through the insulating film, and the second metal film is formed on the drain bus line between its intersections. Accordingly a resistance of the drain bus line can be reduced, whereby a TFT matrix device which is free from display quality deterioration, such as crosstalks, poor contrast, etc. on large displays and can make high-quality displays can be realized.

Also this invention comprises the step of sequentially forming the transparent conductor film and the metal film on the insulating substrate, and then patterning the metal film and the transparent conductor film in a configuration including at least the picture element electrode, and the drain bus line or the pate bus line; charging a current to the drain bus line or the gate bus line in an electrolyte to form a protecting film only on the drain bus line or the gate bus line, and its electrically connected pattern; and the step of etching off the metal film on the picture element electrode with the protecting film as a mask, whereby the protecting film for etching off the metal film on the display electrode region can be formed by self alignment only on the bus line region.

Accordingly photolithographic steps which need matching with high precision using steppers can be reduced, fabrication steps can be simplified, and fabrication yields can be improved. Since it is not necessary to allow margins for mask matching in pattern designs, areas of the display electrode region can be made larger with increased opening ratios.

Thus, this invention can provide a TFT matrix device of high-quality display at low costs.

BRIEF DESCRIPTION OF THE DRAWINGS

FIGS. 19A, 19B to 20A, and 20B are sectional views of a staggered TFT region in the steps of a first method for fabricating the TFT matrix device according to a fifth embodiment of this invention;

FIGS. 49A1 and 49A2, 49B1–49B2, 50A1–50A2 and 50B1–50B2 are sectional views of the TFT matrix device along the line X-X' and the line Y-Y' in FIG. 47 in the respective steps of the fabrication method;

DETAILED DESCRIPTION OF THE INVENTION

1. First Embodiment

The TFT matrix device according to a first embodiment of this invention will be explained with reference to FIG. 1.

Figure 1:
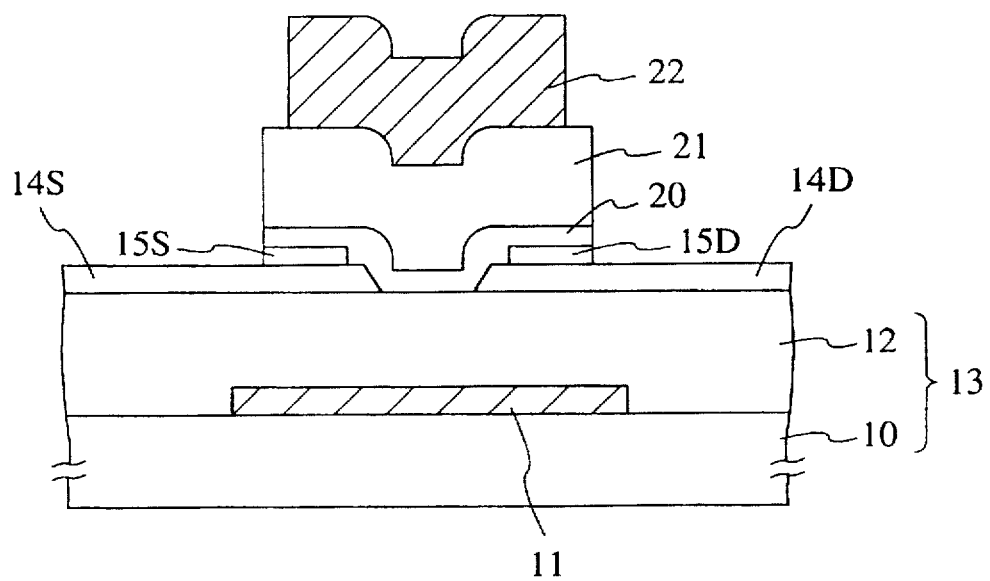
FIG. 1 is a sectional view of a staggered TFT region of the TFT matrix device according to a first embodiment of this invention.

FIG. 1 is a sectional view of a staggered TFT region of the TFT matrix device according to the first embodiment.

In the first embodiment, a light shielding film 11 of a 70 nm-thickness Cr (chromium) film is formed at a set position on a glass substrate 10 of, e.g., transparent glass. An inter-layer insulating film 12 of a 400 nm-thickness $SiO_2$ (silicon oxide) film is formed on the glass substrate 10 and the light shielding film 11. Hereinafter the glass substrate 10 with the inter-layer insulating film 12 thereon is called a transparent insulating substrate 13.

On the transparent insulating substrate 13, there are formed a source electrode 14S and a drain electrode 14D of a 50 nm-thickness ITO film oppositely. On the source electrode 14S and the drain electrode 14D, there are formed a source electrode contact layer 15S and a drain electrode contact layer 15D both formed of a $n^+$-amorphous silicon film.

An operational semiconductor layer 20 is formed of an amorphous silicon film on a part of the transparent insulating substrate 13 sandwiched by the source electrode contact layer 15S and the drain electrode contact layer 15D, and on the source electrode 14S and the drain electrode 14D. The operational semiconductor layer 20 is located above the light shielding film 11, and is ohmic contact with the source electrode 14S and the drain electrode 14D respectively through the source electrode contact layer 15S and the drain electrode contact layer 15D.

On the operational semiconductor layer 20, there is formed a gate electrode 22 of a 400 nm-thickness Al film through a gate insulating film 21 of a 300 nm-thickness SiN film. The gate electrode 22 is narrower than the gate insulating film 21, on which is formed the gate electrode 22, and the side walls of the gate electrode 22 and that of the gate insulating film 21 are not in the same plane. Such step configuration is a characteristic of this embodiment.

Next, a method for fabricating the staggered TFT region of the TFT matrix device of FIG. 1 will be explained with reference to FIGS. 2A to 5B.

FIGS. 2A to 5B are sectional views of the staggered TFT in the steps of the method for fabricating the staggered TFT region of the TFT matrix device according to the first embodiment.

A 70 nm-thickness Cr film is vapor-deposited on the glass substrate 10 by vacuum vapor deposition, and the Cr film is patterned into a set configuration by lithographic resist processing and wet-etching with an etchant of a secondary cerium ammonium nitrate+perchloric acid+water, and the light shielding film 11 of the Cr film is formed in a set position.

Figure 2A:
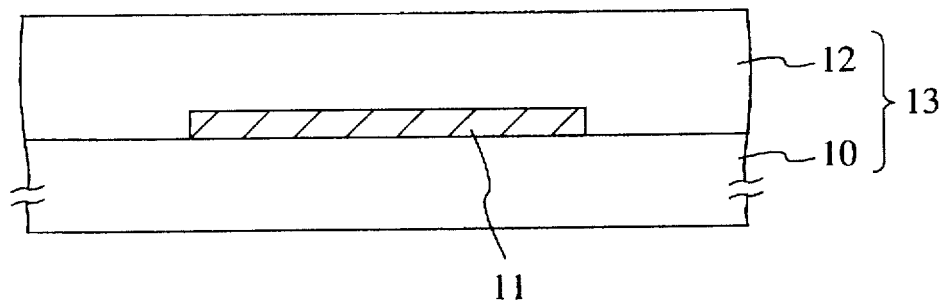
FIGS. 2A–B, 3A–C, 4A–B and 5A–B are sectional views of a staggered TFT region in the steps of a method for fabricating the TFT matrix device according to a first embodiment of this invention.

Then, the inter-layer insulating film 12 of a 400 nm-thickness SiO$_2$ is deposited on the entire surface by P-CVD (Plasma Chemical Vapor Deposition). Thus the transparent glass substrate 13 with the inter-layer insulating film 12 formed on the glass substrate 10 is prepared (FIG. 2A).

Then, a 50 nm-thickness ITO film 14a is formed on the entire surface by sputtering. Subsequently, a 35 nm-thickness n$^+$-amorphous silicon film 15a and a 50 nm-thickness SiO$_2$ film 16a are formed in the stated order by P-CVD.

Figure 2B:
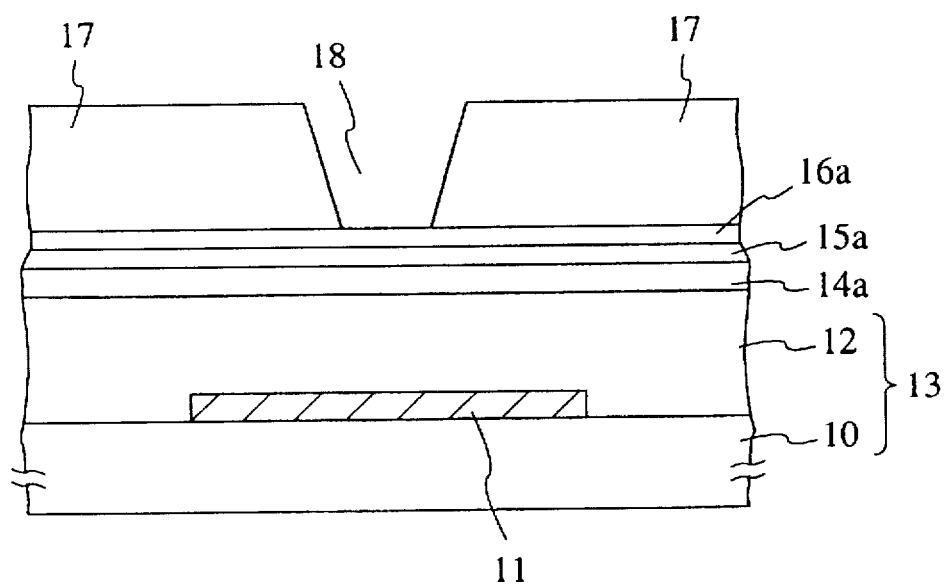

Then, a resist film 17 is formed on the SiO$_2$ film 16a by lithographic resist processing, while an opening 18 defining a channel region of the TFT is opened (FIG. 2B).

Then, the SiO$_2$ film 16a is wet-etched with a liquid mixture of HF+NH$_4$OH+H$_2$O with the resist film 17 as a mask to form an opening 19 for etching the n$^+$-amorphous silicon film 15a.

The opening 19 in the SiO$_2$ film 16a is formed by side etching larger than the opening 18 in the resist film 17, and the edge of the opening 19 is indented with respect to that of the opening 18.

The n$^+$-amorphous silicon film 15a is etched with the resist film 17 as a mask by RIE (Reactive Ion Etching) using a CCl$_4$ gas as an etching gas to form the source electrode contact layer 15s and the drain electrode contact layer 15D.

Figure 3A:
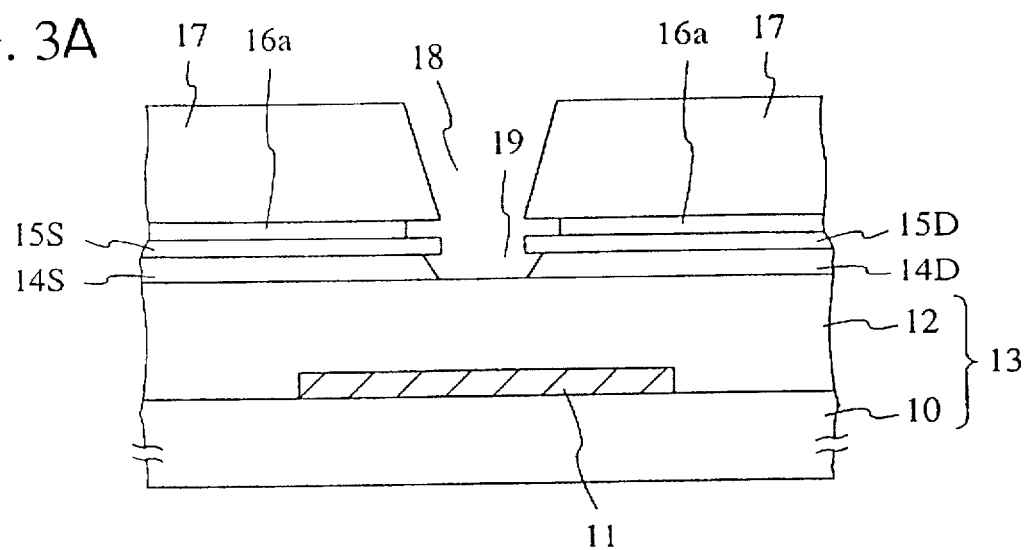

Then, the ITO film 14a is etched with the resist film 17, the source electrode contact layer 15S, the drain electrode contact layer 15D, etc. as a mask by wet-etching using a liquid mixture of HCl+HNO$_3$+H$_2$O as an etchant, and the source electrode 14S and the drain electrode are formed of the ITO film 14a oppositely (FIG. 3A).

Figure 3B:
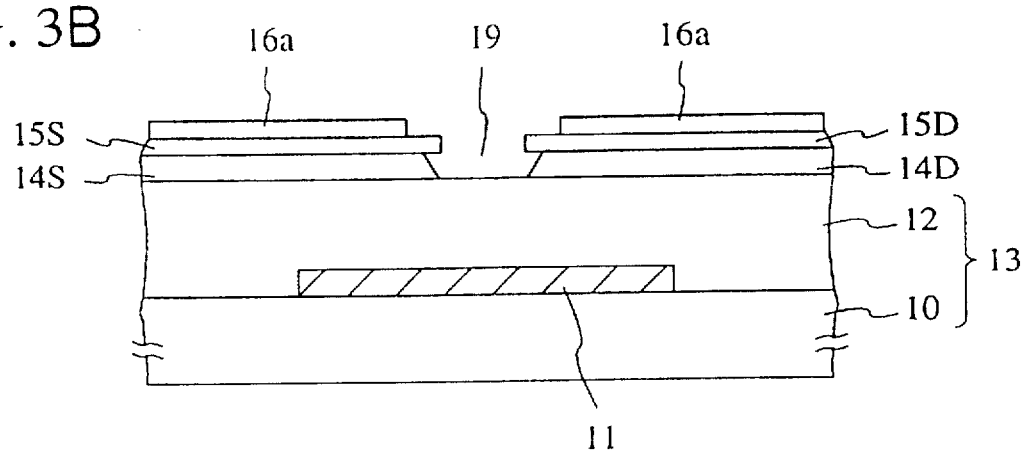

Subsequently, the whole is immersed in a resist peeling liquid to remove the resist film 17. In this state, the edges of the source electrode contact layer 15S and the drain electrode contact layer 15D are projected with respect to the edge of the SiO$_2$ film 16a in the opening 19 (FIG. 3B)

Figure 3C:
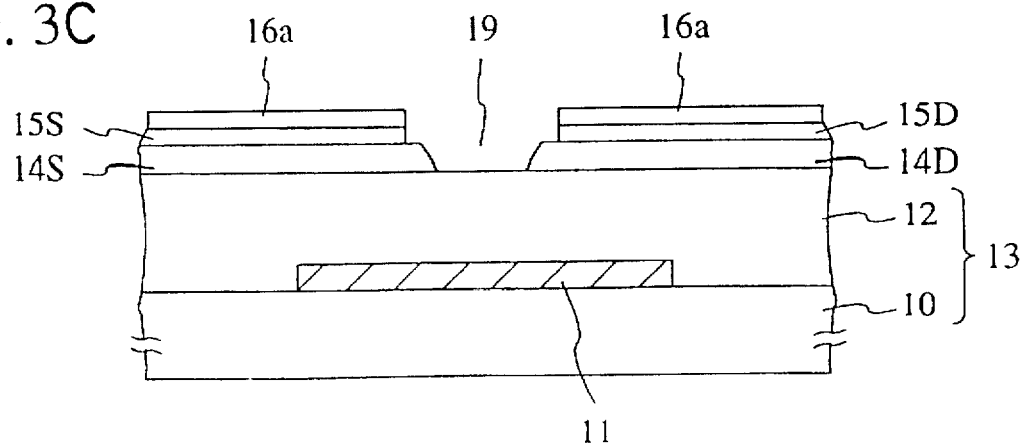

By RIE using a CCl$_4$ gas as an etching gas, the projected edges of the source electrode contact layer 15S and the drain electrode contact layer 15D are etched with the SiO$_2$ film 16a as a mask for the edge alignment (FIG. 3C).

Figure 4A:
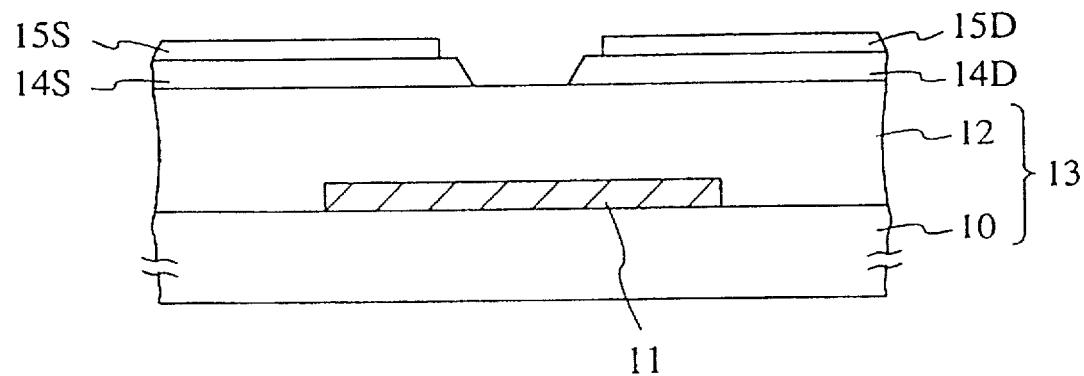

Then, the whole is immersed in a liquid mixture of HF+NH$_4$OH+H$_2$O$_2$ to etch off the SiO$_2$ film 16a (FIG. 4A).

Then, a 50 nm-thickness amorphous silicon film 20a, a 300 nm-thickness SiN film 21a and a 400 nm-thickness Al film 22a are formed in the stated order by P-CVD or by vacuum vapor deposition.

Figure 4B:
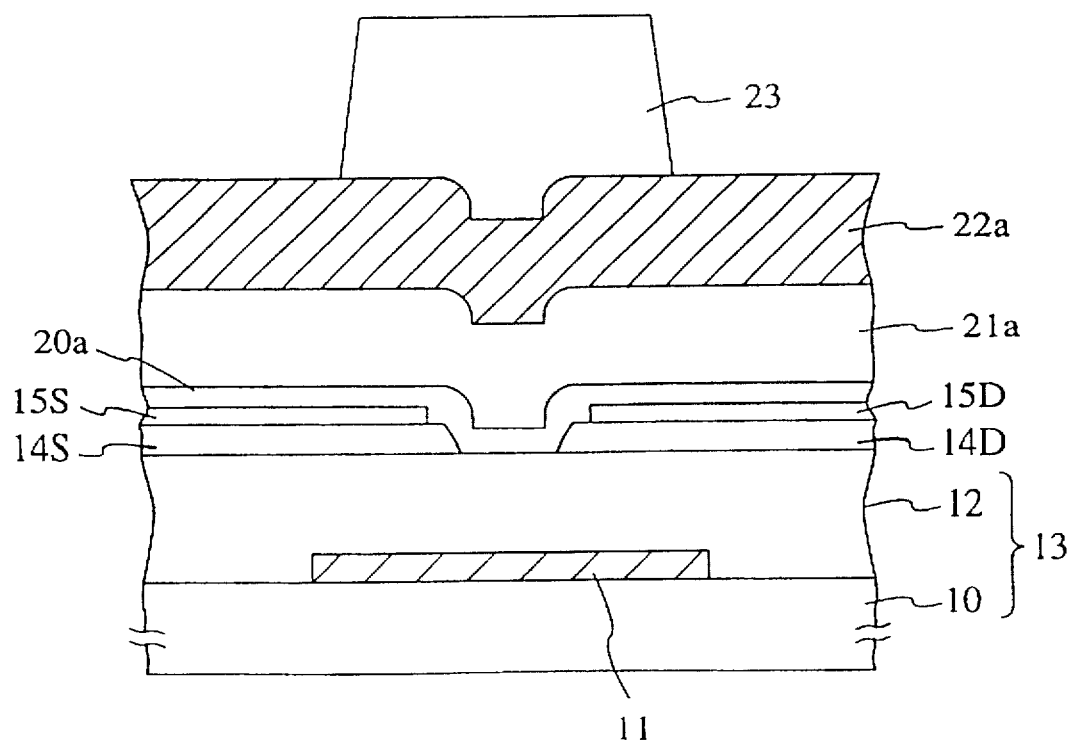

Subsequently, a resist film 23 is formed on the Al film 22a, while the resist film 23 is patterned in a configuration of gate electrode by lithographic resist processing (FIG. 4B).

Then, the Al film 22a is etched with the resist film 23 as a mask by wet-etching using a liquid mixture of H$_2$PO$_4$+HNO$_3$+CH$_3$COOH+H$_2$O, and the gate electrode 22 of the Al film 22a is formed. At this time, the Al film 22a is side-etched to make the gate electrode 22 narrower than its pattern of the resist film 23.

Figure 5A:
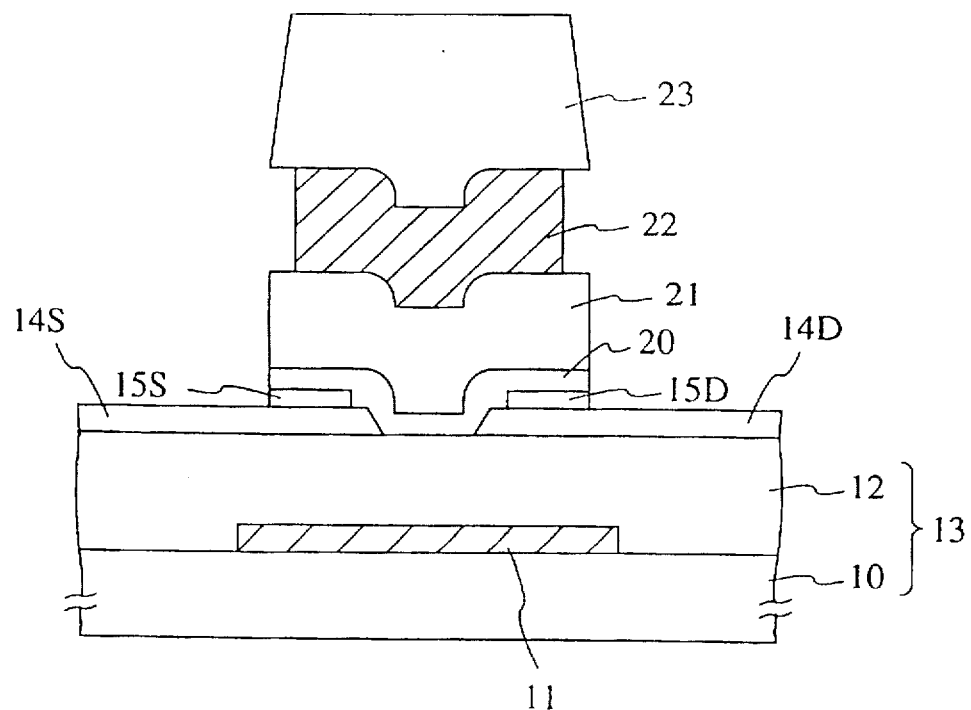

Then, the SiN film 21a, the amorphous silicon film 20a, and the source electrode contact layer 15S and the drain electrode contact layer 15D are etched into a mesa with the resist film 23 as a mask by RIE using a CF$_4$+CHF$_3$ etching gas to form the gate insulating film 21 of the SiN film 21a, and the operational semiconductor layer 20 of the amorphous silicon film 20a, while to remove unnecessary parts of the source electrode contact layer 15S and the drain electrode contact layer 15D. Thus the side walls of the gate electrodes 22 form a step with respect to the side walls of the gate insulating film 21 (FIG. 5A).

Figure 5B:
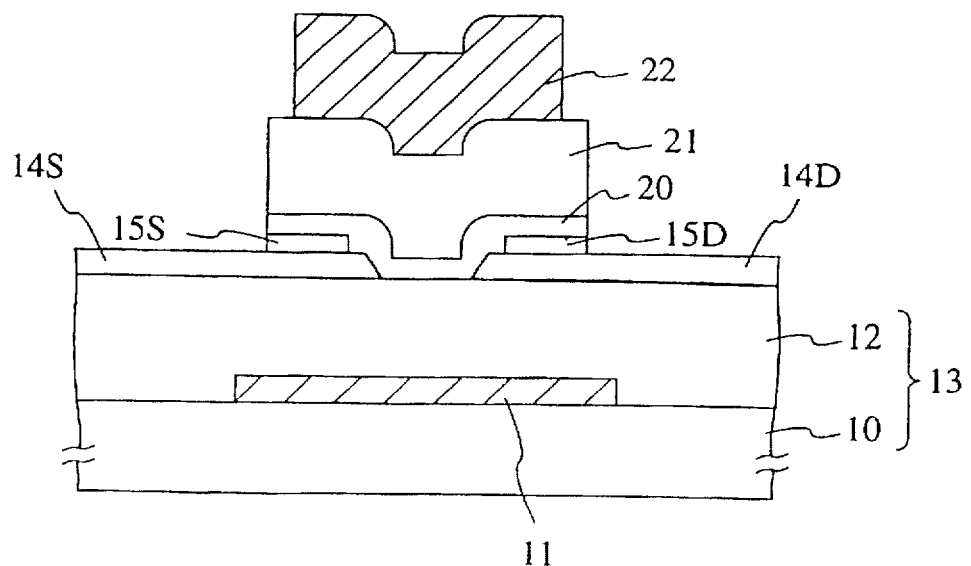

Subsequently, the whole is immersed in a resist peeling liquid to remove the resist film 23. And the staggered TFT region of the TFT matrix device of FIG. 1 is fabricated (FIG. 5B).

Then, improvements of characteristics of the staggered TFT region of the TFT matrix device of FIG. 1 by forming a step between the side walls of the gate electrode 22 and the side walls of the gate insulating film 21 will be explained with reference to FIG. 6.

Figure 6:
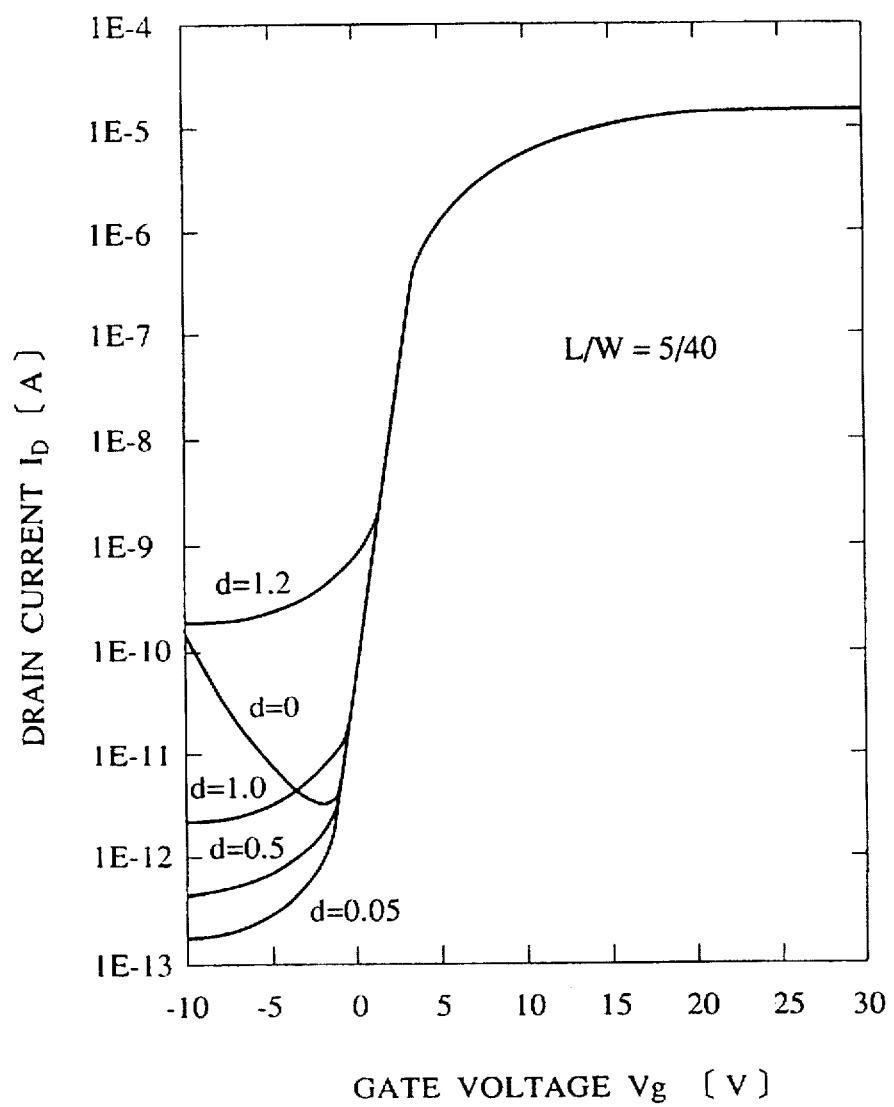
FIG. 6 is a graph representing relationships between a gate voltage Vg and a drain current Id.

FIG. 6 is a graph representing relationships between a gate voltage Vg and a drain current Id. Gate voltages Vg are taken on the horizontal axis, and drain currents Id are taken on the vertical axis. A step difference d is a parameter.

In this case, a channel length L of the TFT is 5 µm, a channel width W is 40 µm, and drain voltage Vd is 5 V. In the vertical divisions, 1E-13 for example means $1 \times 10^{-13}$.

As apparent in FIG. 6, when d<0.05 µm, leak currents occurs between the gate electrode 22 and the source electrode 14S, and its off characteristic is deteriorated. That is, a perfect off-state cannot be maintained.

When a step difference d>1 µm, the operational semiconductor layer 20 of the amorphous silicon film projected with respect to the gate electrode 22 in the longitudinal direction of the gate electrode cannot make a perfect off-state even when a negative voltage is applied to the gate electrode 22, and positive leak currents adversely flow between the source electrode 14S and the drain electrode 14D.

Thus, when a step difference d is 0.05 µm$\leq$d$\leq$1.0 µm, the TFT can have small leak currents in its off-state.

As described above, according to the first embodiment, the gate electrode 22 is made narrower than the gate insulating film 21 for the gate electrode so that the side walls of the gate electrode 22 form a step with respect to the side walls of the gate insulating film 21, and by setting a step difference d in a range of 0.05 µm$\leq$d$\leq$1.0 µm, the leak currents along the side surfaces of the mesa of the TFT between the gate electrode 22 and the source electrode 14S or the drain electrode 14D can be suppressed. Accordingly, a TFT matrix device having small current consumption can be realized.

2. Second Embodiment

The TFT matrix device according to a second embodiment of this invention will be explained with reference to FIG. 7.

Figure 7:
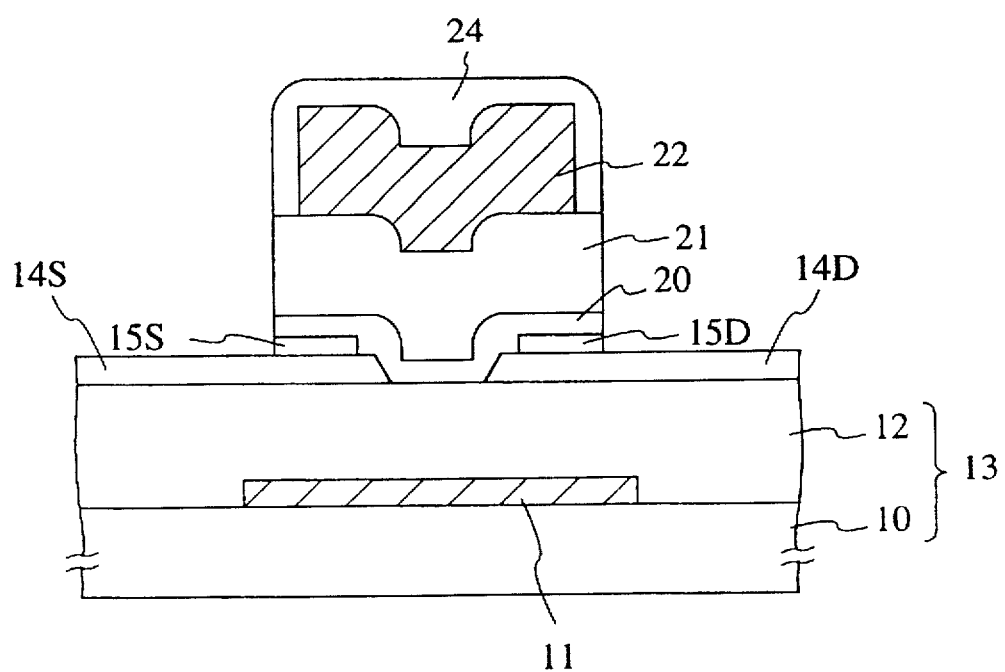
FIG. 7 is a sectional view of a staggered TFT region of the TFT matrix device according to a second embodiment of this invention.

FIG. 7 is a sectional view of the staggered TFT region of the TFT matrix device according to the second embodiment. Common members of the second embodiment with the TFT matrix device of FIG. 1 have common reference numerals not to repeat their explanation.

In the second embodiment as well as the first embodiment, a source electrode 14S and a drain electrode 14D are formed opposed to each other on a transparent insulating substrate 13 and are in ohmic contact with an operational semiconductor layer 20 respectively through a source electrode contact layer 15S and a drain electrode contact layer 15D. A gate insulating film 20 is formed on the operational semiconductor layer 21, and on the gate insulating film 21 there is formed a gate electrode 22 which is made narrower than the gate insulating film 21.

A characteristic of the second embodiment is that the entire surface of the gate electrode 22, side walls form a step with respect to the side walls of the gate insulating film 21, is coated with a resin film 24 as a protecting film.

Next, a first method for fabricating the staggered TFT region of the TFT matrix device of FIG. 7 will be explained with reference to FIGS. 8A to 9.

Figure 8A:
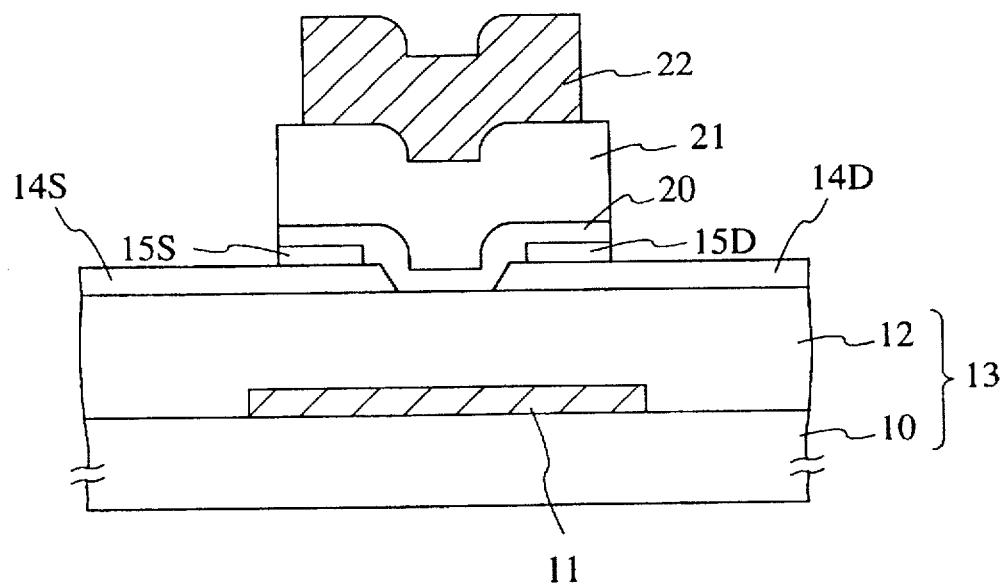
FIGS. 8A and 8B are sectional views of a staggered TFT region in the steps of a first method for fabricating the TFT matrix device according to a second embodiment of this invention.
Figure 8B:
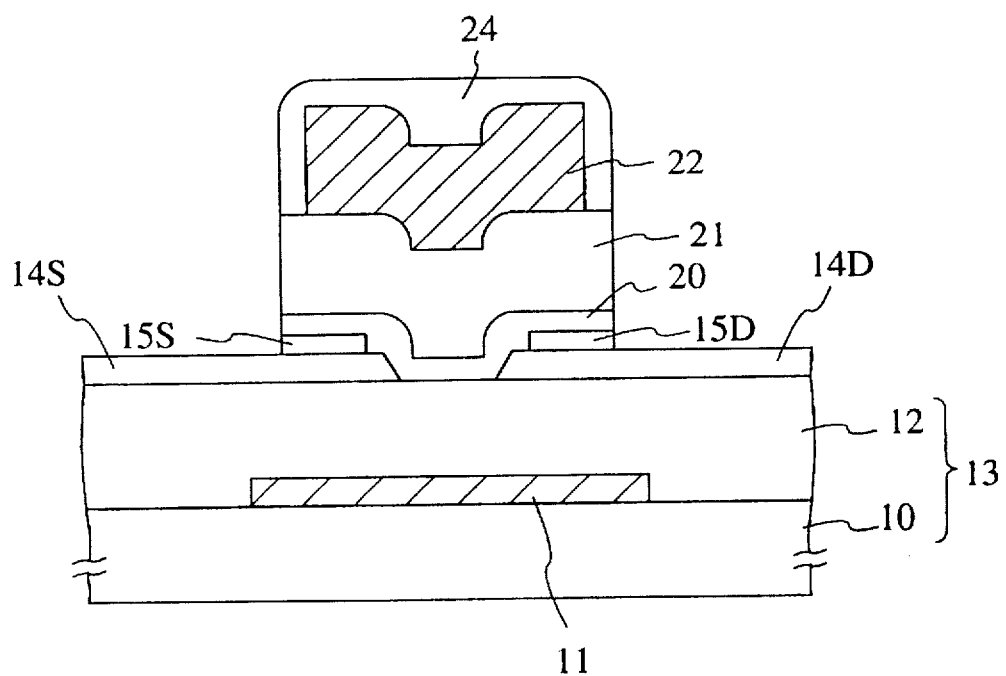
Figure 9:
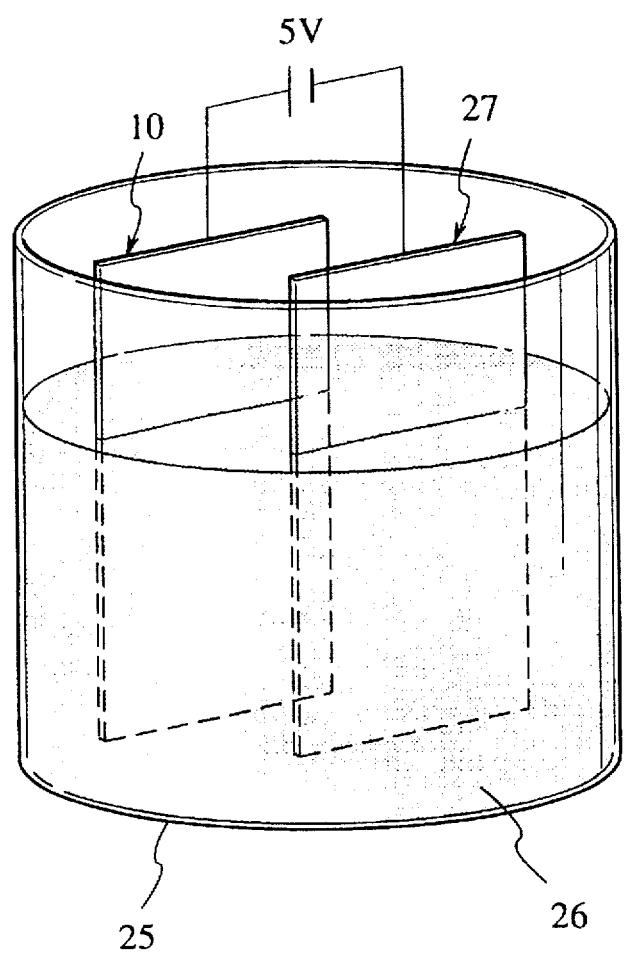
FIG. 9 is a explanatory view of a major part of the electrodeposition apparatus to be used in forming the protecting film.

FIGS. 8A and 8B are sectional views of the staggered TFT region of the TFT matrix device according to the second embodiment in the respective steps of the first method. FIG. 9 is a explanatory view of a major part of the electrodeposition apparatus to be used in forming the protecting film.

By following the same steps as the above-described steps of FIGS. 2A to 5B, the source electrode 14S and the drain electrode 14D of an ITO film, a source electrode contact layer 15S and a drain electrode contact layer 15D of an n⁺-amorphous silicon film are formed on a transparent insulating substrate 13 respectively opposed to each other. Subsequently, an amorphous silicon film, an SiN film and an Al film are deposited in the stated order. Subsequently, with a resist film patterned in a configuration of gate electrode, the Al film is isotropically etched, and the SiN film, the amorphous silicon film and the source electrode contact layer 15S and the drain electrode contact layer 15D are anisotropically etched to form the operational semiconductor layer 20 of the amorphous silicon film, the gate insulating film 21 of the SiN film, and the gate electrode 22 of the Al film, while the gate electrode 22 is made narrower with respect to the gate insulating film 21 to make a step between the side walls of the gate electrode 22 and those of the gate insulating film 21 (FIG. 8A).

Then, the entire exposed surface of the gate electrode 22 is covered with the resin film 24 of a 500 nm-thickness by electrodeposition process, and a 5 minute-heattreatment is conducted to evaporate water and to solidify the resin film 24. Thus the staggered TFT region of the TFT matrix device of FIG. 7 is formed (FIG. 8B).

Next, the electrodeposition process of FIG. 8B will be explained with reference to FIG. 9.

The glass substrate 10 is immersed in an electrodeposition resin solution 26 of, e.g., an aqueous photosensitive resin solution or others, held in a vessel 25 and is opposed to a Pt electrode 27 placed in an electrodeposition resin solution 26. Then a voltage of, e.g. 5 voltage is applied between the gate electrode 22 on the glass substrate 10 and the Pt electrode 27. The resin film 24 is electrodeposited in a 500 nm-thickness on the entire exposed surface of the gate electrode 22. The thickness of the resin film 24 can be increased by raising the voltage applied between the gate electrode 22 and the Pt electrode 27.

Next, a second method for forming the staggered TFT region of the TFT matrix device of FIG. 7 will be explained with reference to FIGS. 10A to 11B.

FIGS. 10A to 11B are sectional views of the staggered TFT region of the TFT matrix device according to the second embodiment in the respective steps of the second method.

Figure 10A:
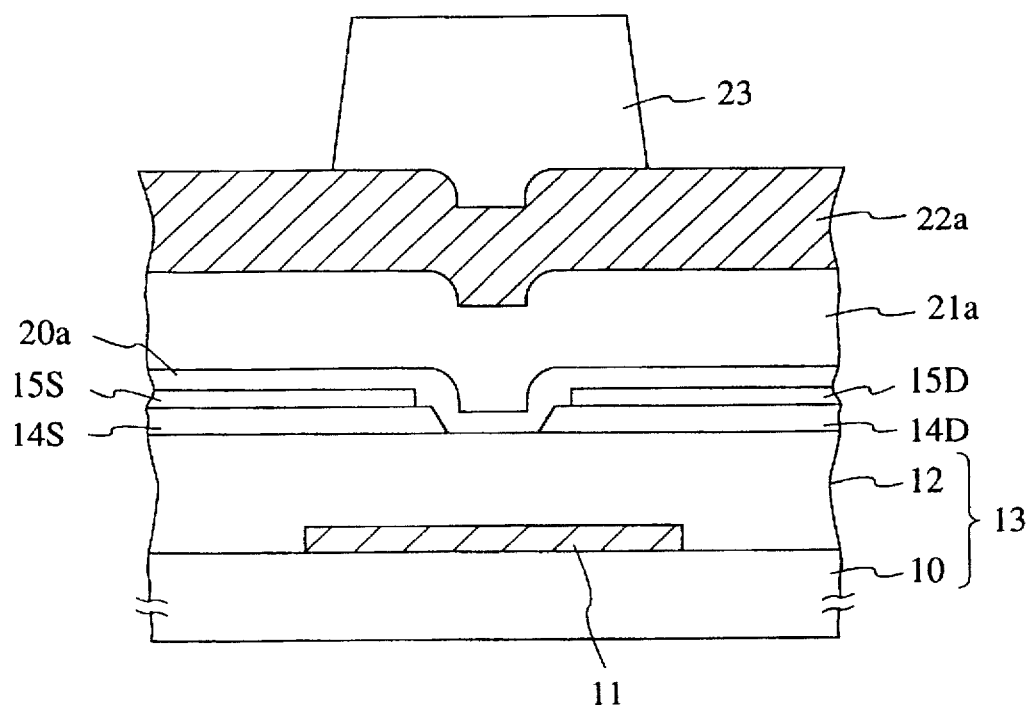
FIGS. 10A–B to 11A–B are sectional views of a staggered TFT in the steps of a second method for fabricating the TFT matrix device according to a second embodiment of this invention.

By following the steps of FIGS. 2A to 4B, a source electrode 14S and a drain electrode 14D of an ITO film, a source electrode contact layer 15S and a drain electrode contact layer 15D of the n⁺-amorphous silicon film are formed opposed to each other on the transparent insulating substrate 13. Then, the amorphous silicon film 20, the SiN film 21a, and the Al film 22a are deposited on the entire surface in the stated order. Then, a resist film 23 patterned in a configuration of gate electrode is formed on the Al film (FIG. 10A).

Then, the Al film 22a is etched with the resist film 23 as a mask to form the gate electrode 22 of the Al film 22a.

Then, the whole is immersed in a peeling liquid to remove the resist film 23.

Figure 10B:
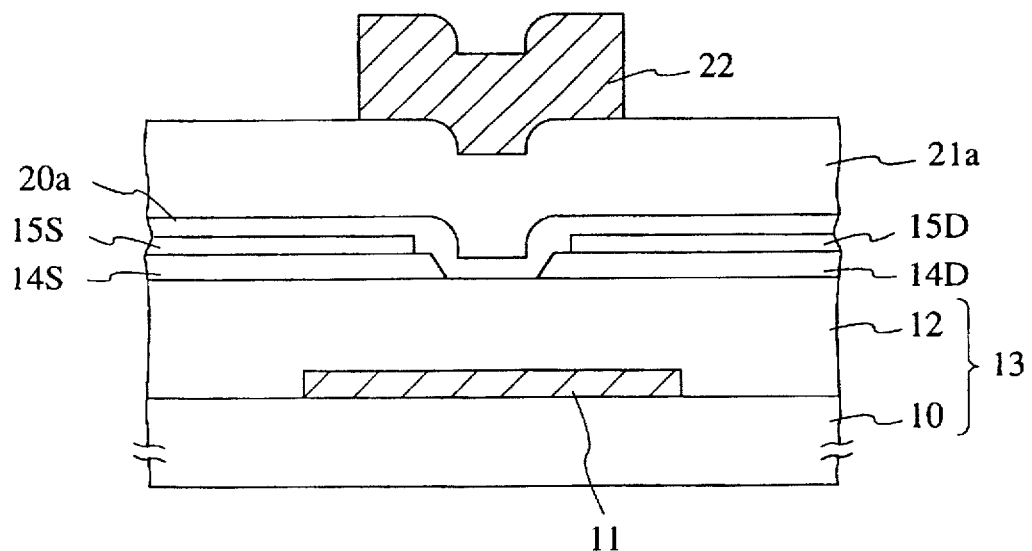

At this time in forming the gate electrode 22, it is not necessary, as is necessary in FIG. 5A, to side-etch the Al film 22a to make the gate electrode 22 narrower with respect to the pattern of the resist film 23. But it is necessary when the resist film 23 is formed minimum to the limit of the present lithography, and in addition, the gate electrode 22 has to be formed further smaller than the resist film 23 (FIG. 10B).

Figure 11A:
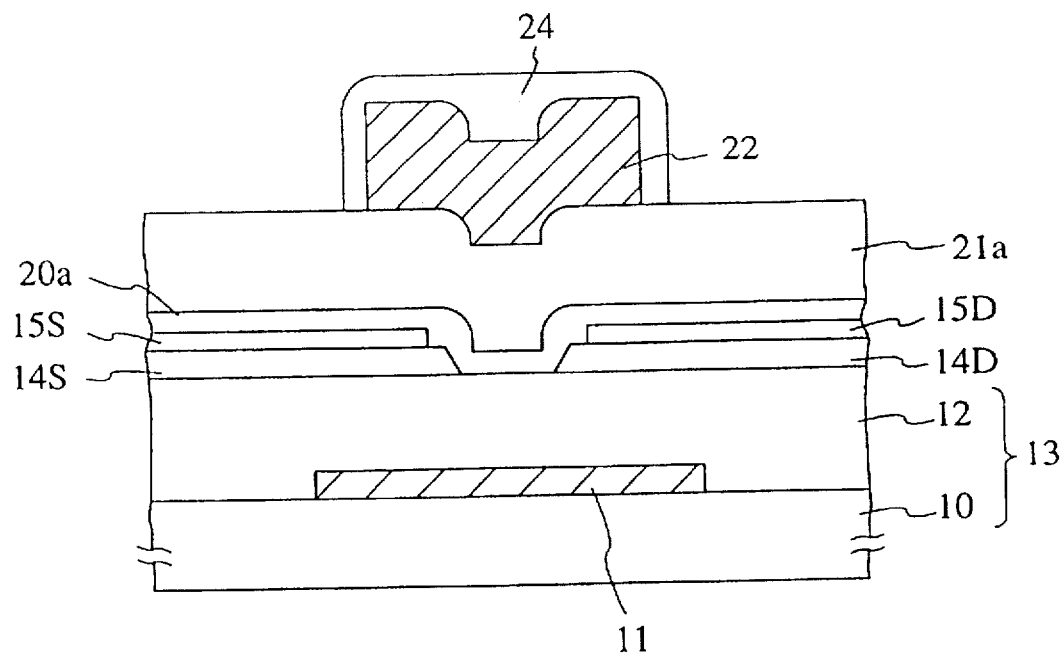

Then, the entire exposed surface of the gate electrode 22 is coated with the resin film 24 in a 500 nm-thickness. Then, the resin film is heat-treated for 5 minutes e.g., 60° C. to evaporate water and to solidify the resin film 24 (FIG. 11A).

Figure 11B:
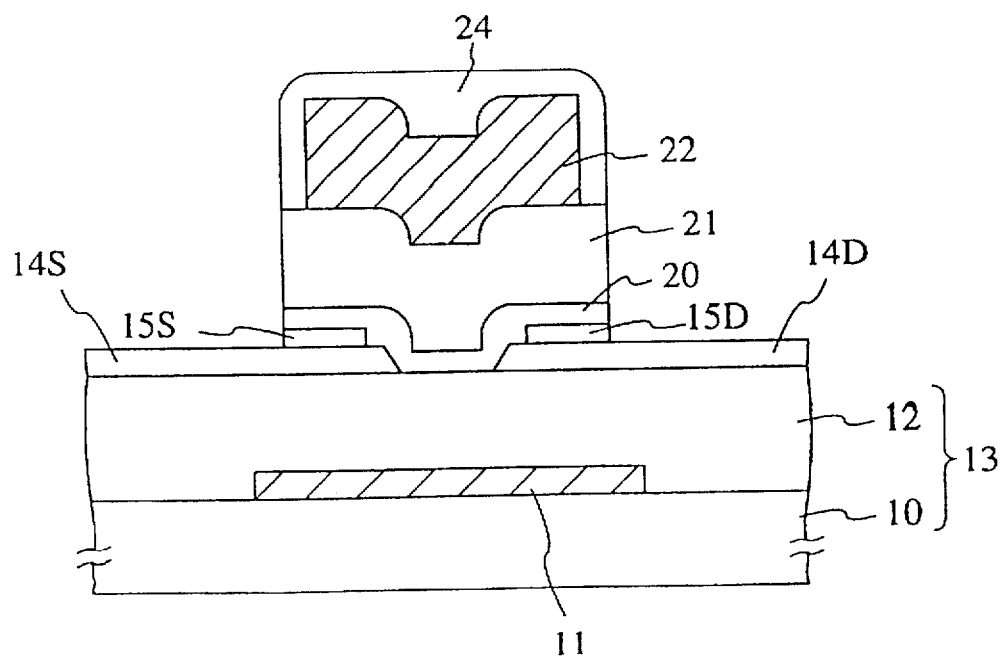

Then, the SiN film 21a, the amorphous silicon film 20a, the source electrode contact layer 15S, and the drain electrode contact layer 15D are etched into a mesa with the resin film 24 as a mask by RIE using a CF₄+CHF₃ gas as an etching gas to form the gate insulating film 21 of the SiN film 21a, and the operational semiconductor layer 20 of the amorphous silicon film 20a, while unnecessary portions of the source electrode contact layer 15S and the drain electrode contact layer 15D are removed. Thus the staggered TFT region of the TFT matrix device of FIG. 7 is formed (FIG. 11B).

As described above, according to the second embodiment, as in the first embodiment, the gate electrode 22 is made narrower with respect to the gate insulating film 21 to form a 0.5 μm-step between the side walls of the gate electrode 22 and the side walls of the gate insulating film 21, and in addition, the entire exposed surface of the gate electrode 22 is coated with the resin film 24. As a result, the leak currents along the mesa side surfaces of the TFT from the gate electrode 22 to the source electrode 14S or the drain electrode 14D can be more effective suppressed than in the first embodiment.

Especially, the resin film 24 formed by electrodeposition has good adhesion to a base and contourability. Accordingly, the resin film 24 can be applied in a uniform thin film to a base of a complicated shape. Thus the resin film 24 can coat the gate electrode 22 of a complicated shape with such good coverage that its effect of the leak current suppression is high.

According to the second method, the entire exposed surface of the gate electrode 22 is coated with the resin film 24, and then with the resin film 24 as a mask, the SiN film 21a, the amorphous silicon film 20a, etc. are etched into a mesa to form the gate insulating film 21 and the operational semiconductor layer 20. As a result, the side walls of the resin film 24 coating the gate electrode 22, and the side walls of the gate insulating film 21 can form one plane.

3. Third Embodiment

The TFT matrix device according to a third embodiment of this invention will be explained with reference to FIG. 12.

Figure 12:
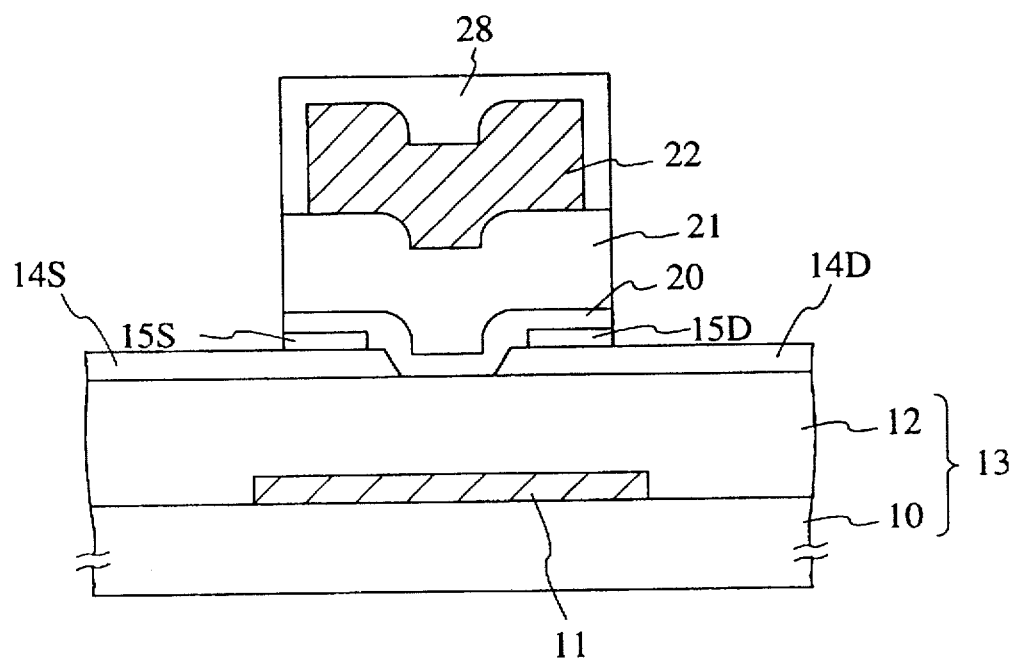
FIG. 12 is a sectional view of a staggered TFT region of the TFT matrix device according to a third embodiment of this invention.

FIG. 12 is a sectional view of the staggered TFT region of the TFT matrix device according to the third embodiment. Common members of the third embodiment with the TFT matrix device of FIG. 7 have common reference numerals not to repeat their explanation.

In this embodiment, as in the second embodiment, a source electrode 14S and a drain electrode 14D are formed on a transparent insulating substrate 13 opposed to each other, and the source electrode 14S and the drain electrode 14D are in ohmic contact with an operational semiconductor layer 20 respectively through a source electrode contact layer 15S and a drain electrode contact layer 15D. A gate electrode 22 is formed on the operational semiconductor layer 20 through a gate insulating film 21, and the gate electrode 22 is narrower than the gate insulating film 21.

In the second embodiment, the entire exposed surface of the gate electrode 22 forming a step with the side walls of the gate insulating film 21 is coated with a resin film 24 as a protecting film, while in this embodiment, the entire exposed surface of the gate electrode 22 is coated with an anodic oxidation film 28. This is a characteristic of the third embodiment.

Next, the method for forming the staggered TFT region of the TFT matrix device of FIG. 12 will be explained with reference to FIGS. 13A to 15.

Figure 13A:
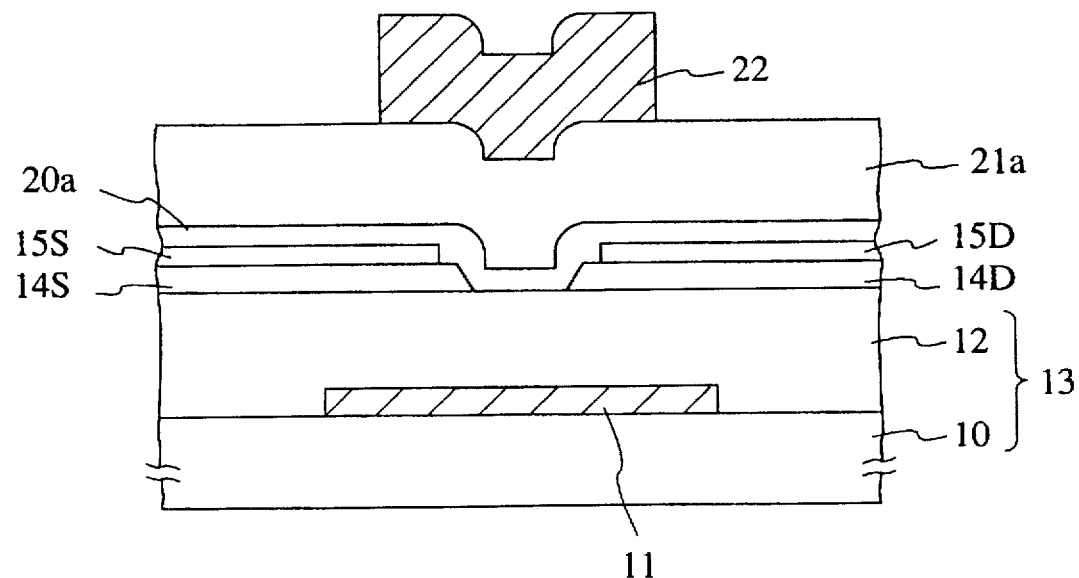
FIGS. 13A, 13B and 14 are sectional views of a staggered TFT region in the steps of a method for fabricating the TFT matrix device according to a third embodiment of this invention.
Figure 13B:
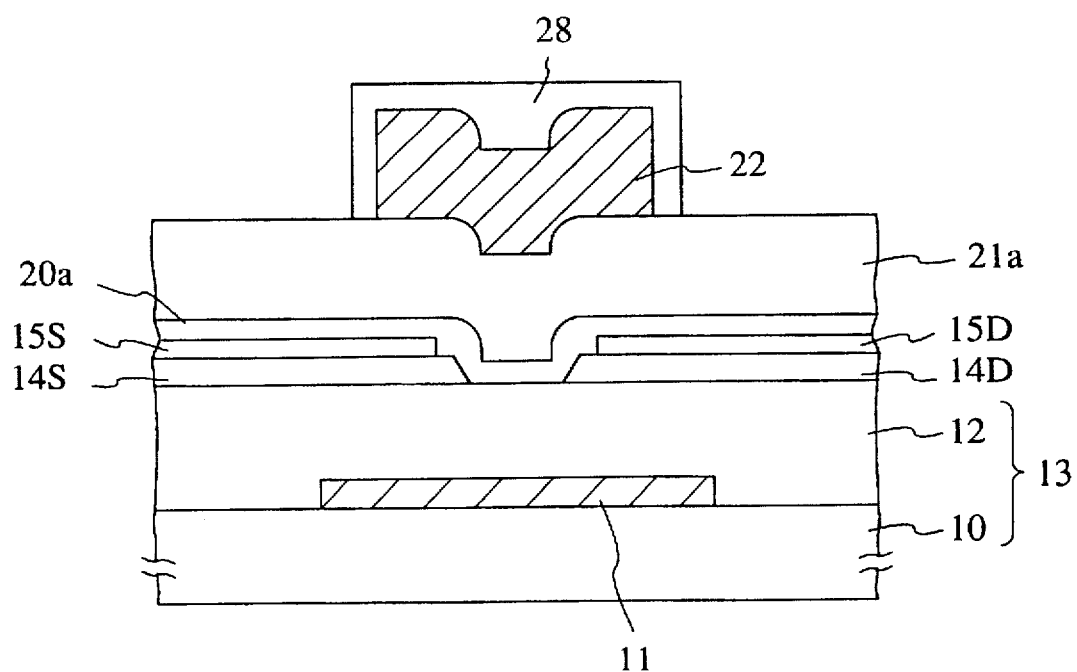
Figure 14:
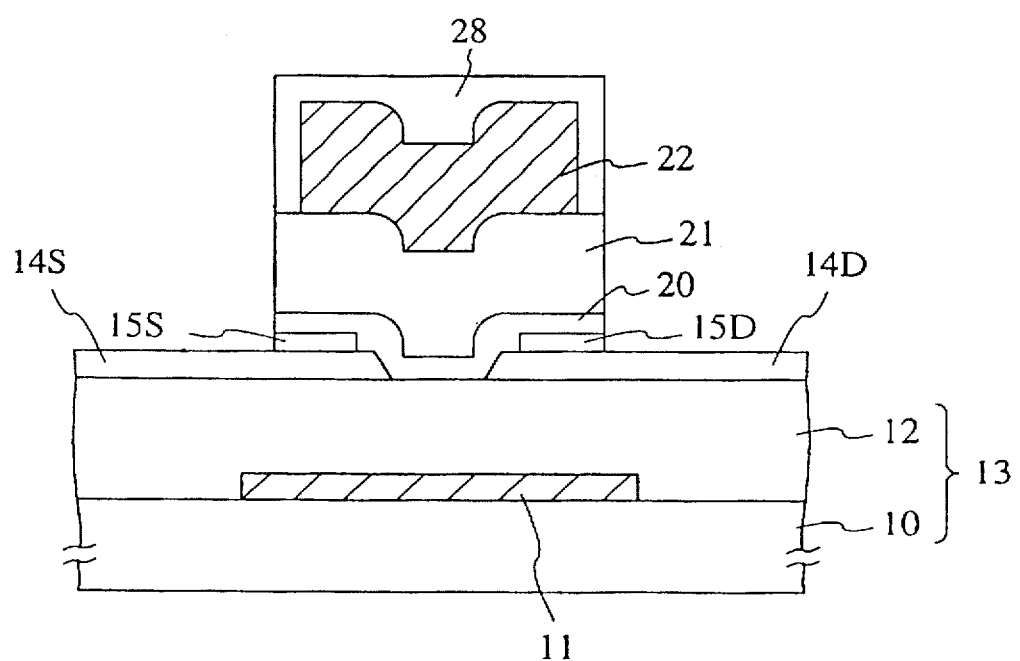
Figure 15:
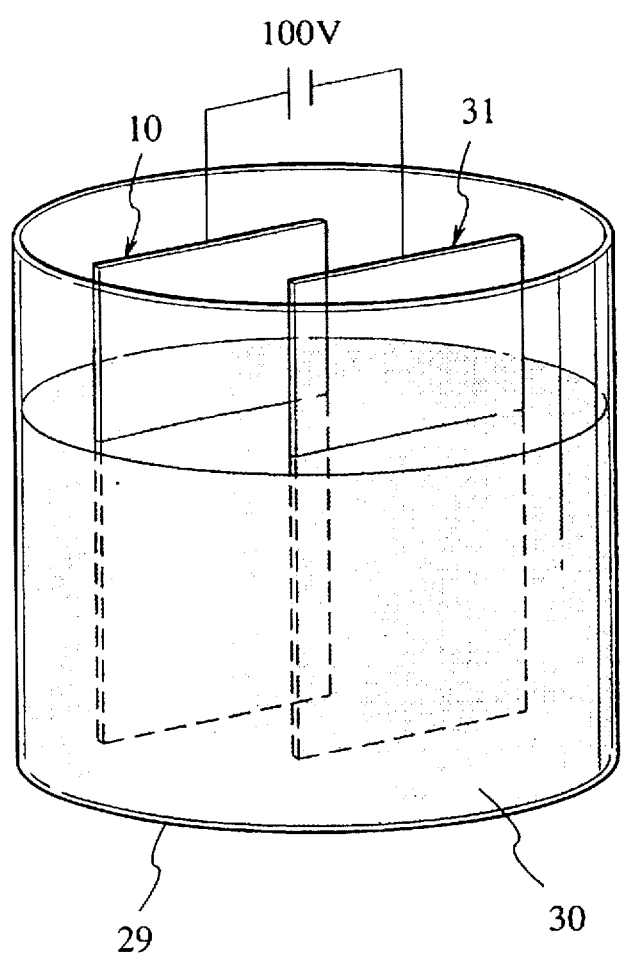
FIG. 15 is a explanatory view of a major part of the anodic oxidation apparatus to be used in forming the protecting film.

FIGS. 13A to 14 are sectional view of the TFT region of the TFT matrix device according to the third embodiment in the respective step of the method for forming the TFT region. FIG. 15 is a explanatory view of a major part of an anodic oxidation apparatus used in a forming the protecting film.

By following the steps of FIGS. 10A and 10B the source electrode 14S and the drain electrode 14D of an ITO film, the source electrode contacting layer 15S and the drain electrode contact layer 15D of the $n^+$-amorphous silicon film are formed opposed to each other. Then, the amorphous silicon film 20a, the SiN film 21a and the Al film are deposited on the entire surface in the stated order, and subsequently the Al film is patterned in a set configuration, and the gate electrode 22 of the Al film is formed (FIG. 13A).

Then, the entire exposed surface of the gate electrode 22 is coated with the anodic oxidation film 28 of a 150 nm-thickness $Al_2O_3$ film by anodic oxidation (FIG. 13B).

Then, the SiN film 21a, the amorphous silicon film 20a, the source electrode contact layer 15S and the drain electrode contact layer 15D are etched into a mesa with the anodic oxidation film 28 as a mask by RIE using a $CF_4$+$CHF_3$ gas as an etching gas to form the gate insulating film 21 of the SiN film 21a, and the operational semiconductor layer 20 of the amorphous silicon film 20a, while unnecessary parts of the source electrode contact layer 15S and the drain electrode contact layer 15D are removed. Thus the staggered TFT region of the TFT matrix device of FIG. 12 is formed (FIG. 14).

Next, the anodic oxidation used in the step of FIG. 13B will be explained with reference to FIG. 15.

The glass substrate 10 is immersed in a tartaric acid solution 30 held in a vessel 29, and is opposed to a Pt electrode 31 placed in the tartaric acid solution 30. A voltage of e.g., 100 V is applied between the gate electrode 22 on the glass substrate 10 and Pt electrode 31 to anodic-oxidize the entire exposed surface of the gate electrode 22 of the Al film and form the anodic oxidation film 28 of 100 nm-thickness $Al_2O_3$ film on the entire exposed surface of the gate electrode 22. By increasing the voltage applied between the gate electrode 22 and the Pt electrode 31, the thickness of the anodic oxidation film 28 can be increased.

As described above, according to the third embodiment, the gate electrode 22 is made narrower with respect to the gate insulating film 21 to form a step between the side walls of the gate electrode 22 and the side walls of the gate insulating film 21, and in addition, the entire exposed surface of the gate electrode 22 is coated with anodic oxidation film 28, whereby the same effect as in the second embodiment can be achieved.

According to the method for fabricating the third embodiment, the coating of the entire exposed surface of the gate electrode 22 with the anodic oxidation film 28 is followed by etching of the SiN film 21a, the amorphous silicon film 20a, etc. into a mesa with the anodic oxidation film 28 as a mask, so as to form the gate insulating film 21 and the operational semiconductor layer 20. As a result, the side walls of the anodic oxidation film 28 coating the gate electrode 22, and the side walls of the gate insulating film 21 can form one plane.

4. Fourth Embodiment

The TFT matrix device according to a fourth embodiment of this invention will be explained with reference to FIG. 16.

Figure 16:
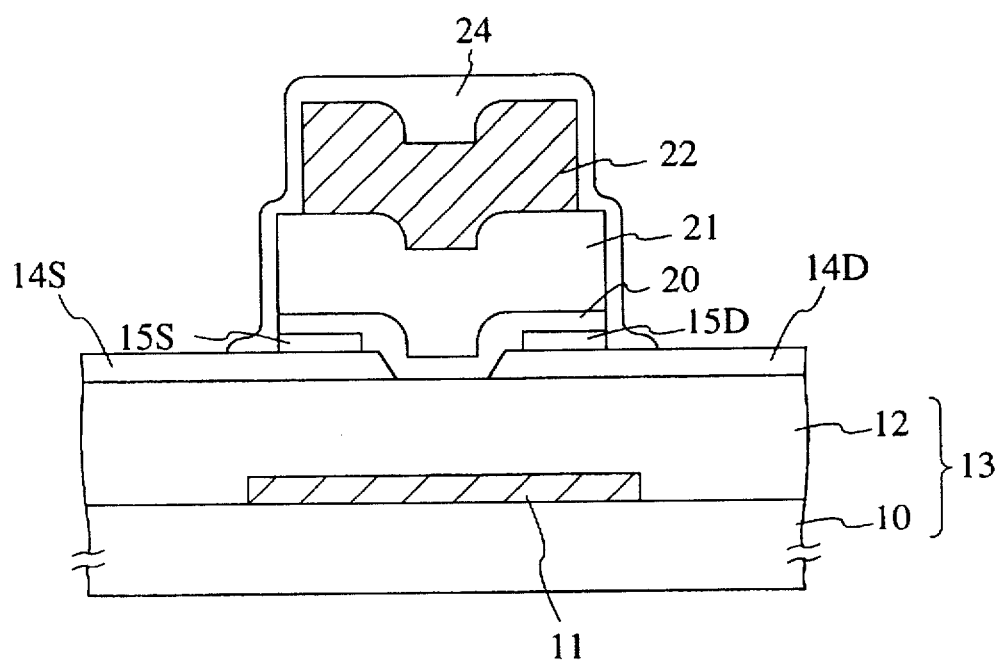
FIG. 16 is a sectional view of a staggered TFT region of the TFT matrix device according to a fourth embodiment of this invention.

FIG. 16 is a sectional view of the staggered TFT region of the TFT matrix device according to the sixth embodiment. Common members of the TFT matrix device of this embodiment with the TFT matrix device of FIG. 7 have common reference numerals not to repeat their explanation.

As in the second embodiment, in the fourth embodiment, a source electrode 14S and a drain electrode 14D are formed on a transparent insulating substrate 13 opposed to each other, and the source electrode 14S and the drain electrode 14D are in ohmic contact with an operational semiconductor layer 20 respectively through a source electrode contact layer 15S and a drain electrode contact layer 15D. A gate electrode 22 is formed on the operational semiconductor layer 20 through a gate insulating film 21, and the gate electrode 22 is narrower than the gate insulating film 21.

In the second embodiment, the entire exposed surface of the gate electrode 22 forming a step with the side walls of the gate insulating film 21 is coated with the resin film 24 as a protecting film, while in this embodiment, not only the entire exposed surface of the gate electrode 22, but also the side walls of the gate insulating film 21, the operational semiconductor layer 20, the source electrode contact layer 15S, and the drain electrode contact layer 15D are coated with a resin film 24 as a protecting film. This is a characteristic of the fourth embodiment.

Next, the method for forming the staggered TFT region of the TFT matrix device of FIG. 16 will be explained with reference to FIGS. 17A and 17B.

Figure 17A:
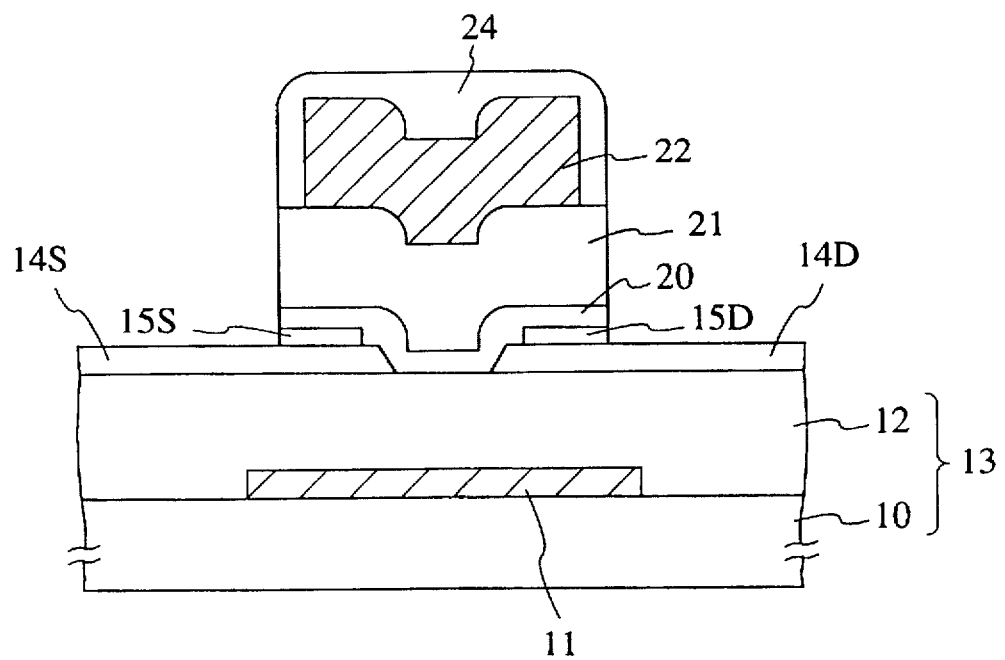
FIGS. 17A and 17B are sectional views of a staggered TFT region in the steps of a method for fabricating the TFT matrix device according to a fourth embodiment of this invention.
Figure 17B:
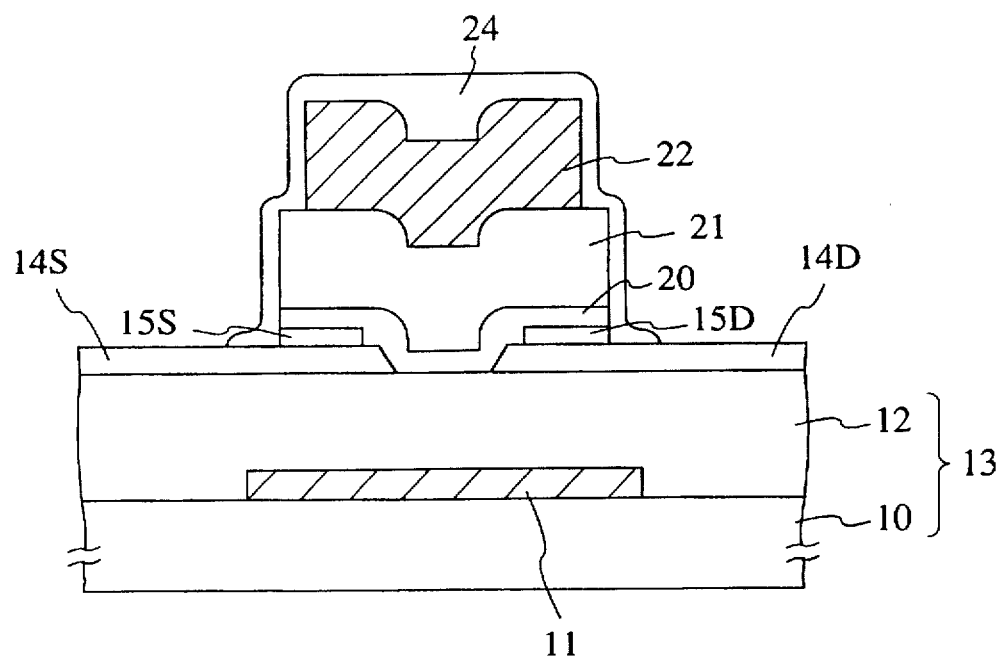

FIGS. 17A and 17B are sectional view of the TFT region of the TFT matrix device according to the fourth embodiment in the respective step of the method for forming the TFT region.

By following the steps of FIGS. 8A and 8B, or the steps of FIGS. 10A to 11B, the staggered TFT region of the TFT matrix device of FIG. 7 is formed. That is, the gate insulating film 21 is formed on the operational semiconductor layer 20, the gate electrode 22 is made narrower with respect to the gate insulating film 21 so as to form a step between the side walls of the gate electrode 22 and the side walls of the gate insulating film 21. Then, the entire exposed surface of the gate electrode 22 is coated with the resin film 24 (FIG. 17A).

Then, the resin film 24 is fluidized by heat-treating the resin film 24, e.g., for 5 minutes at 120° C. to coat even the side walls of the gate insulating film 21, the operational semiconductor layer 20, the source electrode contact layer 15S and the drain electrode contact layer 15D (FIG. 17B).

As described above, according to the fourth embodiment, the gate electrode 22 is made narrower with respect to the gate insulating film 21 to form a step between the side walls of the gate electrode 22 and the side walls of the gate insulating film 21, and in addition, not only the entire exposed surface of the gate electrode 22, but also the side walls of the gate insulating film 21, the operational semiconductor layer 20, the source electrode contact layer 15S and the drain electrode contact layer 15D are coated with the resin film 24, so that the leak currents along the side surfaces of the mesa of the TFT from the gate electrode to the source electrode 14S or to the drain electrode 14D can be suppressed more perfectly than in the second embodiment.

5. Fifth Embodiment

The TFT matrix device according to a fifth embodiment of this invention will be explained with reference to FIG. 18.

Figure 18:
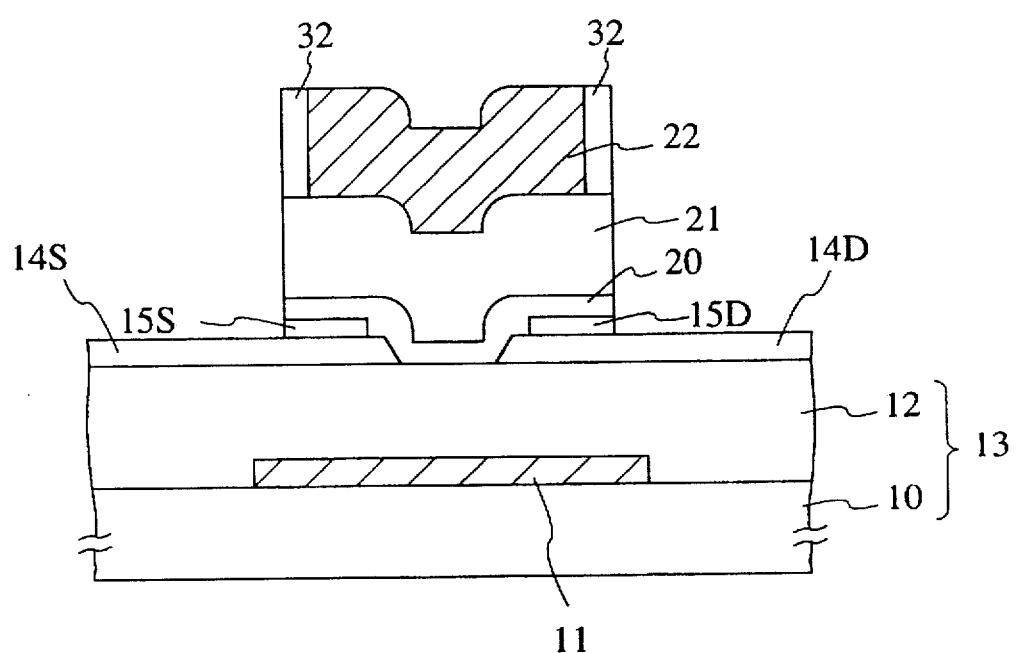
FIG. 18 is a sectional view of a staggered TFT region of the TFT matrix device according to a fifth embodiment of this invention.

FIG. 18 is a sectional view of the staggered TFT region of the TFT matrix device according to the fifth embodiment. Common members of the fifth embodiment with the TFT matrix device of FIG. 1 have common reference numerals not to repeat their explanation.

As in the first embodiment, in the fifth embodiment a source electrode 14S and a drain electrode 14D are formed opposed to each other on a transparent insulating substrate 13 and are in ohmic contact with an operational semiconductor layer 20 respectively through a source electrode contact layer 15S and a drain electrode contact layer 15D. A gate insulating film 21 is formed on the operational semiconductor layer 20, and a gate electrode 22 made narrower with respect to the gate insulating film 21 is formed on gate insulating film 21.

Only the side walls of the gate electrode 22 forming a step with respect to the side walls of the gate insulating film 21 are coated with the polymer film 32, but upper surface of the gate electrode 22 are not coated with a protecting film. This is a characteristic of the fifth embodiment, so that this embodiment is suitable for the gate electrode 22 which is required to have exposed surface in part at least.

Next, a first method for forming the staggered TFT region of the TFT matrix device of FIG. 18 will be explained with reference to FIGS. 19A to 20B.

FIGS. 19A to 20B are sectional views of the staggered TFT region of the TFT matrix device according to the sixth embodiment in the steps of the first forming method.

Figure 19A:
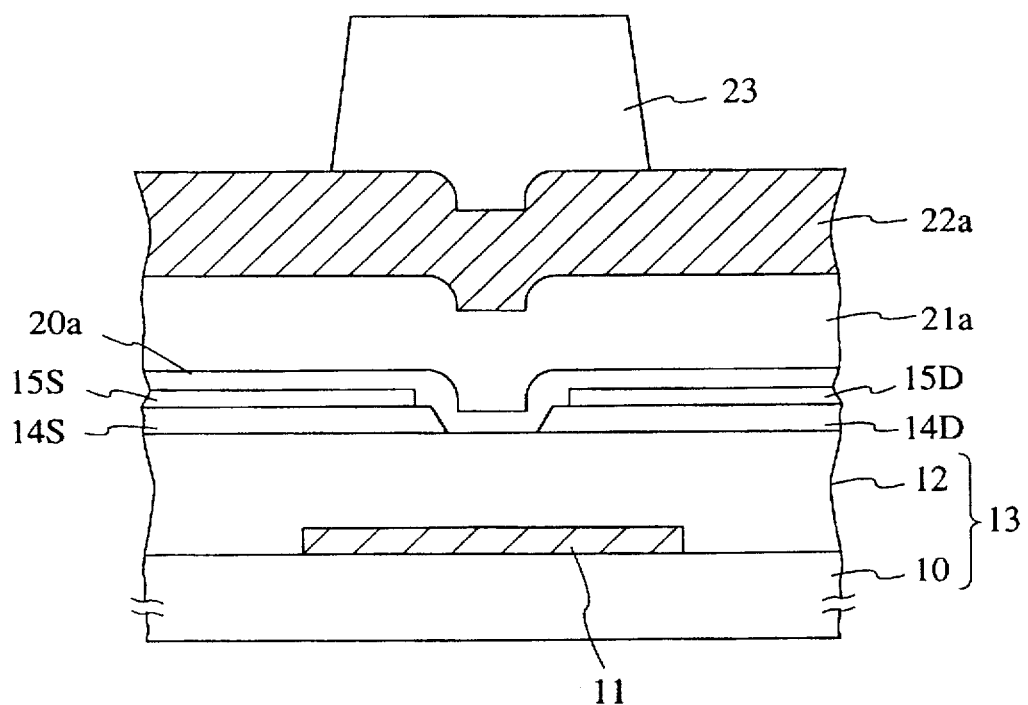

By following the steps of FIGS. 2A to 4B, the source electrode 14S and the drain electrode 14D of an ITO film, the source electrode contact layer 15S and the drain electrode contact layer 15D of the n⁺-amorphous silicon film are formed respectively opposed to each other. Subsequently, an amorphous silicon film 20a, an SiN film 21a and an Al film 22a are deposited on the entire surface in the stated order. Then, a resist film 23 patterned in a configuration of gate electrode is formed on the Al film 22a (FIG. 19A).

Then, the Al film 22a is etched with the resist film 23 as a mask by RIE using, e.g., a Cl$_2$+CH$_2$F$_2$ mixed gas as an etching gas to form the gate electrode 22 of the Al film 22a.

Etching conditions for this etching are, for example,

Cl$_2$ flow rate: 20 sccm

CH$_2$F$_2$ flow rate: 20 sccm

Internal reaction chamber gas pressure: 5 Pa

Power: 500 W.

In this etching, since the etching gas contains CH$_2$F$_2$ gas, simultaneously with the etching, the polymer film 32 is formed on the side walls of the gate electrode 22 which ia exposed by the etching.

A thickness of the polymer film 32 can be 0.2 μm by excessively setting on the etching following the removal of the exposed Al film 22a by 100%. This polymer film can be thicker as the etching time is longer.

Figure 19B:
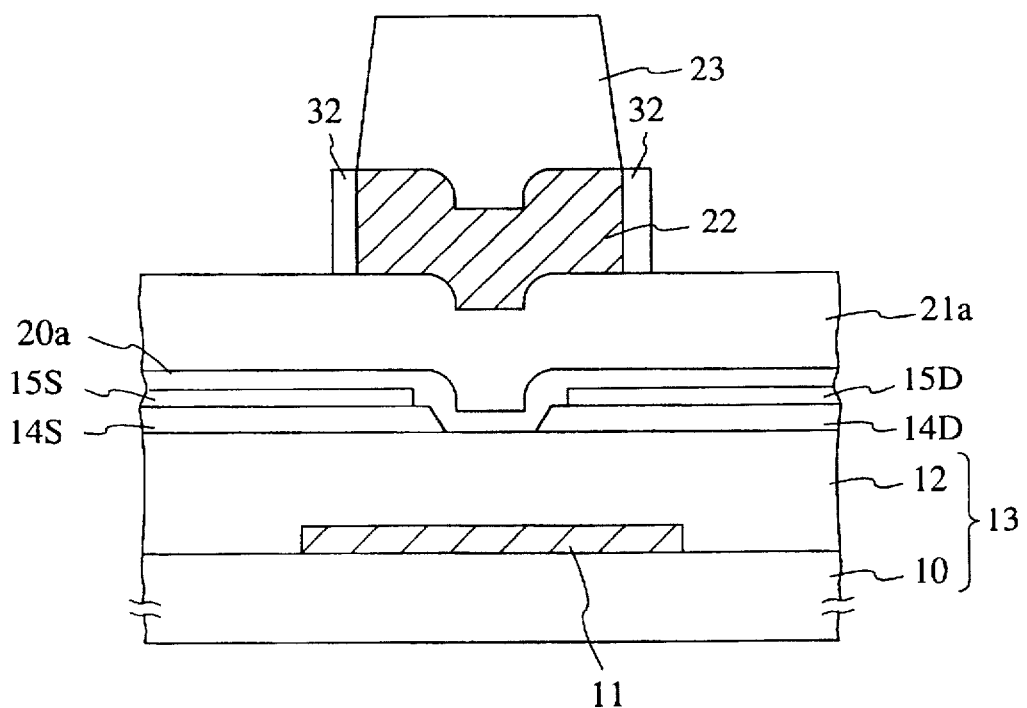

Following the formation of the polymer film 32, the polymer film 32 is heat-treated to improve adhesion between the polymer film 32 and the SiN film 21a at their interface. In this heat-treatment of the polymer film 32, it is preferred that the heat-treatment temperature is below 120° C. (FIG. 19B).

Then, the SiN film 21a, the amorphous silicon film 20a, the source electrode contact layer 15S and the drain electrode contact layer 15D are etched into a mesa with the polymer film 32 and the resist film 23 as a mask by RIE using a CF$_4$+CHF$_3$ gas as an etching gas to form the gate insulating film 21 of the SiN film, and the operational semiconductor layer 20 of the amorphous silicon film 20a, while unnecessary parts of the source electrode contact layer 15S and the drain electrode contact layer 15D are removed (FIG. 19C).

Then, the whole is immersed in a resist peeling liquid to remove the resist film 23. Thus the stagerred TFT region of the TFT matrix device of FIG. 18 is formed (FIG. 19D).

Next, a second method for forming the staggered TFT region of the TFT matrix device of FIG. 18 will be explained with reference to FIGS. 21A to 22B.

FIGS. 21A to 22B are sectional views of the staggered TFT region of the TFT matrix device according to the fifth embodiment in the steps of the second forming method.

Figure 21A:
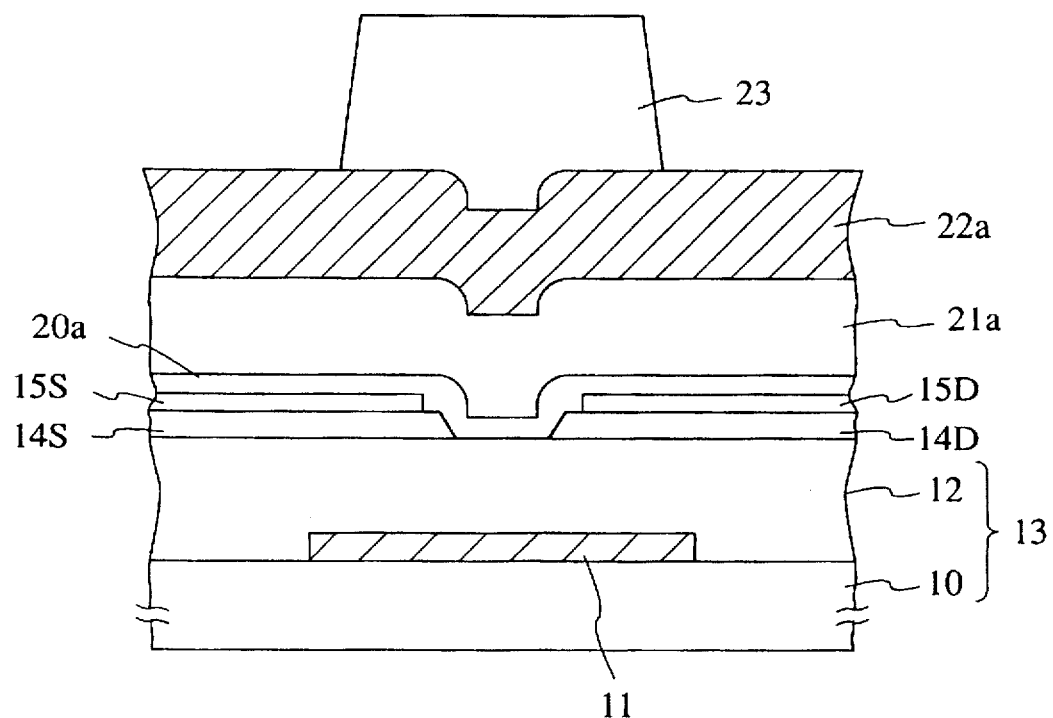
FIGS. 21A, 21B, to 22A, and 22B are sectional views of a staggered TFT in the steps of a second method for fabricating the TFT matrix device according to a second embodiment of this invention.

By following the step of FIG. 19A, the source electrode 14S and the drain electrode 14D of an ITO film, the source electrode contact layer 15S and the drain electrode contact layer 15D of the n⁺-amorphous silicon film are formed respectively opposed to each other on a transparent insulating substrate 13, then the amorphous silicone film 20a, the SiN film 21a and the Al film 22a are deposed on the entire surface in the sated order. Then, the resist film 23 patterned in a configuration of gate electrode is formed on the Al film 22a (FIG. 21A).

Figure 21B:
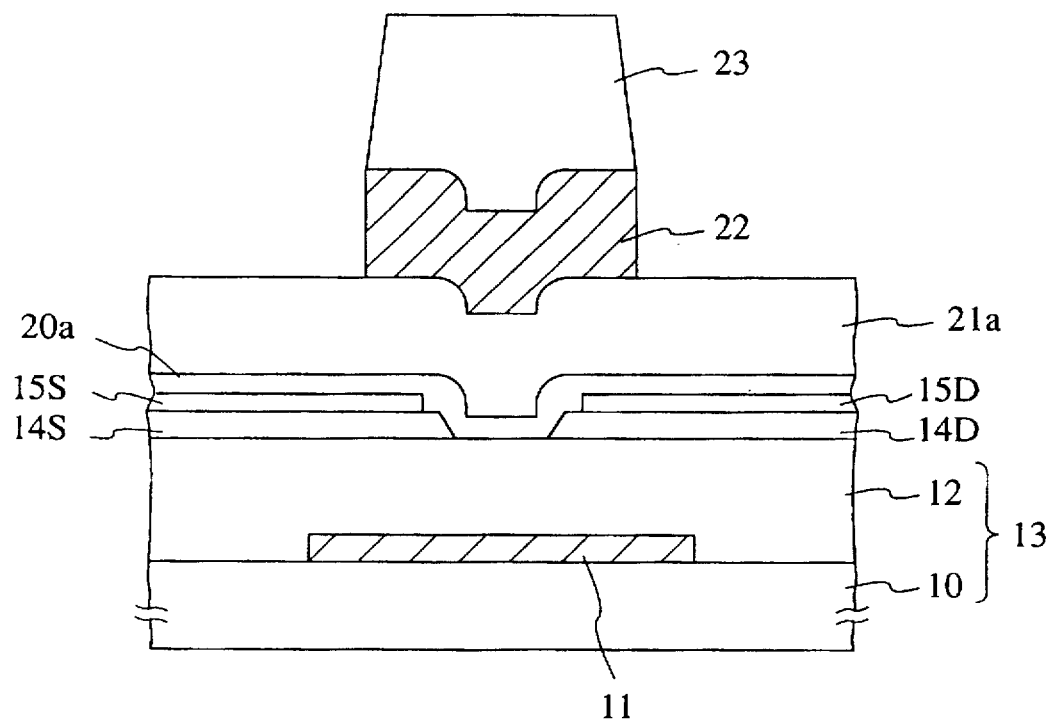

Then, the Al film 22a is etched with the resist film 23 as a mask by RIE using an etching gas including , e.g., a Cl$_2$ gas to form the gate electrode 22 of the Al film 22a (FIG. 21B).

Figure 22A:
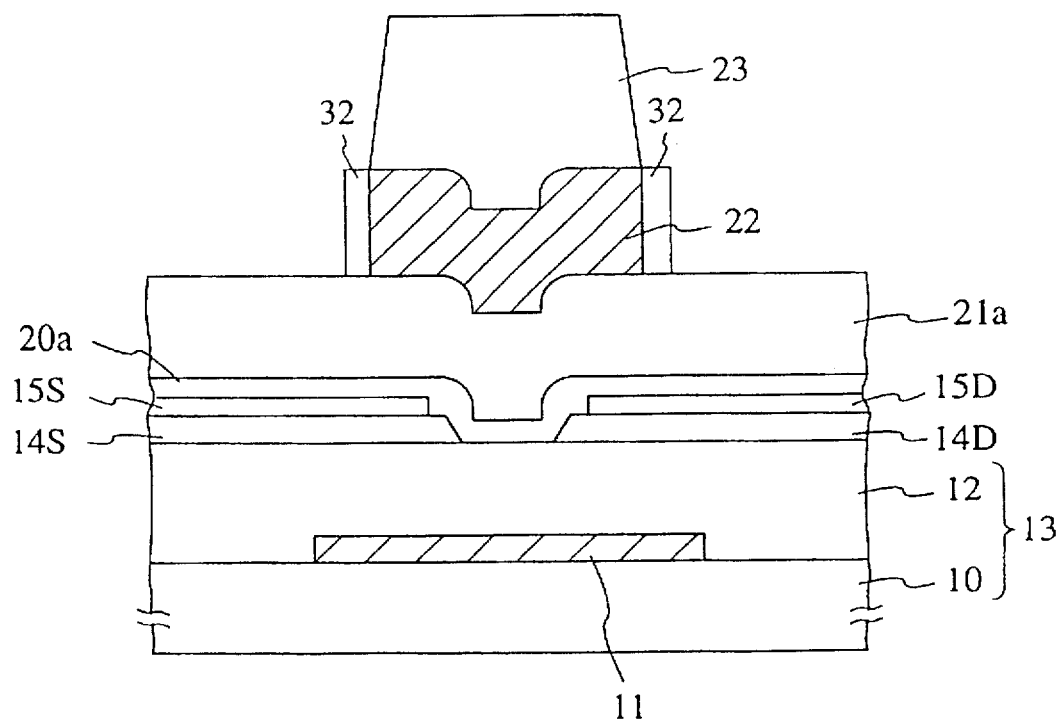

Subsequently, the side walls of the gate electrode 22 are exposed to CH$_2$F$_2$ gas atmosphere to form the polymer film 32 in a thickness of 0.2 μm on the side walls of the gate electrode 22. (FIG. 22A).

Figure 20A:
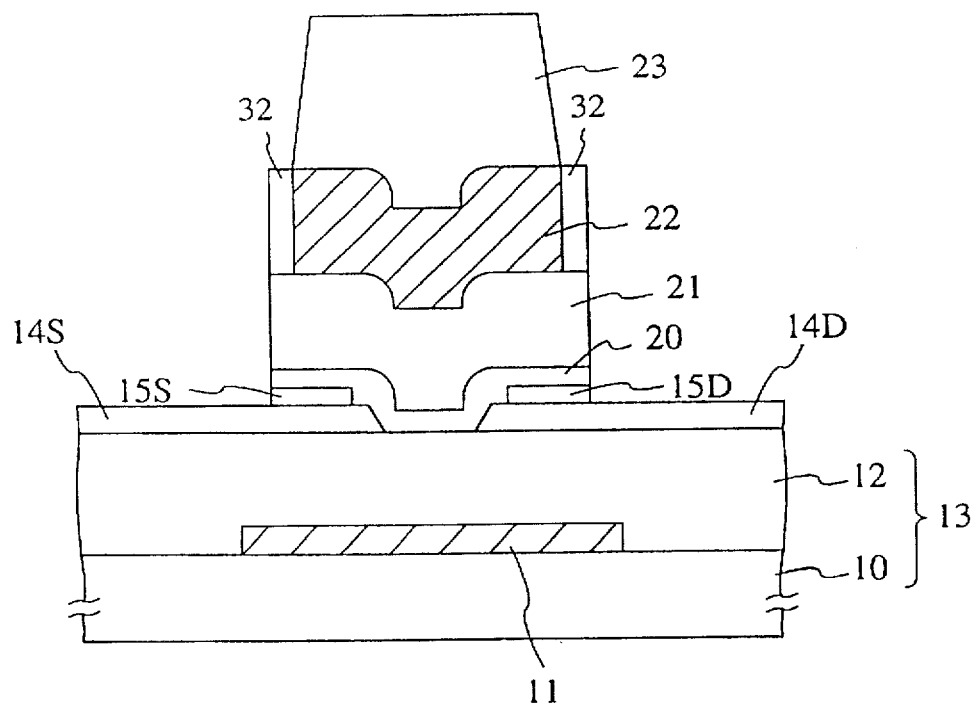
Figure 20B:
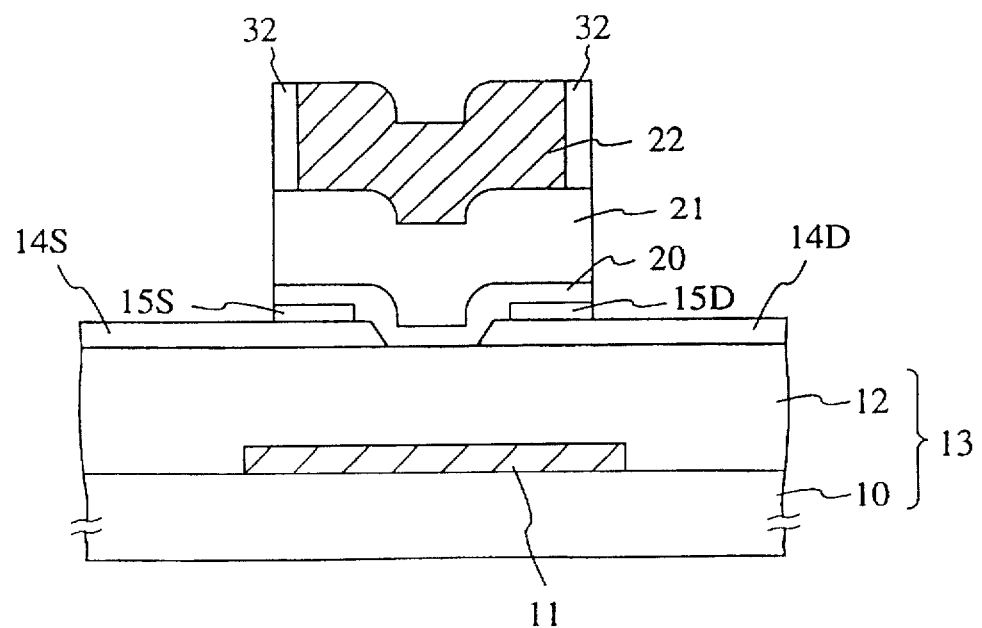
Figure 22B:
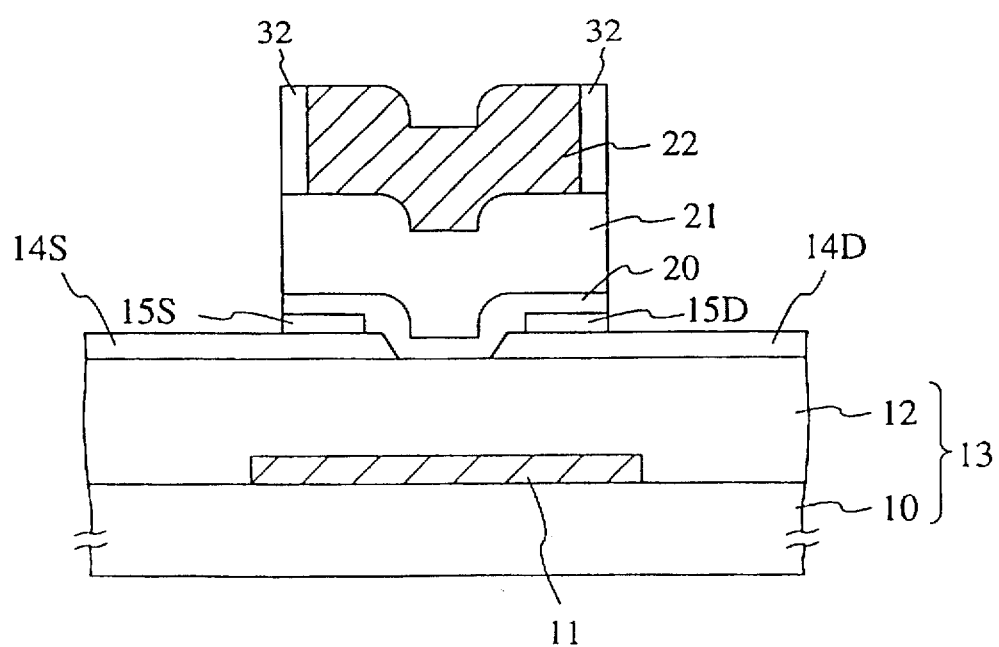

Then, by following the steps of FIGS. 20A and 20B, the SiN film 21a, the amorphous silicon film 20a, the source electrode contact layer 15S and the drain electrode contact layer 15D are etched into a mesa with the polymer film 32 and the resist film 23 as a mask to form the gate insulating film 21 of the SiN film 21a, and the operational semiconductor layer 20 of the amorphous silicon film 20a, while unnecessary parts of the source electrode contact layer 15 and the drain electrode contact layer 15D are removed. Subsequently, the resist film 23 is removed. Thus the staggered TFT region of the TFT matrix device of FIG. 18 is formed (FIG. 22B).

According to the fifth embodiment, as in the first embodiment, the gate electrode 22 is made narrower with respect to the gate insulating film 21 to form a 0.2 μm-step between the side walls of the gate electrode 22 and the side walls of the gate insulating film 21, and in addition, the side walls of the gate electrode 22 are coated with the polymer film 32, whereby the same effect as in the second embodiment can be achieved. That is, leak currents from the gate electrode 22 to the source electrode 14S or the drain electrode 14D can be decreased to be practically insignificant.

Furthermore, since the upper surface of the gate electrode 22 is not coated with the polymer film 32, increases of the gate electrode 22 in resistance can be reduced compared with those in the case where the entire exposed surface of the gate electrode 22 is coated with the resin film 24 or the anodic oxidation film 28.

According to the first method for forming the fifth embodiment, the use of a Cl$_2$+CH$_2$F$_2$ gas mixture as an etching gas enables the formation of the gate electrode 22 and the polymer film 32 on the side walls of the gate electrode 22 to be simultaneously conducted. Steps can be accordingly simple.

On the other hand, according to the second method for forming the fifth embodiment, the formation of the gate electrode 22 by etching the Al film 22a with a $Cl_2$ gas is followed by the formation of the polymer film 32 by exposing the exposed side walls of the gate electrode 22 to $CH_2F_2$ gas atmosphere. In comparison with the first method, one additional step is needed, but the second method has an advantage that only by controlling a time of the exposure to a $CH_2F_2$ gas the polymer film 32 can have a selected thickness independent of the formation of the gate electrode 22.

Furthermore, according to the first and the second forming methods, the side walls of the gate electrode 22 are coated with the polymer film 32, and then with the polymer film 32 as a mask, the SiN film 21a, the amorphous silicon film 20a, etc. are etched into a mesa to form the gate insulating film 21 and the operational semiconductor layer 20, whereby the side walls of the polymer film 32 coating the gate electrode 22, and those of the gate insulating film 21 can form one plane.

The staggered TFT region of the TFT matrix device according to the first embodiment of FIG. 1 may be formed by removing the polymer film 32 of the staggered TFT regions of the TFT matrix device shown in FIG. 20D or 22B.

Furthermore, the staggered TFT regions according to the second embodiment of FIG. 7, and the that according to the third embodiment of FIG. 12 may be formed by removing the polymer film 32, and then coating the resin film 24 or the anodic oxidation film 28.

The polymer film 32 can be removed by ashing with $O_2$ gas. The ashing conditions are, for example, $O_2$ flow rate: 50 sccm
Pressure: 5 Pa
Power: 500 W 6. Sixth Embodiment The TFT matrix device according to a sixth embodiment of this invention will be explained with reference to FIG. 23.

Figure 23:
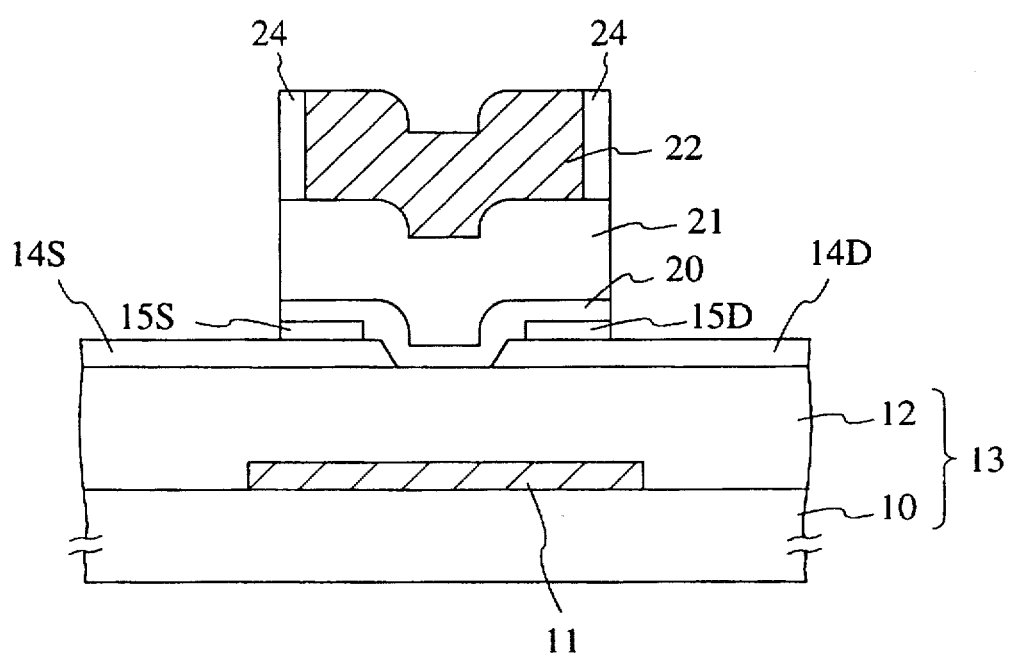
FIG. 23 is a sectional view of a staggered TFT region of the TFT matrix device according to a sixth embodiment of this invention.

FIG. 23 is a sectional view of the staggered TFT region of the TFT matrix device according to the sixth embodiment. Common members of the sixth embodiment with the TFT matrix device of FIG. 18 have common reference numerals not to repeat their explanation.

In the sixth embodiment, as in the fifth embodiment, a source electrode 14S and a drain electrode 14D are formed opposed to each other on a transparent insulating substrate 13 and are in ohmic contact with an operational semiconductor layer 20 respectively through a source electrode contact layer 15S and a drain electrode contact layer 15D. A gate insulating film 21 is formed on the operational semiconductor layer 20, and a gate electrode 22 formed narrower with respect to the gate insulating film 21 is formed on the gate insulating film 21.

In the fifth embodiment the side walls of the gate electrode 22 forming a step with respect to the side walls of the gate insulating film 21 are coated with the polymer film 32, while in this embodiment, the side walls of the gate electrode 22 are coated with a resin film 24. This is a characteristic of the sixth embodiment.

Next, the method for forming the staggered TFT region of the TFT matrix device of FIG. 23 will be explained with reference to FIGS. 24A to 25B.

FIGS. 24A to 25B are sectional views of the staggered TFT region of the TFT matrix device according to the sixth embodiment in the steps of the forming method.

Figure 24A:
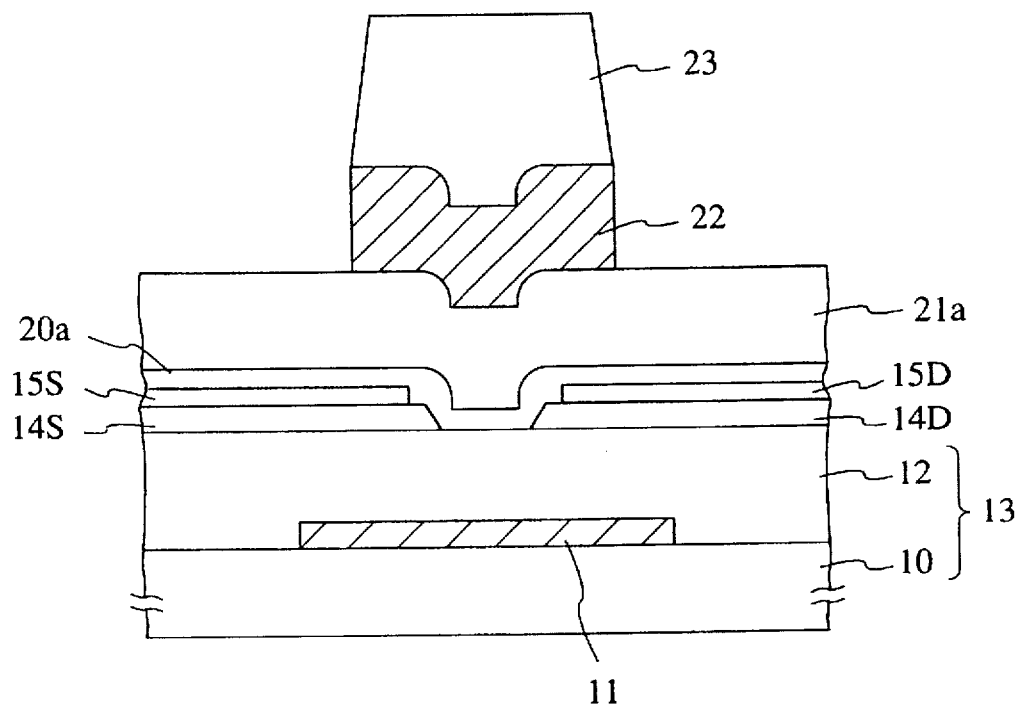
FIGS. 24A, 24B, to 25A, 25B are sectional views of a staggered TFT region in the steps of a first method for fabricating the TFT matrix device according to a sixth embodiment of this invention.

By following the steps of FIGS. 21A and 21B, the source electrode 14S and the drain electrode 14D of an ITO film, the source electrode contact layer 15S and the drain electrode contact layer 15D of the $n^+$-amorphous silicon film are formed respectively opposed to each other. Subsequently, an amorphous silicon film 20a, an SiN film 21a and an Al film 22a are deposited on the entire surface in the stated order, then the Al film 22a is etched with a resist film 23 on the Al film 22a, which is patterned in a configuration of gate electrode to form the gate electrode 22 of the Al film 22a (FIG. 24A).

Figure 24B:
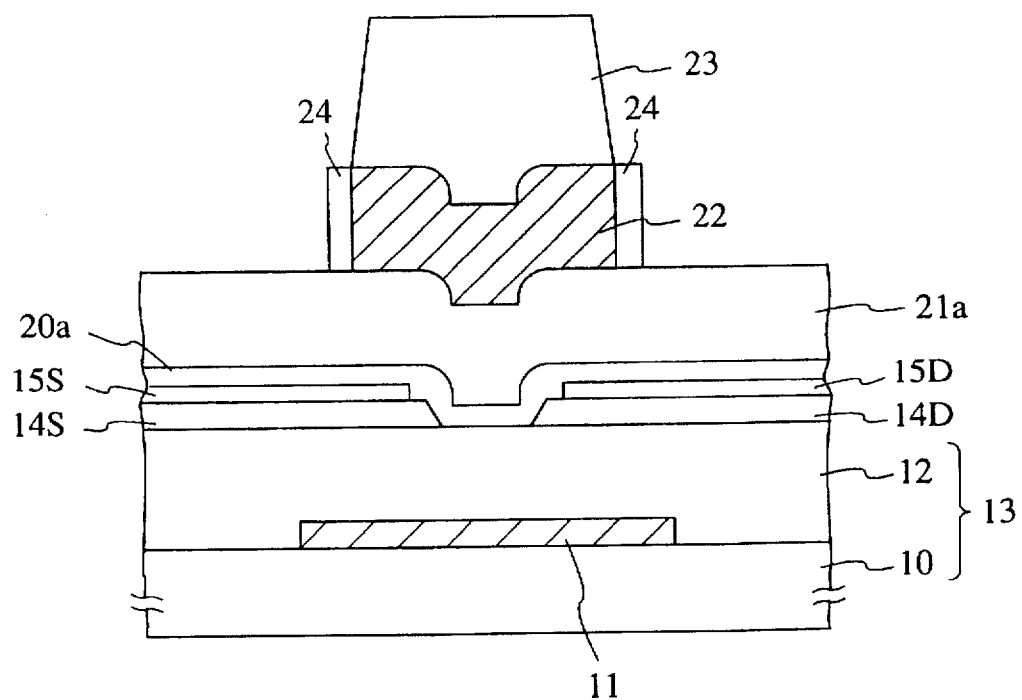

Then, the resin film 24 is formed in a 500 nm-thickness on the exposed side walls of the gate electrode 22 by electrodeposition (FIG. 24B).

Figure 25A:
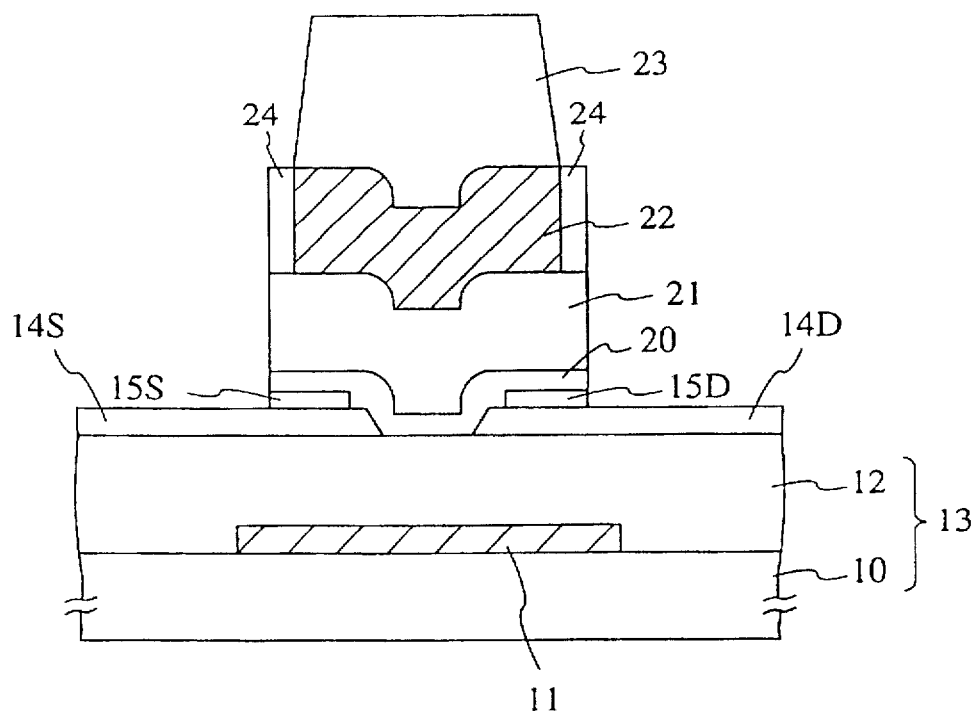

Then, the SiN film 21a, the amorphous silicon film 20a, the source electrode contact layer 15S and the drain electrode contact layer 15D are etched into a mesa with the resin film 24 and the resist film 23 as a mask by RIE to form the gate insulating film 21 of the SiN film 21a, and the operational semiconductor layer 20 of the amorphous silicon film 20a, while unnecessary parts of the source electrode contact layer 15S and the drain electrode contact layer 15D are removed (FIG. 25A).

Figure 25B:
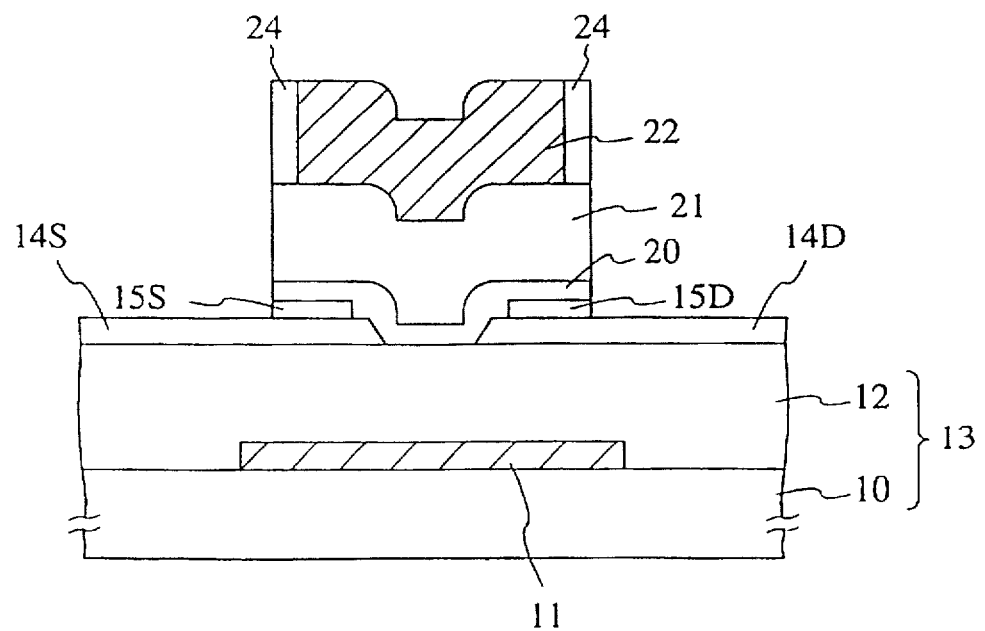

Then, the whole is immersed in a resist peeling liquid to remove the resist film. Thus the staggered TFT region of the TFT matrix device of FIG. 23 is formed (FIG. 25B).

As described above, according to the sixth embodiment, the gate electrode 22 is made narrower with respect to the gate insulating film 21 to form a 0.5 μm-step between the side walls of the gate electrode 22 and those of the gate insulating film 21, and in addition, the side walls of the gate electrode 22 are covered with the resin film 24, whereby the same effect as in the fifth embodiment can be achieved.

According to the method for forming the staggered TFT region of the TFT matrix device according to the sixth embodiment, the side walls of the gate electrode 22 are coated with the resin film 24, and then the SiN film 21a, the amorphous silicon film 20a, etc. are etched into a mesa with the resin film 24 as a mask to form the gate insulating film 21 and the operational semiconductor layer 20. As a result, the side walls of the resin film 24 coating the gate electrode 22, and those of the gate insulating film 21 can form one plane.

In the sixth embodiment, the side walls of the gate electrode 22 are coated with the resin film 24 but may be coated with an anodic oxidation film formed by anodic oxidation in place of the resin film 24. In this case, in the step of FIG. 24A, the Al film 22a is etched with the resist film 23 patterned in a configuration of gate electrode as a mask to form the gate electrode 22 of the Al film 22a by anodic oxidation, whereby an anodic oxidation film is formed on exposed surfaces of the gate electrode 22.

7. Seventh Embodiment

The TFT matrix device according to a seventh embodiment of this invention will be explained with reference to FIGS. 26A to 26C.

Figure 26A:
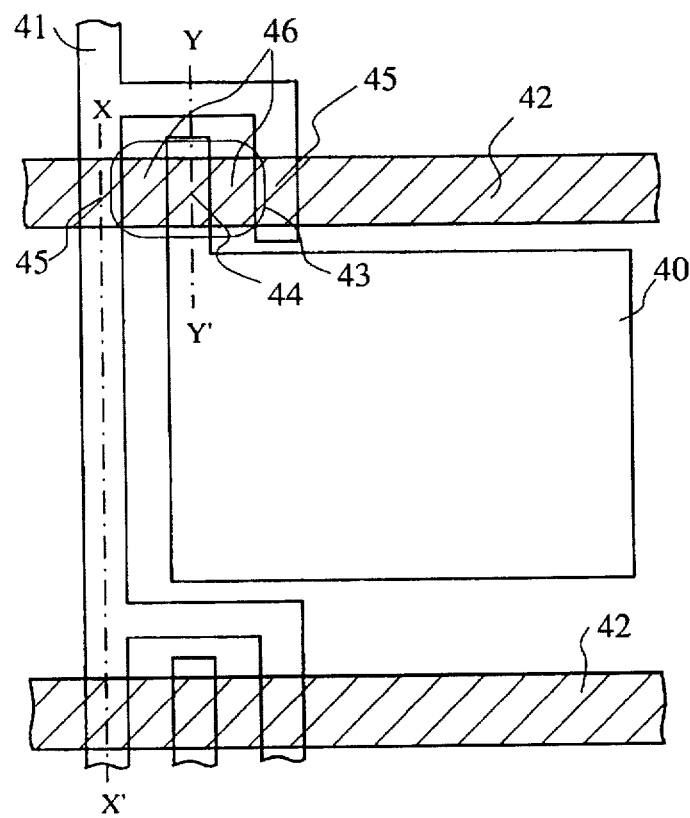
FIG. 26A is a plan view of the TFT matrix device according to the seventh embodiment.

FIG. 26A is a plan view of the TFT matrix device according to the seventh embodiment. FIG. 26B is a sectional view along the line X-X' in FIG. 26A. FIG. 26C is a sectional view along the line Y-Y' in FIG. 26A.

A plurality of picture elements electrodes 40 are arranged in a matrix. As shown in FIG. 26A, drain bus lines 41 are provided in the longitudinal direction, and gate bus lines 42 are provided in the lateral direction. Staggered TFTs 43 are provided at the intersections between the drain bus lines 41 and the gate bus lines 42.

As shown in FIG. 26A, in each TFT 43, the source electrode 44 is formed below the gate bus line 42 and is projected from an upper left part of the associated picture element electrode 40. The drain electrode 45 of the TFT 43 is formed below the gate bus line 42 on both right and left sides of the source electrode 44. The drain electrode 45 on the left side of the source electrode 44 is formed continuous to the drain bus line 41, and the drain electrode 45 on the right side is connected to the drain bus line 41. The gate electrode 46 is formed continuous to that gate bus line 42.

Figure 26B:
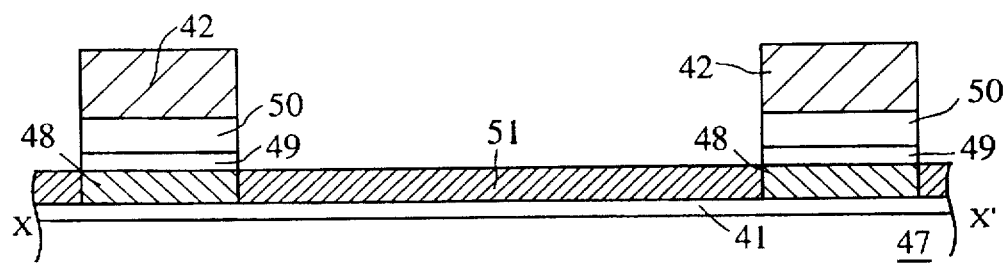
FIG. 26B is a sectional view along the line X-X' in FIG. 26A.

As shown in FIG. 26B, the drain bus line 41 is formed of a transparent conductor film, such as a 50 nm-thickness ITO film, on an insulating substrate 47.

At the intersection of the drain bus line 41 with the gate bus line 42 of a 200 nm-thickness Cr film, a first metal film 48 of a 150 nm-thickness Cr film, an operational semiconductor layer 49 of a 30 nm-thickness amorphous silicon film, and a gate insulating film 50 of a 400 nm-thickness SiN (silicon nitride) film are formed in the stated order on the drain bus line 41.

Between the intersections of the drain bus line 41 and two adjacent gate bus lines 42, a second metal film 51 of a 200 nm-thickness Cr film is formed on the drain bus line 41 of the transparent conductor film. The second metal film 51 formed between the intersections is connected to the first metal film 48 at the intersection.

Figure 26C:
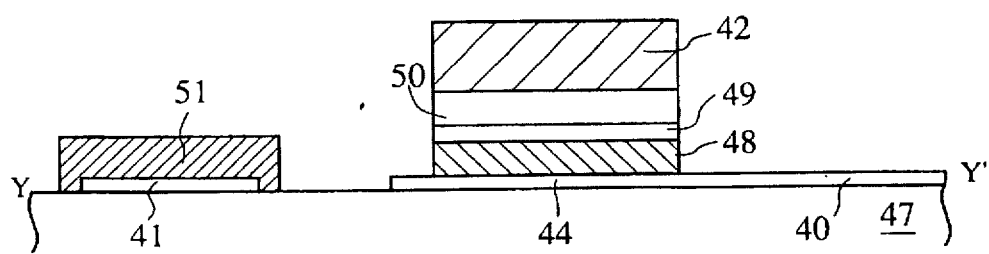
FIG. 26C is a sectional view along the line Y-Y' in FIG. 26C.

At the source electrode 44 of the TFT 43, as shown in FIGS. 26A-26C the gate bus line intersects through the first metal film 48, the operational semiconductor layer 49 and the gate insulating film 50. On the other hand, the connection (hereinafter called drain bus line 41 including this connection) of the transparent conductor film interconnecting the drain electrode 45 and the drain bus line 41 is also coated with the second metal film 51.

Next, the method for fabricating the TFT matrix device of FIGS. 26A to 26C will be explained with reference to FIGS. 27A to 27E.

FIGS. 27A to 27E are sectional views of the TFT matrix device along the line Y-Y' in FIG. 26A in the respective steps of the fabrication method.

Figure 27A:
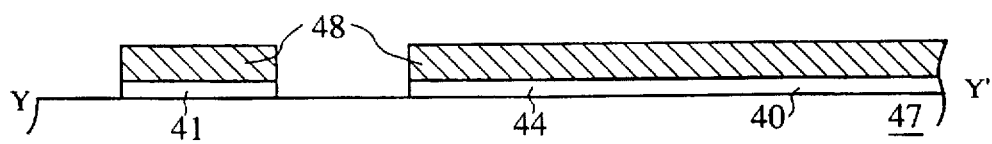
FIGS. 27A to 27E are sectional views of the TFT matrix device along the line Y-Y' in FIG. 26 in the respective steps of the fabrication method.

First, a transparent conductor film of a 50 nm-thickness ITO film, and a first metal film 48 of a 150 nm-thickness Cr film are formed on an insulating substrate 47 in the stated order by sputtering. Then, these formed films are patterned to form a picture element electrode 40, the source electrode 44, the drain electrode 45, and the drain bus line 41 of the transparent conductor film with the first metal film 48 on the upper surface thereof (FIG. 27A).

Figure 27B:
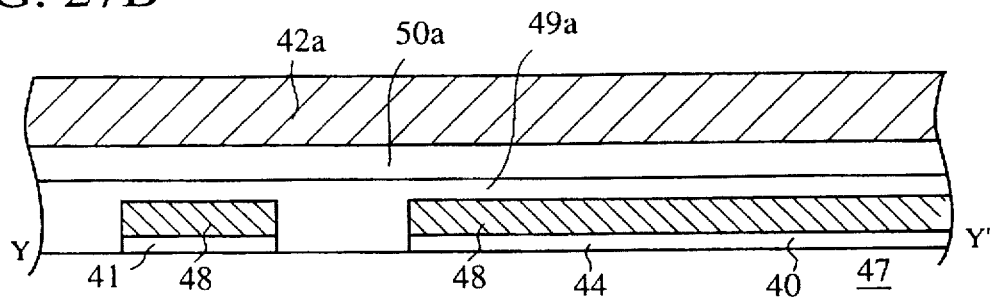

Then, a 30 nm-thickness amorphous silicon film 49a, and a 400 nm-thickness SiN film 50a are formed on the entire surface in the stated order, and a gate film 42a of a 200 nm-thickness Cr film is formed on the SiN film 50a (FIG. 27B).

Figure 27C:
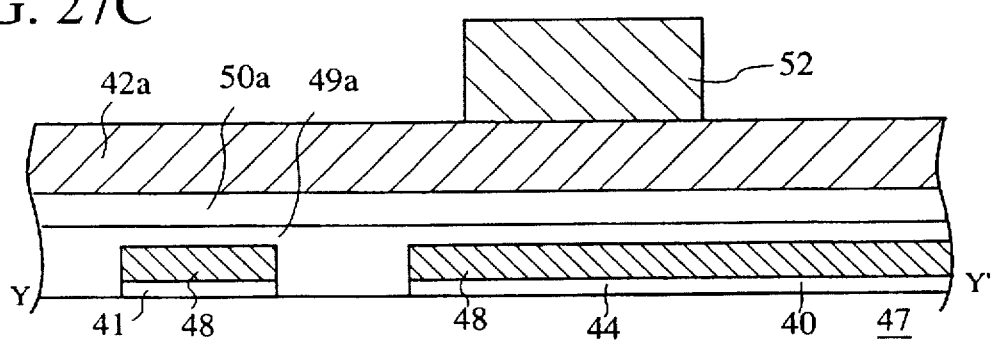

Then, a resist film 52 is formed on the entire surface, and the resist film 52 is patterned in a configuration of gate bus line including gate electrode (FIG. 27C).

Figure 27D:
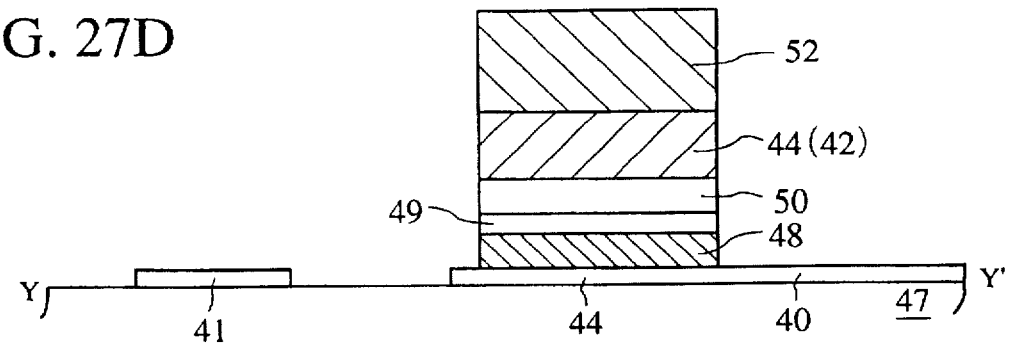

Then, the gate film 42a, the SiN film 50a and the amorphous silicon film 49a are selectively etched off with the patterned resist film 52 as a mask to form the operational semiconductor film 49 of the amorphous silicon film 49a, the gate insulating film 50 of the SiN film 50a, and the gate bus line 42 including the gate electrode of the gate film 42a. Subsequently the first metal film 48 on the picture element electrode 40 and the drain bus line 41 are etched off (FIG. 27D).

Figure 27E:
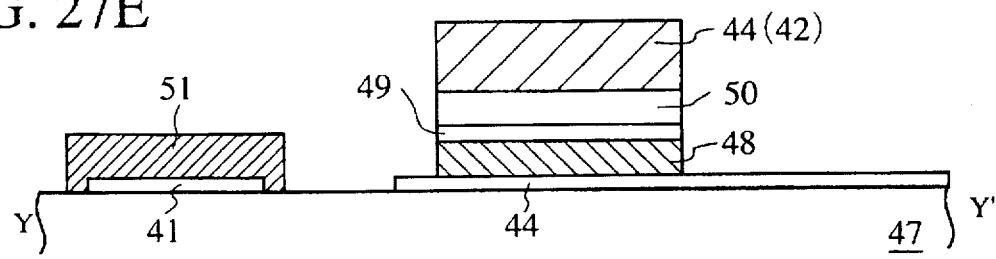

Then, after the resist film 52 is removed, electrodeposition is conducted in an electrolyte solution containing Cr ions with the drain bus line 41 as the cathode, and the Cr plate as the anode to form the second metal film 51 of a 200 nm-thickness Cr film only on an exposed part of the drain bus line 41 of the transparent electrode film (FIG. 27E).

That is, the second metal film 51 is formed on a part of the drain bus line 41 between the intersections where the drain bus line 41 crosses the gate bus lines 42. This second metal film 51 electrically connects to the first metal film 48 in the intersection (FIG. 26B). Thus, the TFT matrix device of FIG. 26 is completed.

Subsequently a polyimide film (not shown) is coated on the entire surface for the control of an orientation of the liquid crystal, an opposed electrode substrate (not shown) are bonded opposite the insulating substrate 47, and the liquid crystal is sealed in between the opposed electrode substrate and the polyimide film above the insulating substrate 47, and a TFT matrix device-type liquid crystal display device is completed.

According to the seventh embodiment, the second metal film 51 is also formed on a part of the drain bus line 41 between its intersections with gate bus lines 42, and the second metal film 51 connects to the first metal film 48 on the drain bus line 41 at the intersection, with the result that the first metal film 48 or the second metal film is formed on the entire drain bus line 41 of the transparent conductor film. The drain bus line region can have low resistance values.

According to the method for fabricating the TFT matrix device of the seventh embodiment, the second metal film 51 is electrodeposited on the drain bus line 41 as the cathode in an electrolyte solution, whereby the second metal film 51 is selectively precipitated on the drain bus line 41 between the intersections of the drain bus line 41 with the gate bus lines 42. Accordingly without forming a resist film for forming the second metal film 41, the second metal film 51 can be formed by self-alignment by the simple forming process.

In this fabrication method, when the second film 51 is electrodeposited, a current may be supplied also to the gate bus line 42 to apply the second metal film 51 also on the gate bus line 42, whereby the gate bus line as well as the drain bus line 41 is protected and can have lower resistance.

In this fabrication method, the resist film 52 is removed before the electrodeposition of the second metal film 51, but the second metal film 51 may be electrodeposited with the resist film 52 left, whereby contamination, etc. of the gate bus line 42 due to contact with the electrolyte solution in the electrodeposition can be prevented.

8. Eighth Embodiment

The TFT matrix device according to an eighth embodiment of this invention will be explained with reference to FIGS. 28A to 28C.

Figure 28A:
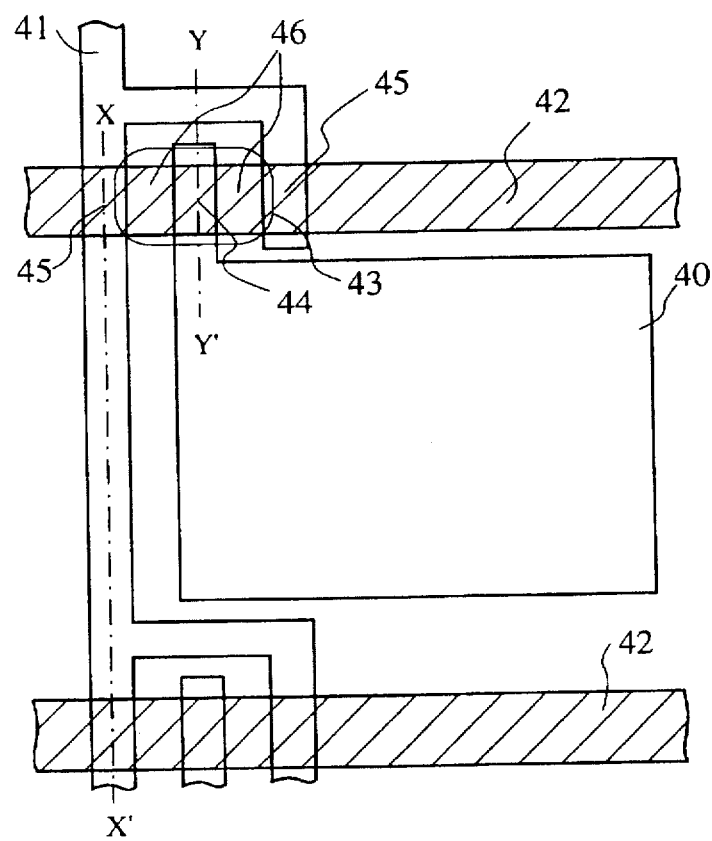
FIG. 28A is a plan view of the TFT matrix device according to the eighth embodiment of FIG. 28A.

FIG. 28A is a plan view of the TFT matrix device according to the eighth embodiment of FIG. 28A. FIG. 28B is a sectional view of the TFT matrix device along the line X-X' in FIG. 28A. FIG. 28C is a sectional view of the TFT matrix device along the line Y-Y' in FIG. 28A. Common members of the TFT matrix device of FIGS. 28A to 28C with that of FIG. 26A to 26C have the same reference numerals to omit or simplify their explanation.

The plan view of FIG. 28A is the same as that of FIG. 26A.

Figure 28B:
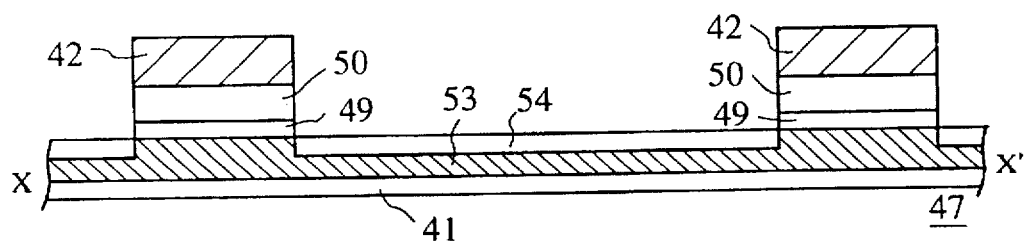
FIG. 28B is a sectional view of the TFT matrix device along the line X-X' in FIG. 28A.

As shown in FIG. 28B, a first metal film 53 of a 150 nm-thickness Al film is uninterruptedly formed on a drain bus line 41 of a transparent conductor film provided longitudinally on an insulating substrate 47.

That is, a first metal film 53, an operational semiconductor layer 49 and a gate insulating film 50 are formed in the stated order on the drain bus line 41 at its intersection with a gate bus line 42. In this respect, this embodiment is the same as the seventh embodiment. The first metal film 53 is formed on a part of the drain bus line 41 between its intersections with the gate bus lines 42, and the surface of the first metal film 53 is coated with an anodic oxidation film 54. In this respect, this embodiment is different from the seventh embodiment, in which the second metal film 51 is formed on the drain bus line 41 between its intersections with the gate bus lines 42, and the surface of the second metal film 51 is exposed without any protecting film.

Figure 28C:
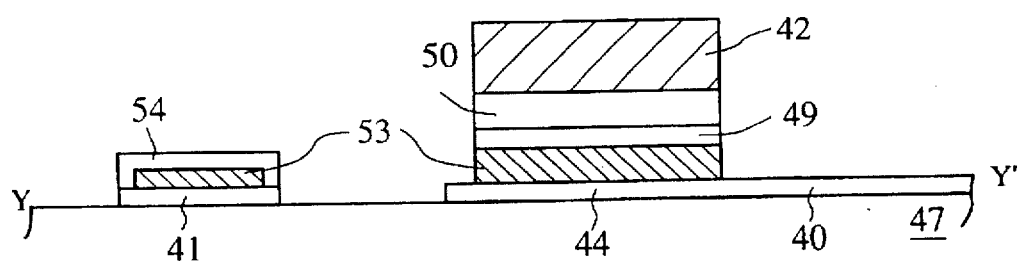
FIG. 28C is a sectional view of the TFT matrix device along the line Y-Y' in FIG. 28A.

As shown in FIG. 28C, the gate bus line 42 of a Cr gate film crosses the source electrode 44 of the TFT 43 through the first metal film 53, the operational semiconductor layer 49 and the gate insulating film 50 laid one on another. The first metal film 53 is formed on the drain bus line 41 connecting the drain electrode 45, and the surface of the first metal film 53 is coated with the anodic oxidation film 54.

Next, the method for fabricating the TFT matrix device of FIGS. 28A to 28C will be explained with reference to FIGS. 29A to 29E.

Figure 29A:
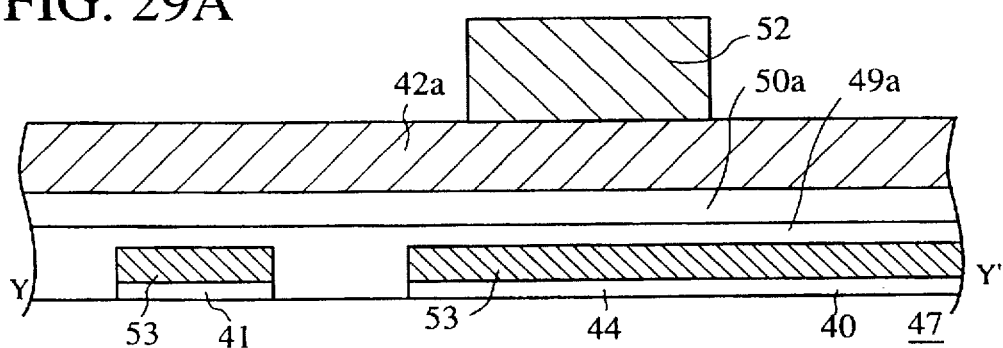
FIGS. 29A to 29D are sectional views of the TFT matrix device along the line Y-Y' in FIG. 28A in the steps of the fabrication method.

FIGS. 29A to 29D are sectional views of the TFT matrix device along the line Y-Y' in FIG. 28A in the steps of the fabrication method. FIG. 29E is a sectional view of the TFT matrix device in the step of FIG. 29D along the line X-X' in FIG. 28A.

By following the steps of FIGS. 27A to 27C, the picture element electrode 40, the source electrode 44, the drain electrode 45 and the drain bus line 41 of a transparent conductor film with the first metal film 53 on the upper surface thereof are formed on an insulating substrate 47, and then an amorphous silicon film 49a, a SiN film 50a and a pate film 42a of a Cr film are formed in the stated order. Then, on the pate film 42a are formed a resist film 52 patterned in a configuration of gate bus line including the gate electrode (FIG. 29A).

Figure 29B:
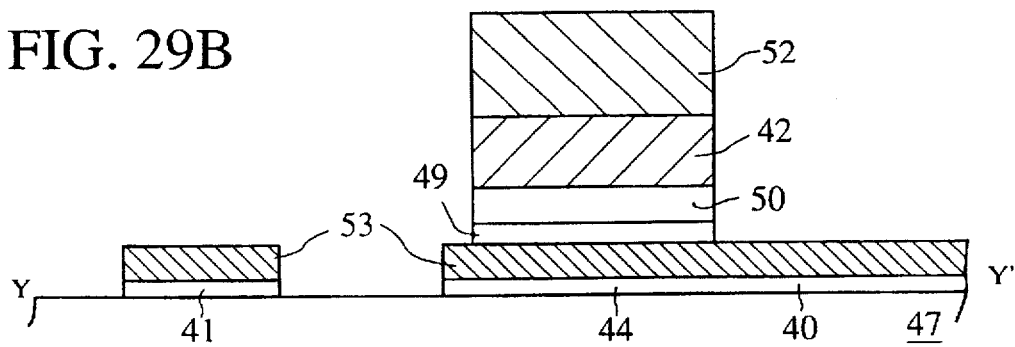

Then, with the resist film 52 as a mask, the pate film 42a, the SiN film 50a and the amorphous silicon film 49a are selectively etched off to form the operational semiconductor layer 49 of the amorphous silicon film 49a, the gate insulating film 50 of the SiN film 50a, and the gate bus line 42 including the gate electrode of the gate film 42a (FIG. 29B).

Figure 29C:
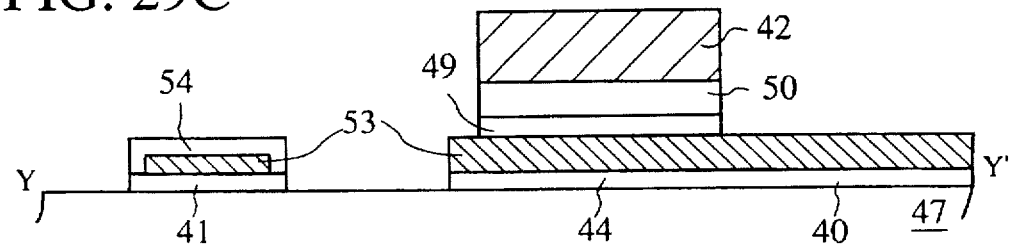

Then, after the resist film 52 is removed, without etching off the first metal film as in the first embodiment, the first metal film 53 is subjected to anodic oxidation with the drain bus line 41 as the anode in an electrolyte solution, and the anodic oxidation film 54 is selectively formed on the surface of the first metal film 53 on the drain bus line 41. Since the first metal film is formed of Al film in this embodiment, the anodic oxidation film 54 on the surface of the first metal film 53 can be dense. No anodic oxidation film is formed on the surface of the first metal film 53 on the source electrode 44 and the picture element electrode 40 (FIG. 29C).

Figure 29D:
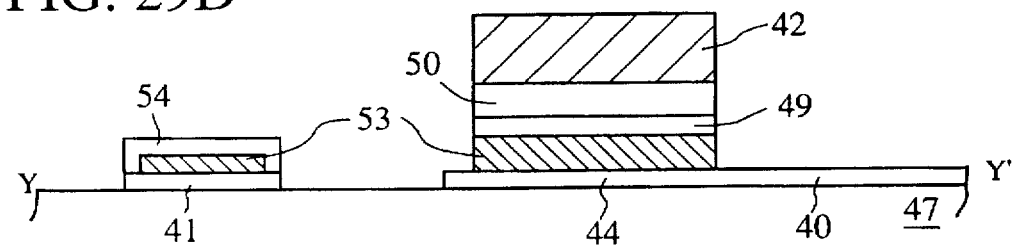
Figure 29E:
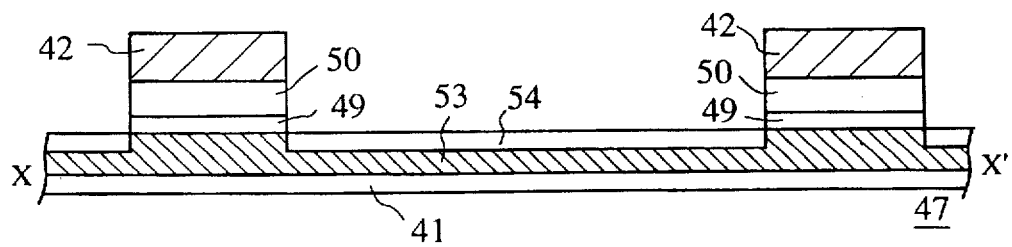
FIG. 29E is a sectional view of the TFT matrix device in the step of FIG. 29D along the line X-X' in FIG. 28A.

Then, with the anodic oxidation film 54 as a mask, the metal film 53 on the parts other than the drain bus line 41 is etched off, whereby the first metal film 53 on the picture element electrode 40 is etched off (FIG. 29D).

The first metal film 53 on the drain bus line between its intersections with gate bus lines 42 is not etched off, because the anodic oxidation film 54 is formed on the surface of the first metal film 53 on the drain bus line 41 between its intersections with gate bus lines 42. Accordingly the first metal film 53 is formed uninterruptedly on the entire drain bus line 41 (FIG. 29E). Thus the TFT matrix device of FIGS. 28A to 28C is completed.

Thus according to the eighth embodiment, the first metal film 53 is uninterruptedly formed on the entire drain bus line 41, whereby the drain bus line region can have lower resistance values.

Because the drain bus line 41 is coated with the anodic oxidation film 54, the anodic oxidation film 54 can function as a passivation film for protecting the drain bus line 41 from adverse influence of the liquid crystal. As results, influences that a current flows during a display operation of the liquid crystal display panel, and defective displays occur, that a lifetime of the liquid crystal is shortened, or others can be prevented. The liquid crystal display device can be more reliable.

According to the method for fabricating the TFT matrix device according to the eighth embodiment, the first metal film 53 is anode oxidized with the drain bus line 41 as the anode, and then with the anodic oxidation film 54 formed on the first metal film 53 as a mask, the first metal film 53 on the parts other than the drain bus line 41 can be selectively etched off. Accordingly the first metal film 53 can be uninterruptedly formed on the entire bus line 41 by self alignment in the simple forming process.

In the method for fabricating TFT matrix device of the eighth embodiment, it is possible to supply a current to the gate bus line 42 to form the anodic oxidation film on the surface of the gate bus line 42 when the first metal film 53 is anode oxidized, whereby the gate bus line 42 is kept from corrosion in the later step of etching off the first metal film 53.

In the fabrication method, the resist film 52 is removed before the anodic oxidation of the first metal film 53, but the first metal film 53 may be anode oxidized with the resist film 52 left, whereby contamination, etc. of the gate bus line 42 due to contact with an electrolyte solution in the anodic oxidation can be prevented.

9. Ninth Embodiment

The TFT matrix device according to a ninth embodiment of this invention will be explained with reference to FIGS. 30A to 30C.

Figure 30A:
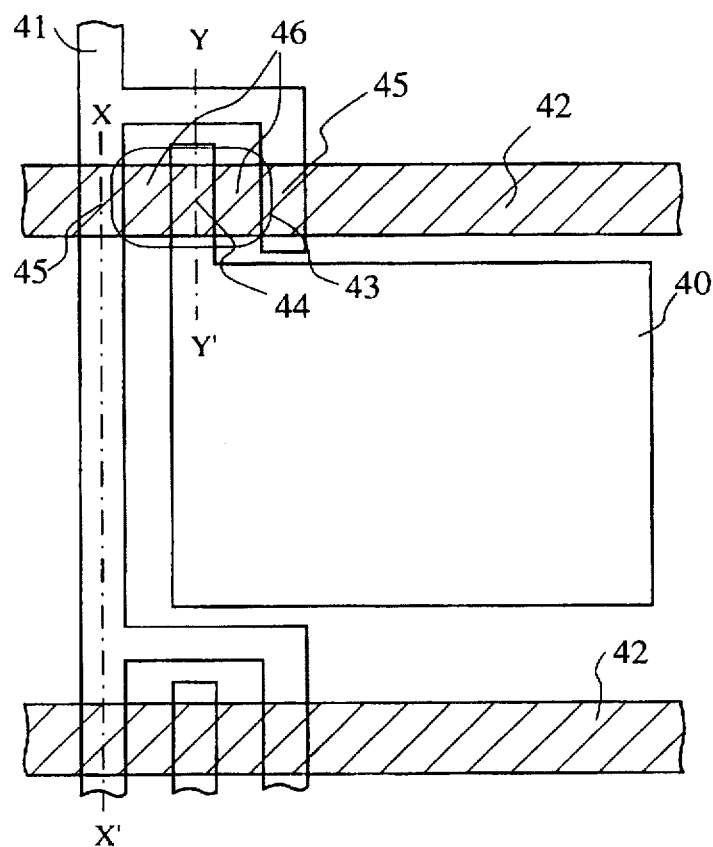
FIG. 30A is a plan view of the TFT matrix device according to the ninth embodiment of this invention.
Figure 30B:
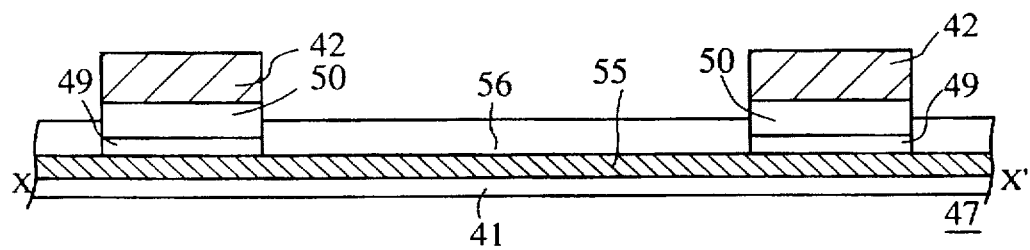
FIG. 30B is a sectional view of the TFT matrix device along the line X-X' in FIG. 30A.

FIG. 30A is a plan view of the TFT matrix device according to the ninth embodiment of this invention. FIG. 30B is a sectional view of the TFT matrix device along the line X-X' in FIG. 30A. FIG. 30C is a sectional view of the TFT matrix device along the line Y-Y' in FIG. 30A. Common members of the TFT matrix device with that of FIG. 28A to 28C have the same reference numerals to omit or simplify their explanation.

The plan view of FIG. 30A is the same as that of FIG. 28A.

As shown in 30B, a first metal film 55 of a 150 nm-thickness Al film is formed uninterruptedly on a drain bus line 41 of a transparent conductor film provided longitudinally on an insulating substrate 47.

That is, a first metal film 55, an operational semiconductor layer 49 and a gate insulating film 50 are formed in the stated order on the drain bus line 41 at its intersection with a gate bus line 42. The first metal film 55 is formed on the drain bus line 41 between its intersections with the gate bus lines 42, and the surface of the first metal film 55 is coated with a resin film 56. In this respect, this embodiment is different from the eighth embodiment, in which the surface of the first metal film 53 on the drain bus line 41 is coated with an anodic oxidation film 54.

Figure 30C:
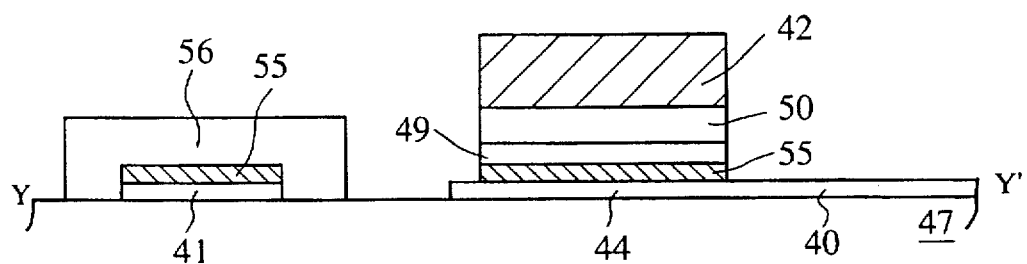
FIG. 30C is a sectional view of the TFT matrix device along the line Y-Y' in FIG. 30A.

As shown in FIG. 30C, the gate bus line 42 of a Cr gate film crosses the source electrode 44 of the TFT 43 through the first metal film 55, the operational semiconductor layer 49 and the gate insulating film 50 laid one on another. The first metal film 55 is formed on the drain bus line 41 connecting the drain electrode 45, and the surface of the first metal film 55 is coated with the resin film 56.

Next, the method for fabricating the TFT matrix device of FIGS. 30A to 30C will be explained with reference to FIGS. 31A to 31D.

Figure 31A:
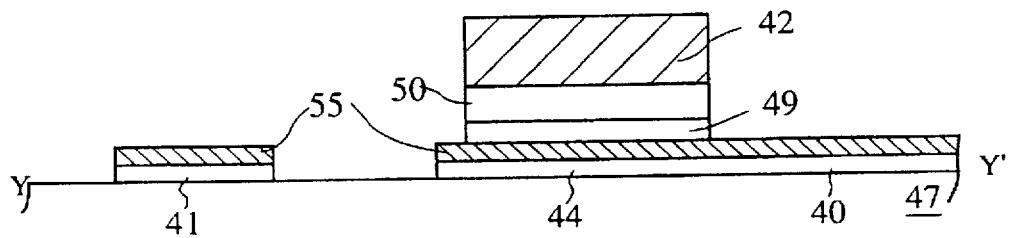
FIGS. 31A to 31C are sectional views of the TFT matrix device along the line Y-Y' in FIG. 30A in the steps of the fabrication method.
Figure 31B:
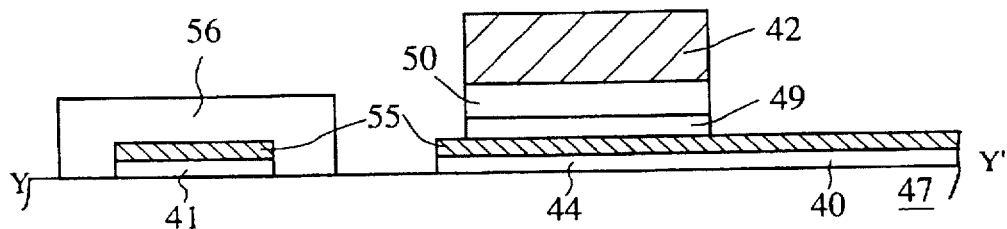
Figure 31C:
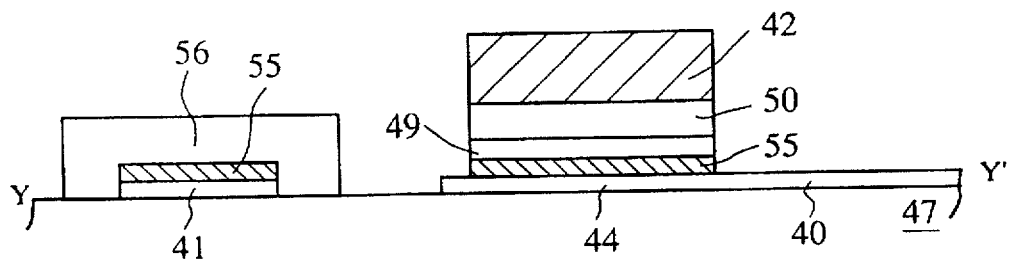
Figure 31D:
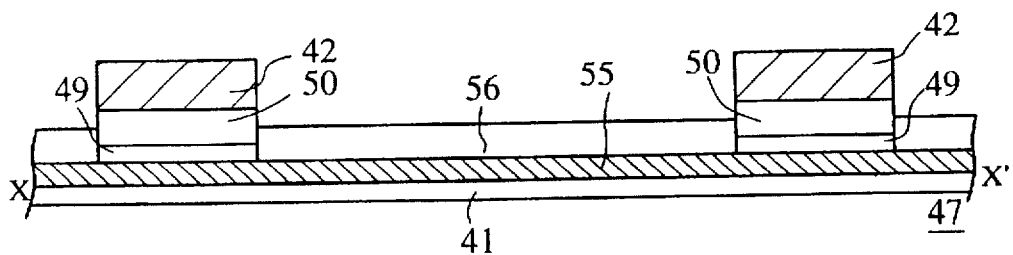
FIG. 31D is a sectional view of the TFT matrix device in the step of FIG. 31C along the line X-X' in FIG. 30A.

FIGS. 31A to 31C are sectional views of the TFT matrix device along the line Y-Y' in FIG. 30A in the steps of the fabrication method. FIG. 31D is a sectional view of the TFT matrix device in the step of FIG. 31C along the line X-X' in FIG. 30A.

By following the steps of FIGS. 29A and 29B, the picture element electrode 40, the source electrode 44, the drain electrode 45 and the drain bus line 41 of a transparent conductor film with the first metal film 55 on the upper surface thereof are formed on an insulating substrate 47, and then an amorphous silicon film 49a, a SiN film 50a and a gate film 42a of a Cr film are formed in the stated order. Then, in the TFT region are formed the operational semiconductor layer 49 of an amorphous silicon film, and the gate insulating film 50 of SiN film, and the gate bus line 42 including the gate electrode of Cr gate film (FIG. 31A).

In this state, a voltage is applied to the drain bus line 41 in a resin emulsified solution to electrodeposit the resin on the first metal film 55. Thus, the resin film 56 is selectively formed on the surface of the first metal film 55 of the drain bus line 41. But the resin film 56 is not formed on the source electrode and the surface of first metal film on the picture element electrode 40 (FIG. 31B).

Then, with the resin film 56 as a mask, the first metal film other than that on the drain bus line 41 is etched off, whereby the first metal film 55 on the picture electrode 40 is etched off (FIG. 31C).

The first metal film 55 of a part of the drain bus line between its intersections with the gate bus lines 42 is not etched off because the resin film 56 is formed on the first metal film 55 on the part. Accordingly the first metal film 55 is uninterruptedly formed on the entire drain bus line 41 (FIG. 31D).

Thus according to the ninth embodiment, since the first metal film 55 is uninterruptedly formed on the entire drain bus line 41, the drain bus line region can have lower resistance values.

Because the first metal film 55 on the drain bus line 41 is coated with the resin film 56, the resin film 56 can function as a passivation film for protecting the drain bus line region from adverse influence of the liquid crystal. As results, influences that a current flows during a display operation of the liquid crystal display panel, and defective displays occur, that a lifetime of the liquid crystal is shortened, or others can be prevented. The liquid crystal display device can be more reliable.

According to the method for fabricating the TFT matrix device according to the ninth embodiment, the resin film 56 is electrodeposited on the first metal film 55 with a voltage applied to the drain bus line 41, and then with the resin film 56 formed above the drain bus line 41 as a mask, the first metal film 55 at a part other than the bus drain line 41 is selectively etched off. Accordingly the first metal film 55 can be formed uninterrupted by self alignment on the entire drain bus line 41 by the simple forming process.

In this method for fabricating the TFT matrix device according to the ninth embodiment, it is possible the resin film 56 may be formed on the surface of the gate bus line 42 by applying a voltage to the gate bus line 42 when the resin film 56 is electrodeposited on the first metal film 55 on the drain bus line 41. Thus corrosion of the gate bus line 42 can be prevented in the later step of etching off the first metal film 55.

10. Tenth Embodiment

The TFT matrix device according to the tenth embodiment of this invention will be explained with reference to FIGS. 32A to 32C.

Figure 32A:
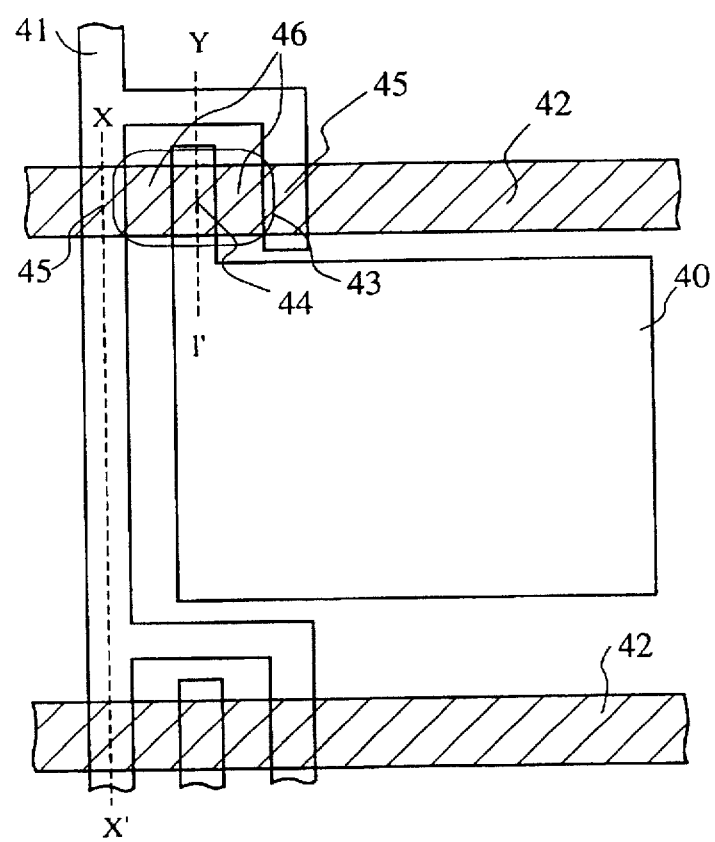
FIG. 32A is a plan view of the TFT matrix device according to the tenth embodiment.
Figure 32B:
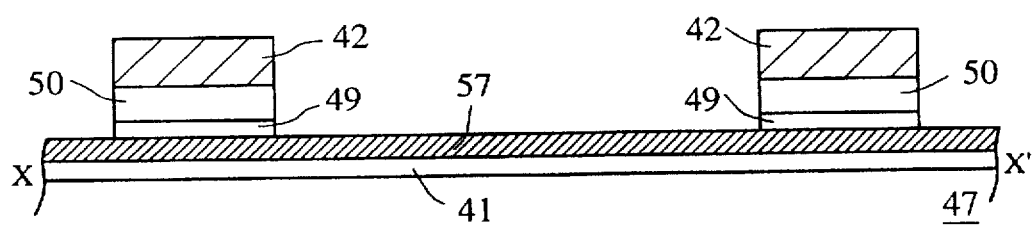
FIG. 32B is a sectional view of the TFT matrix device along the line X-X' in FIG. 32A.

FIG. 32A is a plan view of the TFT matrix device according to the tenth embodiment. FIG. 32B is a sectional view of the TFT matrix device along the line X-X' in FIG. 32A. FIG. 32C is a sectional view of the TFT matrix device along the line Y-Y' in FIG. 32A. Common members of the TFT matrix device with that of FIGS. 26A to 26C have the same reference numerals to omit or simplify their explanation.

The plan view of FIG. 32A is the same as that of FIG. 26A.

As shown in 32B, a third metal film 57 of a 200 nm-thickness Cr film is formed uninterruptedly on a drain bus line 41 of a transparent conductor film provided longitudinally on an insulating substrate 47.

That is, the third metal film 57, an operational semiconductor layer 49 and a gate insulating film 50 are formed in the stated order on the drain bus line 41 at its intersection with a gate bus line 42. The third metal film 57 is formed also on a part of the drain bus line 41 between its intersections with the gate bus lines 42.

Figure 32C:
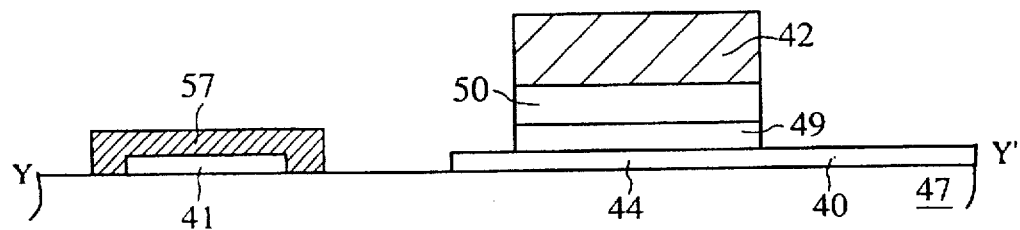
FIG. 32C is a sectional view of the TFT matrix device along the line Y-Y' in FIG. 32C.

As shown in FIG. 32C, the gate bus line 42 of a Cr gate film crosses the source electrode 44 of the TFT 43 through the operational semiconductor layer 49 and the gate insulating film 50 laid one on another. The third metal film 57 is formed on the drain bus line 41 connecting the drain electrode 45.

Next, the method for fabricating the TFT matrix device of FIGS. 32A to 32C will be explained with reference to FIGS. 33A to 33F.

FIGS. 33A to 33E are sectional views of the TFT matrix device along the line Y-Y' in FIG. 32A in the steps of the fabrication method. FIG. 33F is a sectional view of the TFT matrix device in the step of FIG. 33E along the line X-X' in FIG. 32A.

In the seventh to the ninth embodiments, the coating films are selectively formed by electrochemical methods after the formation of the gate bus lines 42. But the tenth embodiment is characterized in that the electrochemical selective formation of a coating film is conducted before the formation of the gate bus line 42 and after the formation of the source electrode 44, the drain electrode 45 and the drain bus line 41.

Figure 33A:
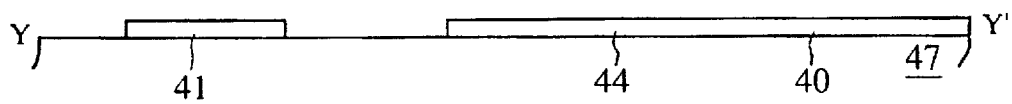
FIGS. 33A to 33E are sectional views of the TFT matrix device along the line Y-Y' in FIG. 32A in the steps of the fabrication method.

The transparent conductor film of a 50 nm-thickness ITO film is formed on the insulating substrate 47 by sputtering, and then patterned in a set configuration to form the picture element electrode 40, the source electrode 44, the drain electrode, and the drain bus line 41 of the transparent conductor film (FIG. 33A).

Figure 33B:
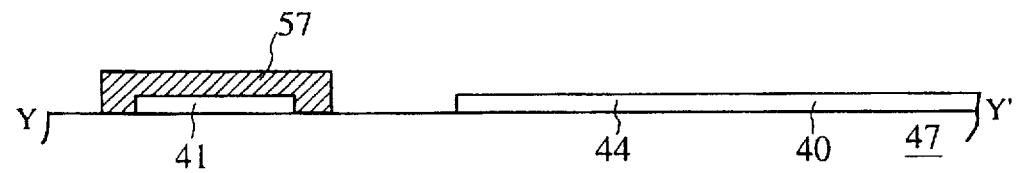

A third metal film 57 of a 200 nm-thickness Cr film is electrodeposited on only an exposed part of the drain bus line 41 in an electrolyte solution containing Cr ions with the drain bus line 41 as the cathode, and a Cr plate as the anode to form the third metal film 57 on the drain bus line of the transparent conductor film (FIG. 33B).

Figure 33C:
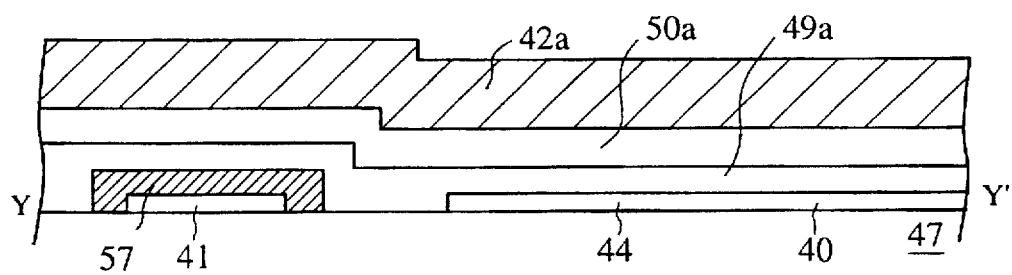

Then, a 30 nm-thickness amorphous silicon film 49a, and a 400 nm-thickness SiN film 50a are formed on the entire surface by P-CVD in the stated order, and a gate film 42a of a 200 nm-thickness Cr film is formed on the SiN film 50a (FIG. 33C).

Figure 33D:
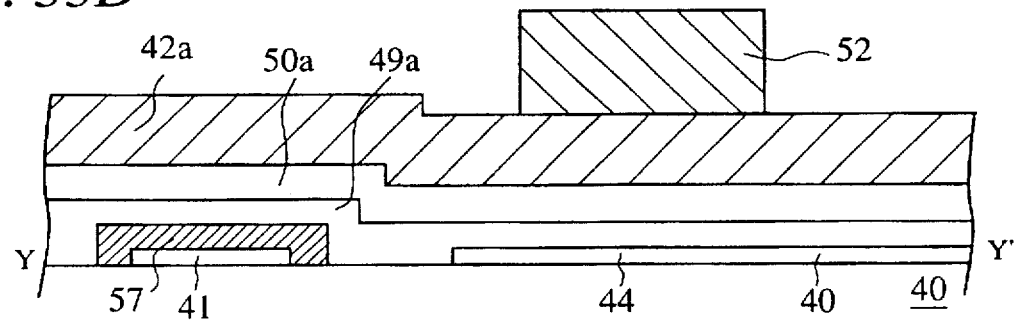

Then, a resist film is formed on the entire surface, and then the resist film is patterned in a configuration of gate bus line containing gate electrode (FIG. 33D).

Figure 33E:
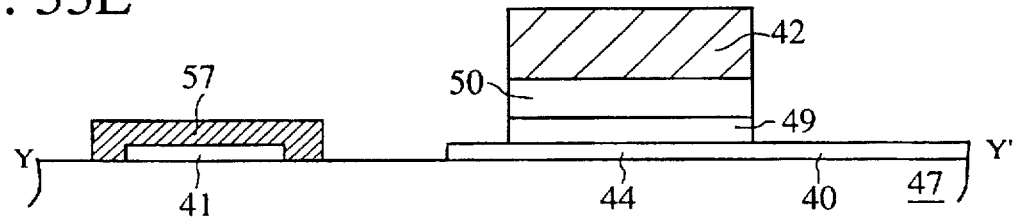
Figure 33F:
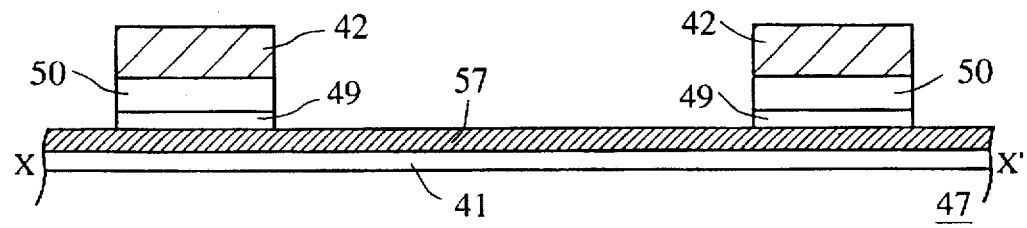
FIG. 33F is a sectional view of the TFT matrix device in the step of FIG. 33E along the line X-X' in FIG. 32A.

Then, with the patterned resist film 52 as a mask, the gate film 42a, the SiN film 50A and the amorphous silicon film 49a are selectively etched off to form the operational semiconductor layer 49 of the amorphous silicon film 49a, the gate insulating film 50 of the SiN film 50a, and the gate bus line 42 and the gate electrode of the gate film 42a (FIG. 33E).

At this time, the third metal film 57 uninterruptedly formed on the entire surface of the drain bus line is exposed (FIG. 33F). Thus the TFT matrix device of FIGS. 32A to 32C is completed.

Thus according to the tenth embodiment, the third metal film 57 is formed uninterruptedly on the entire drain bus line 41. Accordingly the drain bus line region can have lower resistance values.

According to the method for fabricating the TFT matrix device according to the tenth embodiment, the third metal film 57 metal is electrodeposited in an electrolyte solution with the drain bus line 41 as the cathode, whereby the third metal film 57 can be selective formed on the drain bus line 41 of the transparent conductor film. Accordingly no resist film is necessary to form the third metal film 57, and the third metal film 57 can be formed by self alignment by the simple forming process.

11. Eleventh Embodiment

The TFT matrix device according to an eleventh embodiment of this invention will be explained with reference to FIGS. 34A to 34C.

Figure 34A:
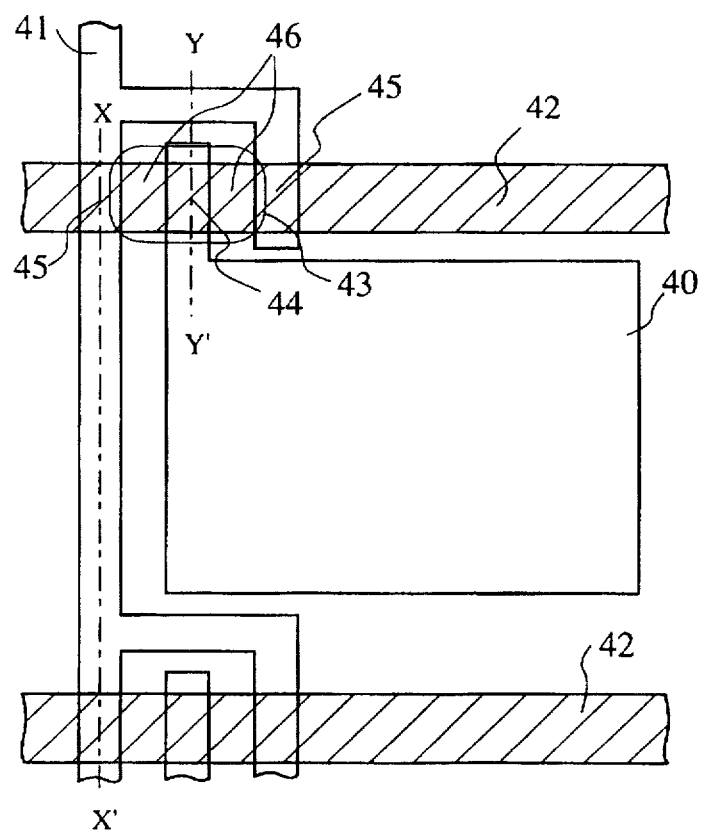
FIG. 34A is a plan view of the TFT matrix device according to the eleventh embodiment.

FIG. 34A is a plan view of the TFT matrix device according to the eleventh embodiment. FIG. 34B is a sectional view of the TFT matrix device along the line X-X' in FIG. 34A. FIG. 34C is a sectional view of the TFT matrix device along the line Y-Y' in FIG. 34A. Common members of the eleventh embodiment with that of FIGS. 32A to 32C have the same reference numerals to omit or simplify their explanation.

The plan view of FIG. 34A is the same as that of FIG. 32A.

Figure 34B:
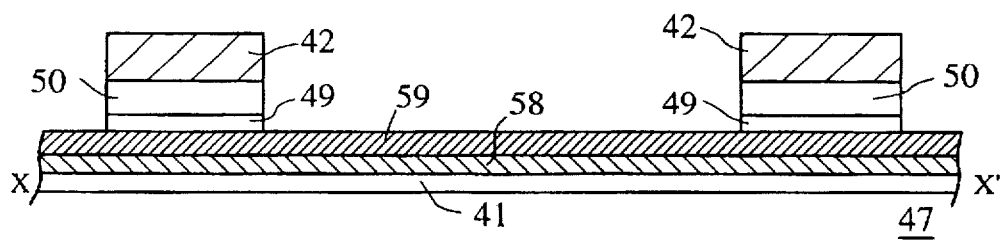
FIG. 34B is a sectional view of the TFT matrix device along the line X-X' in FIG. 34A.

On the entire of a drain bus line 41 of a transparent conductor film provided longitudinally on an insulating substrate 47, as shown in FIG. 34B, a first metal film 58 of, e.g., a 200 nm-thickness Cr film, and a third metal film 59 of a 200 nm-thickness Ni (nickel) film are uninterruptedly formed one on another in the stated order.

That is, the first metal film 58, the third metal film 59, an operational semiconductor layer 49 and a gate insulating film 50 are formed one on another in the stated order on the drain bus line 41 at its intersection with a gate bus line 42. The first metal film 58 and the third metal film 59 are formed one on another on the drain bus line 41 between its intersections with the gate bus lines 42. In this respect, this embodiment is different from the tenth embodiment, in which only the third metal film 57 is formed on the drain bus line 41 between its intersections with the gate bus lines 42.

Figure 34C:
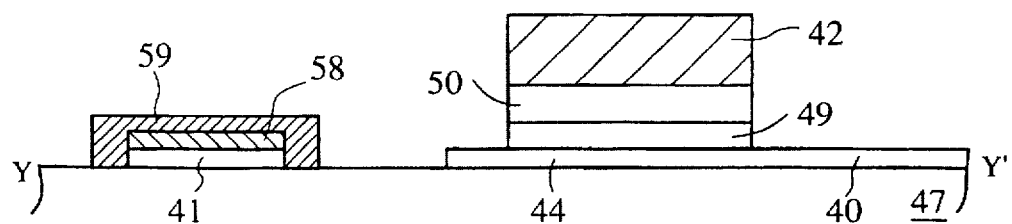
FIG. 34C is a sectional view of the TFT matrix device along the line Y-Y' in FIG. 34A.

As shown in FIG. 34C, the gate bus line 42 of a Cr gate film crosses the source electrode 44 of the TFT 43 through the operational semiconductor layer 49 and the gate insulating film 50 laid one on another. The first metal film 58 is formed on the drain bus line 41 connected to the drain electrode 45, and the surface of the first metal film 58 is coated with the third metal film 59.

Next, the method for fabricating the TFT matrix device of FIGS. 34A to 34C will be explained with reference to FIGS. 35A to 35F.

FIGS. 35A to 35E are sectional views of the TFT matrix device along the line Y-Y' in FIG. 34A in the respective step of the fabrication method. FIG. 35F is a sectional view of the TFT matrix device in the step of FIG. 35E along the line X-X' in FIG. 34A.

The transparent conductor film of a 50 nm-thickness ITO film, the first metal film 58 of a 200 nm-thickness Cr film are formed one on another on an insulating substrate 47 by sputtering, and then the laid films are patterned to form the picture element electrode 40, the source electrode 44, the drain electrode 45 and the drain bus line 41 of the transparent conductor film with the first metal film 58 on the upper surface thereof.

Figure 35A:
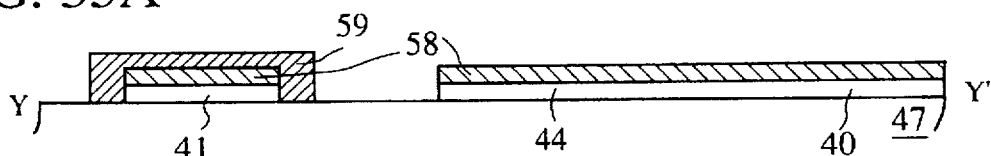
FIGS. 35A to 35E are sectional views of the TFT matrix device along the line Y-Y' in FIG. 34A in the respective step of the fabrication method.

The third metal film 59 of a 200 nm-thickness Ni film is electrodeposited above the drain bus line 41 in an electrolyte solution containing Ni ions with the drain bus line 41 of the TFT matrix device as the cathode and with a Ni plate as the anode to form the third metal film 59 on the first metal film 58 on the drain bus line 41 (FIG. 35A).

Figure 35B:
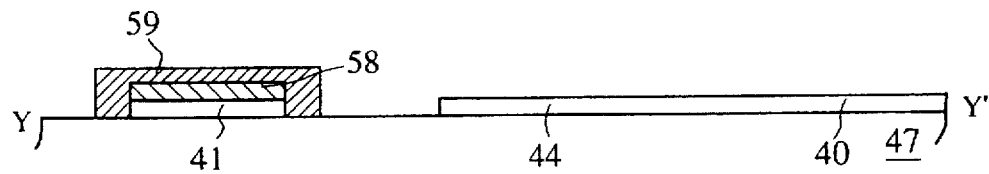

Then, with the third metal film 59 of the Ni film above the drain bus line 41 as a mask, the first metal film 58 of a Cr film is selectively etched. Thus the first metal film 58 on the picture element electrode 40 is etched off (FIG. 35B).

Figure 35C:
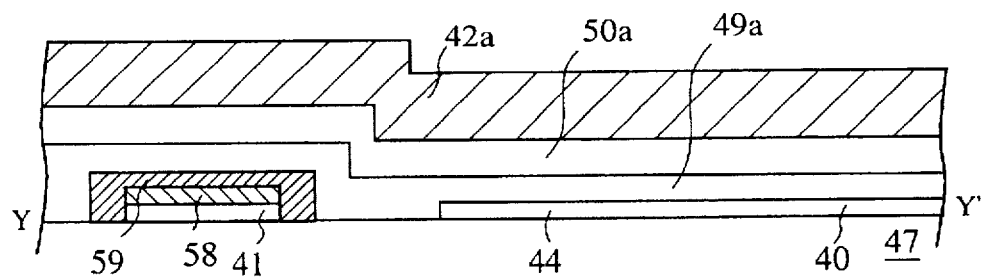

Then, a 30 nm-thickness amorphous silicon film 49a and a 400 nm-thickness SiN film 50a are formed on the entire surface one on another by P-CVD in the stated order, and a gate film 42a of a 200 nm-thickness Cr film is formed on the SiN film 50a (FIG. 35C).

Figure 35D:
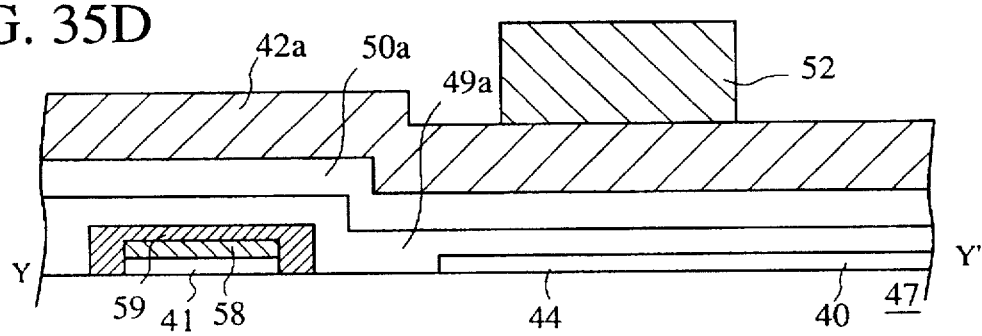

Subsequently a resist film 52 is formed on the entire surface, and the resist film 52 is patterned in a configuration of gate bus line including gate electrode (FIG. 35D).

Figure 35E:
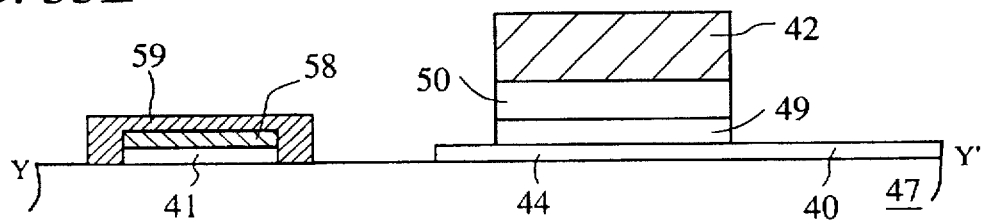
Figure 35F:
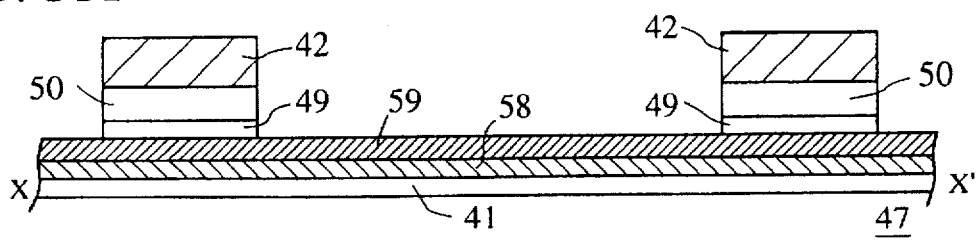
FIG. 35F is a sectional view of the TFT matrix device in the step of FIG. 35E along the line X-X' in FIG. 34A.

Then, with the patterned resist film 52 as a mask, the gate film 42a, the SiN film 50a, the amorphous silicon film 49a are selectively etched off to form the operational semiconductor layer 49 of the amorphous silicon film 49a, the gate insulating film 50 of the SiN film 50a, and the gate bus line 42 including the gate electrode of the gate film 42a, and the third metal film 59 above the drain bus line 41 is exposed (FIG. 35E).

Accordingly the first metal film 58 and the third metal film 59 uninterruptedly formed one on another on the entire drain bus line 41 and the surface of the third metal 59 is exposed (35F). Thus the TFT matrix device of FIGS. 34A to 34C is completed.

According to the method for fabricating the TFT matrix device according to the tenth embodiment, the third metal film 59 can be selectively formed on the first metal film 58 of the drain bus line 41 by electrodeposition in an electrolyte solution with the drain bus line 41 as the cathode. Accordingly the third metal film 59 can be formed by self alignment by the simple fabrication process without forming the resist film for forming the third metal film 59.

12. Twelfth Embodiment

The TFT matrix device according to a twelfth embodiment of this invention will be explained with reference to FIGS. 36A to 36C.

Figure 36A:
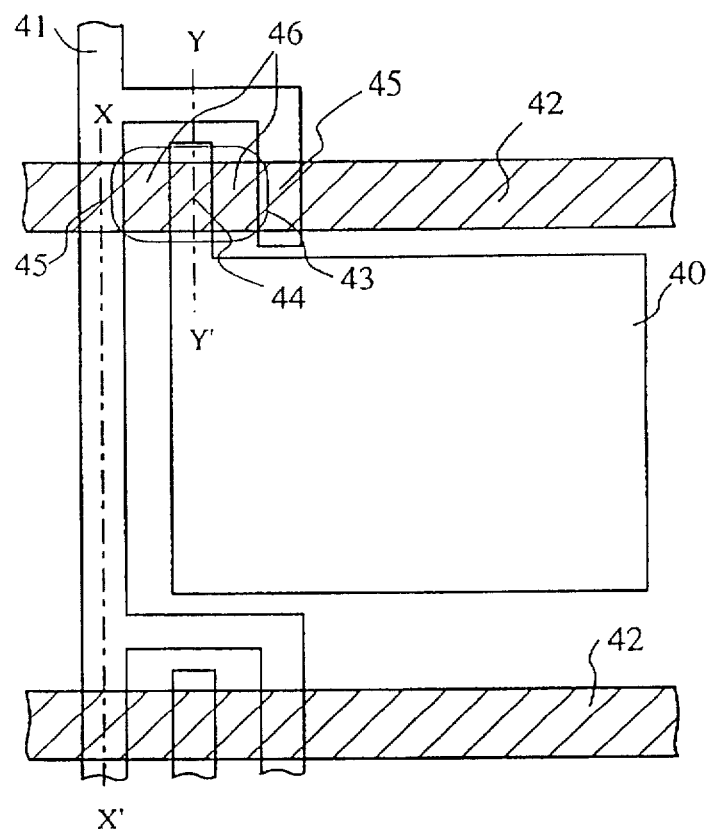
FIG. 36A is a plan view of the TFT matrix device according to the twelfth embodiment.

FIGS. 36A is a plan view of the TFT matrix device according to the twelfth embodiment. FIG. 36B is a sectional view of the TFT matrix device along the line X-X' in FIG. 36A. FIG. 36C is a sectional view of the TFT matrix device along the line Y-Y' in FIG. 36A.

Figure 36B:
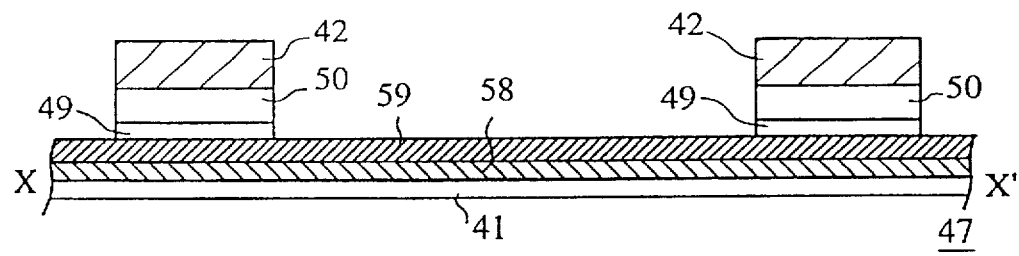
FIG. 36B is a sectional view of the TFT matrix device along the line X-X' in FIG. 36A.

The plan view of FIG. 36A and the sectional view along the line X-X' of FIG. 36B are the same as those of FIGS. 34A and 34B. Common members of the twelfth embodiment with the TFT matrix device of FIGS. 34A to 34C have the same reference numerals to omit or simplify their explanation.

Figure 36C:
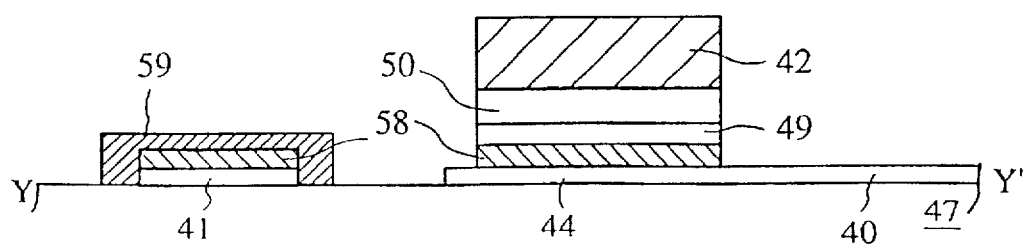
FIG. 36C is a sectional view of the TFT matrix device along the line Y-Y' in FIG. 36A.

As shown in FIG. 36C, the gate bus line 42 of a Cr gate film crosses the source electrode 44 of the TFT 43 through a first metal film 58, an operational semiconductor layer 49 and the gate insulating film 50 laid one on another. The first metal film 58 is formed on the drain bus line 41 connected to the drain electrode 45, and the surface of the first metal film 58 is coated with the third metal film 59.

Next, the method for fabricating the TFT matrix device of FIGS. 36A to 36C will be explained with reference to FIGS. 37A to 37E.

FIGS. 37A to 37D are sectional views of the TFT matrix device along the line Y-Y' in FIG. 36A in the respective steps of the fabrication method. FIG. 37E is the sectional view of the TFT matrix device in the step of FIG. 37D along the line X-X' in FIG. 36A.

The transparent conductor film of a 50 nm-thickness ITO film, the first metal film 58 of a 200 nm-thickness Cr film are formed one on another on an insulating substrate 47 by sputtering, and then the laid films are patterned to form the picture element electrode 40, the source electrode 44, the drain electrode 45 and the drain bus line 41 of the transparent conductor film with the first metal film 58 on the upper surface thereof.

Figure 37A:
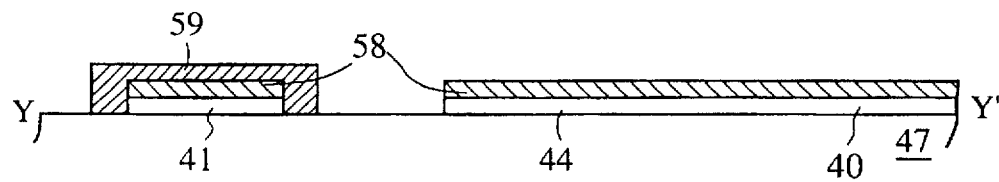
FIGS. 37A to 37D are sectional views of the TFT matrix device along the line Y-Y' in FIG. 36A in the respective steps of the fabrication method.

The third metal film 59 of a 200 nm-thickness Ni film is electrodeposited above the drain bus line 41 in an electrolyte solution containing Ni ions with the drain bus line 41 of the TFT matrix device as the cathode and with a Ni plate as the anode to form the third metal film 59 on the first metal film 58 on the drain bus line 41 (FIG. 37A). The step up to here is the same as the step of FIG. 35A.

Figure 37B:
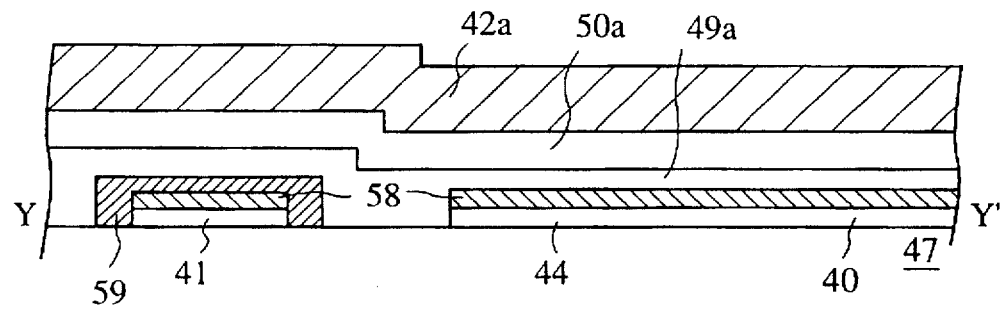

Then, a 30 nm-thickness amorphous silicon film 49a, and a 400 nm-thickness SiN film 50a are formed on the entire surface one on another in the stated order by P-CVD without selectively etching the first metal film 58 of a Cr film, and then a gate film 42a of a 200 nm-thickness Cr film is formed (FIG. 37B).

Figure 37C:
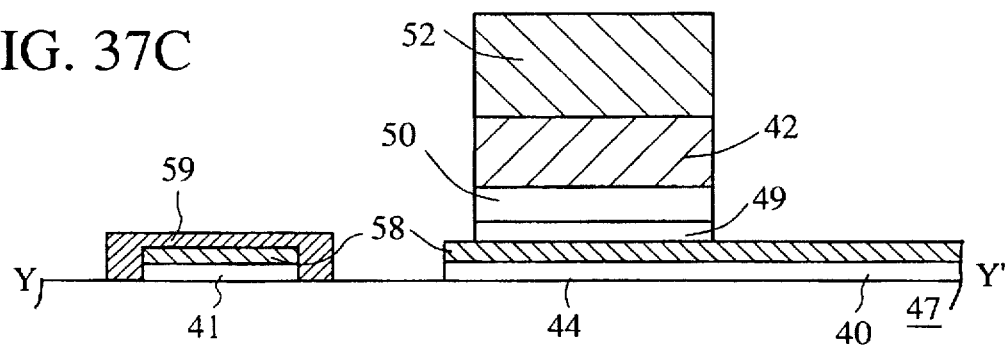

Then, with a resist film 52 on the gate film 42a patterned in a configuration of a gate bus line including the gate electrode as a mask, the gate film 42a, the SiN film 50A and the amorphous silicon film 49a are selectively etched off to form the operational semiconductor layer 49 of the amorphous silicon film 49a, the gate insulating film 50 of the SiN film 50a, and the gate bus line 42 including the gate electrode of the gate film 42a, and the third metal film 59 above the drain bus line 41 is exposed (FIG. 37C).

Figure 37D:
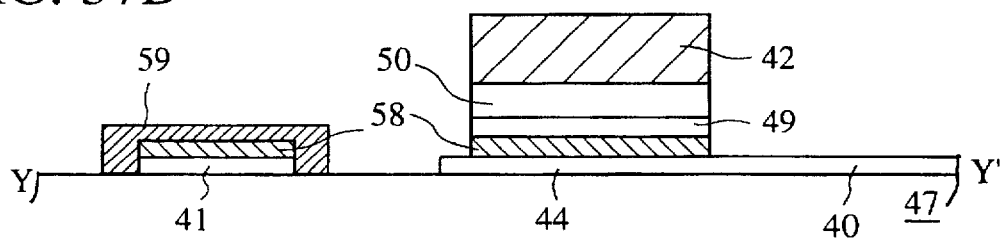
Figure 37E:
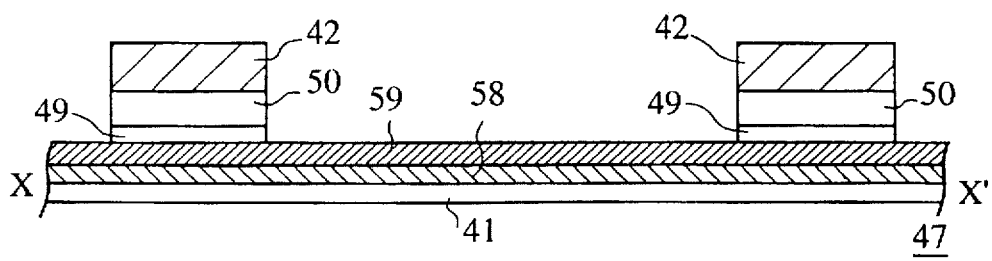
FIG. 37E is the sectional view of the TFT matrix device in the step of FIG. 35D along the line X-X' in FIG. 36A.

Then, with the resist film 52., and the metal film 59 of the Ni film as a mask, the first metal film 58 of the Cr film is etched off. Thus, the first metal film 58 on the picture element electrode 40 is etched off (FIG. 37D).

At this time, the first metal film 58 and the third metal film 59 laid one on another uninterruptedly on the entire drain bus line 41 and the surface of the third metal film 59 is exposed (FIG. 37E). Thus the TFT matrix device of FIGS. 36A to 36C is completed.

Thus according to the twelfth embodiment, the first metal film 58 and the third metal film 59 are formed uninterrupted on the entire drain bus line 41 in the stated order, and accordingly the drain bus line region can have lower resistance values.

According to the method for fabricating the TFT matrix device according to the twelfth embodiment, the third metal film 59 can be selectively formed on the first metal film 58 on the drain bus line by self alignment in the simple formation process. Accordingly it is not necessary to form a resist film for forming the third metal film 59.

In the first to the seventh to the twelfth embodiments, the structure in which the operational semiconductor layer 49 of an amorphous silicon film is directly formed on the source electrode 44 and the drain electrode 45, and the methods for fabricating the structure have been described. But from the viewpoint of characteristics of the TFT 43, it is preferred that source electrode contact layer and a drain electrode contact layer heavily doped with a Group V impurity, e.g., P (phosphorus) or others, or a Group III impurity, e.g., B (boron) are formed between the operational semiconductor layer 49, and the source electrode 44 and the drain electrode 45.

In a method, for example, which is applicable to this case, the source electrode 44 and the drain electrode 45 are formed, the whole is treated in plasma containing $PH_3$ (phosphine) gas, and subsequently the amorphous film 49 is formed, whereby a source electrode contact layer and a drain electrode contact layer of $n^+$-amorphous silicon film heavily containing P are selectively formed on the source electrode 44 and the drain electrode 45.

13. Thirteenth Embodiment

The TFT matrix device according to a thirteenth embodiment of this invention will be explained with reference to FIGS. 38A and 38B.

Figure 38A:
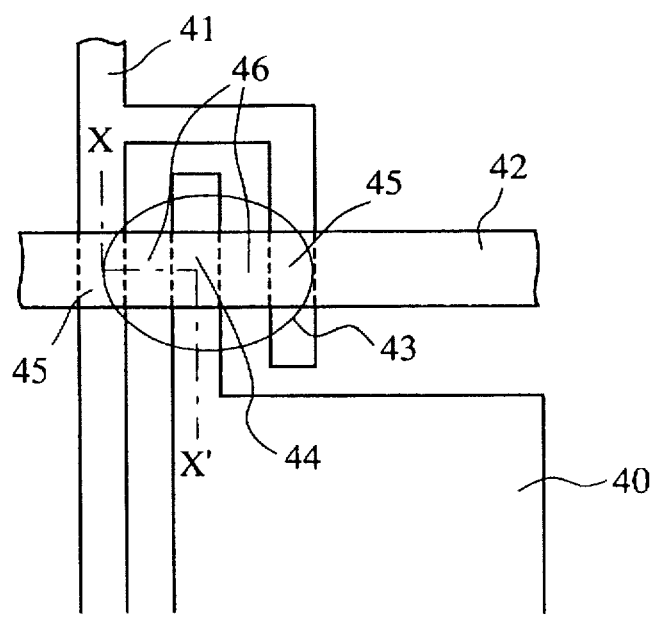
FIG. 38A is a plan view of the TFT matrix device according to a thirteenth embodiment of this invention.

FIG. 38A is a plan view of the TFT matrix device according to a thirteenth embodiment of this invention. FIG. 38B is a sectional view of the TFT matrix device along the line X-X' in FIG. 38A. Common members of the thirteenth embodiment with the TFT matrix device of FIGS. 34A to 34C have the same reference numerals to omit or simplify their explanation.

The plan view of FIG. 38a is the same as that of FIG. 34A.

Figure 38B:
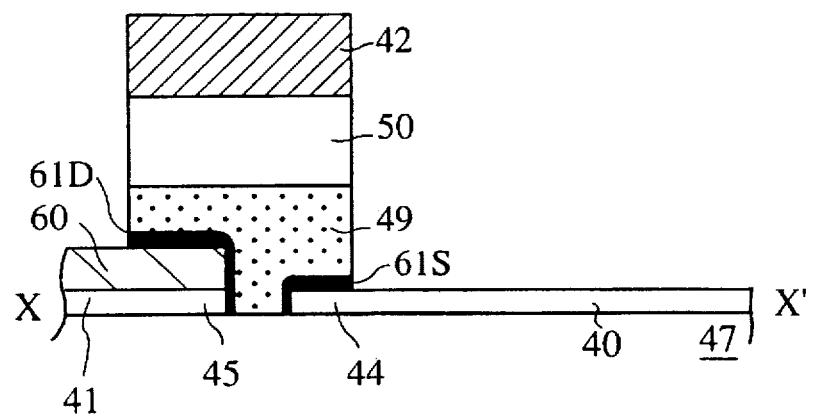
FIG. 38B is a sectional view of the TFT matrix device along the line X-X' in FIG. 38A.

As shown in FIG. 38B, in the TFT 43 of this embodiment, a source electrode 44 and a drain electrode 45 of, e.g., a 50 nm-thickness ITO transparent conductor film are formed opposed to each other on an insulating substrate 47. The source electrode 44 and the drain electrode 45 are respectively connected to the picture element 40 and the drain bus line 41 of the transparent conductor film. A first metal film 60 of a 150 nm-thickness Cr film is formed on the drain electrode 45 and the drain bus line 41.

A source electrode contact layer 61S and a drain electrode contact layer 61D of an about 30 nm-thickness $n^+$-amorphous silicon film doped with P-impurity are formed on the first metal film 60 on the drain electrode 45, and on the ITO transparent conductor film of the source electrode 44.

An operational semiconductor layer 49 of an about 50 nm-thickness amorphous silicon film is formed on that part of the transparent insulating substrate 47 between the source electrode 44 and the drain electrode 45 and on the source electrode contact layer 61S and the drain electrode contact layer 61D. The operational semiconductor layer 49 is ohmic contact with the source electrode 44 and the drain electrode 45 respectively through the source electrode contact layer 61S and the drain electrode contact layer 61D.

On the operational semiconductor layer 50 there is formed a gate electrode 42 of an about 200 nm-thickness Al film through a gate insulating film 50 of an about 300 nm-thickness SiN film.

Next, the method for fabricating the TFT matrix device of FIGS. 38A and 38B will be explained with reference to FIGS. 39A to 40.

Figure 39A:
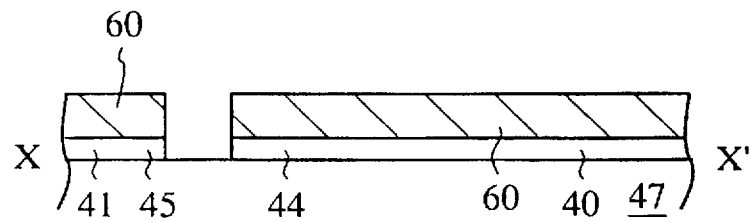
FIGS. 39A to 39C are sectional views of the TFT matrix device along the line X-X' in FIG. 38A in the steps of the fabrication method.
Figure 39B:
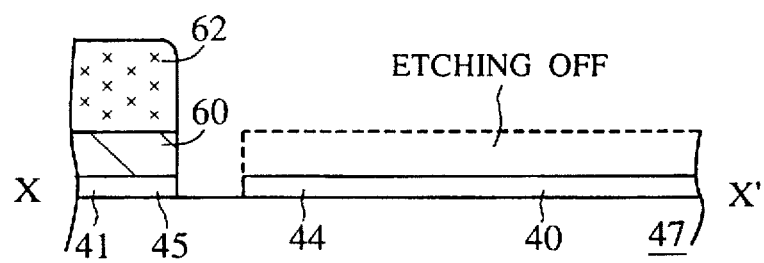
Figure 39C:
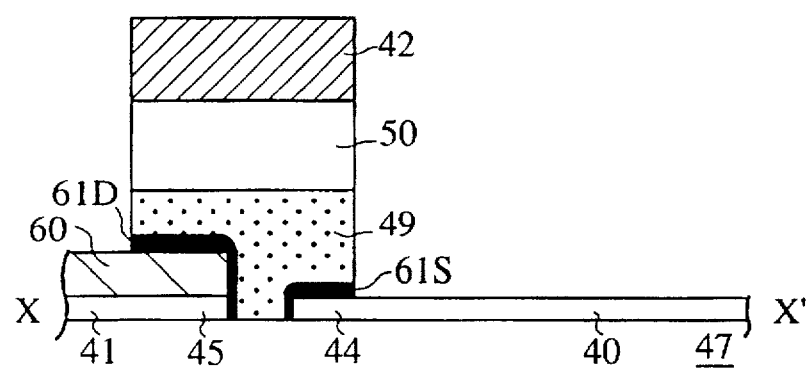

FIGS. 39A to 39C are sectional views of the TFT matrix device along the line X-X' in FIG. 38A in the steps of the fabrication method. FIG. 40 is a explanatory view of a major part of an electrodeposition apparatus used in a forming the protecting film.

First, a transparent conductor film of, e.g., a 50 nm-thickness ITO film, and a first metal film 60 of a 150 nm-thickness Cr film are formed one on another on an insulating substrate 47 by sputtering. Then, the laid films are patterned to form the picture electrode 40, the source electrode 44, the drain electrode 45 and the drain bus line 41 of the transparent conductor film with the first metal film 60 on the upper surface thereof (FIG. 39A).

Then, the first metal film 60 on the drain bus line 41 is selectively coated with an about 1 μm-thickness electrodeposited resist film 62 by electrodeposition. Then, after a baking at about 80° C., ultraviolet rays are applied to the electrodeposited resist film 62 to harden the same (FIG. 39B).

Then, with the hardened electrodeposited resist film 62 as a mask, the first metal film 60 is etched. Thus the first metal film 60 on the picture element electrode 40 and the source electrode 44 are selectively etched off, and the picture element electrode region is made transparent (FIG. 39B).

Subsequently the removal of the electrodeposited resist film 62 on the drain bus line 41 is followed by the selective formation of the about 30 nm-thickness $n^+$-amorphous silicon film doped with P-impurity on the picture element electrode 40 and the source electrode 44, and on the first metal film 60 on the drain electrode 45 and the drain bus line 41. Then, the about 50 nm-thickness amorphous silicon film and the about 300 nm-thickness SiN film are formed by P-CVD on the entire surface. Furthermore, the about 200 nm-thickness Al film is formed by sputtering on the SiN film.

Then, the Al film, the SiN film, the amorphous silicon film and the $n^+$-amorphous silicon film are sequentially etched off by the usual lithography with a resist film (not shown) patterned in a configuration of gate bus line including gate electrode to the source electrode contact layer 61S and the drain electrode contact layer 61D of the $n^+$-amorphous silicon film, the operational semiconductor layer 49 of the amorphous silicon film, the gate insulating film 50 of the SiN film, and the gate bus line 42 including the gate electrode of the Al film (FIG. 39C). Thus the TFT matrix device of FIGS. 38A to 38C is completed.

The electrodeposition used in the step of FIG. 39B will be explained with reference to FIG. 40.

The insulating substrate 47 is immersed into an electrodeposition resist liquid (OLIGO ED-UV made by Nippon Petrochemicals Co. Ltd.) 64 held in a vessel 63, and is opposed to a cathode plate 65 also immersed in the electrodeposition resist liquid 64. Then, a 5 d.c. voltage is applied to the drain bus line 41 on the insulating substrate 47 as the anode for 20 seconds, and an about 1 μm-thickness electrodeposited resist film 62 is selectively formed on the first metal film 60 on the drain bus line 41.

Thus, according to the thirteenth embodiment, the first metal film 60 is uninterruptedly formed on the entire drain bus line 41. Accordingly the drain bus line region can have lower resistance values.

According to the method for fabricating the TFT matrix device according to the thirteenth embodiment, the electrodeposited resist film 62 for masking the drain bus line 41 and the first metal film 60 thereon is formed by self alignment. Accordingly it is not necessary to allow a margin for the mask matching, and an area for the picture element electrode 40 can be large with higher opening ratios.

In the step shown in FIG. 39B, the first metal film 60 on the drain bus line 41 may be selectively coated with an anodic oxidation film by anodic oxidation, which is explained in FIG. 15, in place of the electrodeposited resist film 62.

14. Fourteenth Embodiment

The TFT matrix device according to a fourteenth embodiment of this invention will be explained with reference to FIGS. 41A and 41B.

Figure 41A:
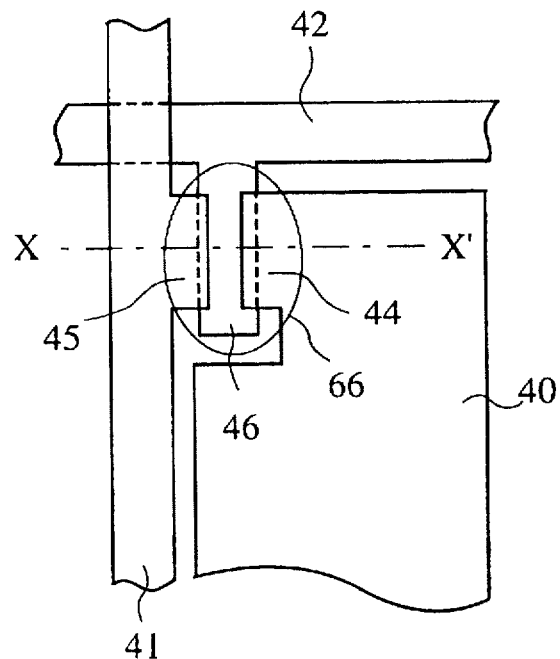
FIG. 41A is the plan view of the TFT matrix device according to the fourteenth embodiment.
Figure 41B:
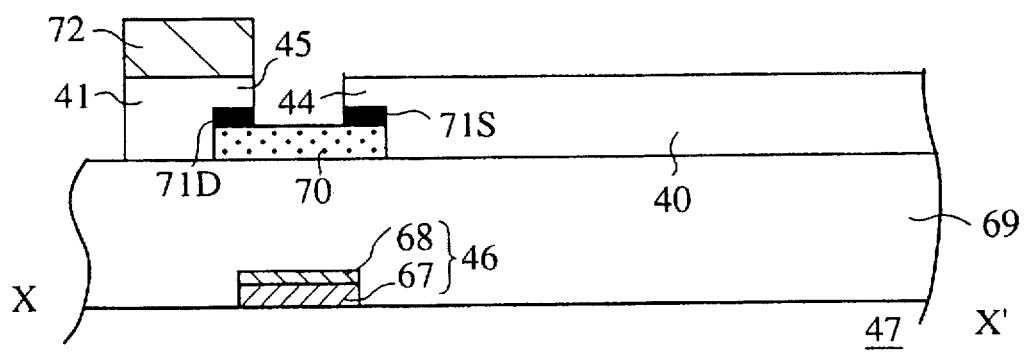
FIG. 41B is a sectional view of the TFT matrix device along the line X-X' in FIG. 41A.

FIG. 41A is the plan view of the TFT matrix device according to the fourteenth embodiment. FIG. 41B is a sectional view of the TFT matrix device along the line X-X' in FIG. 41A.

A plurality of picture element electrodes 40 are arranged in a matrix. As shown in FIG. 41A, drain bus lines 41 are provided between the picture element electrodes 40, and gate bus lines 42 are provided laterally between the picture element electrodes 40. An inverse staggered TFT 66 is provided at each of intersection between the drain bus lines 41 and the gate bus lines 42.

The gate electrode 46 of the inverse staggered TFT 66 is formed projected from the gate bus line 42. The source electrode 44 and the drain electrode 45 of the TFT 66 are formed above the gate electrode 46, as a projection from the picture element electrode 40 and a projection from the drain bus line 41, which are opposed to each other.

In the inverse staggered TFT 66, as shown in FIG. 41, the gate electrode 46 and a gate bus line 42 of an about 100 nm-thickness Al film 67 and an about 50 nm-thickness Ti (titanium) film 68 formed one on another in the stated order are formed on an insulating substrate 47 of, e.g., a glass substrate. An operational semiconductor layer 70 of an about 100 nm-thickness amorphous silicon film is formed on the gate electrode 46 through a gate insulating film 69 of an about 300 nm-thickness SiN film.

The operational semiconductor layer 70 is in ohmic contact with the source electrode 44 and the drain electrode 45 of, e.g., an about 150 nm-thickness ITO transparent conductor film through the source electrode contact layer 71S and the drain electrode contact layer 71D of an about 30 nm-thickness $n^+$-amorphous silicon film dosed with P-impurity.

The source electrode 44 and the drain electrode 45 are respectively connected to the picture element electrode 40 and the drain bus line 41 of the transparent conductor film. A first metal film 72 of an about 150 nm-thickness Cr film are formed on the drain electrode 45 and the drain bus line 41.

Next, the method for fabricating the TFT matrix device of FIGS. 41A and 41B will be explained with reference to FIGS. 42A to 42C.

Figure 42A:
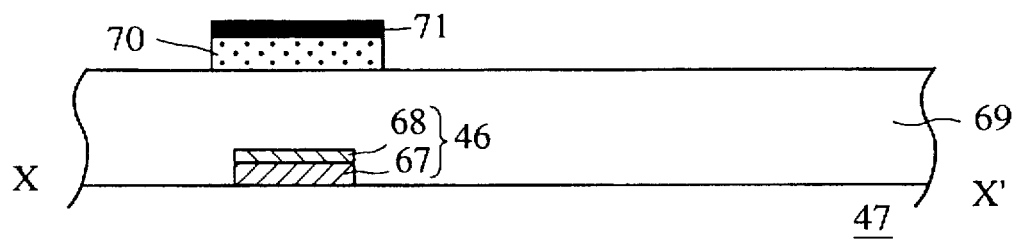
FIGS. 42A to 42C are sectional views of the TFT matrix device along the line X-X' in FIG. 41A in the respective steps of the fabrication method.
Figure 42B:
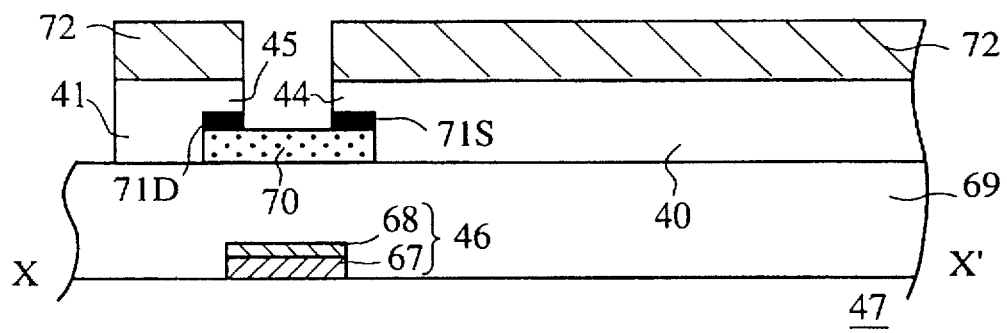
Figure 42C:
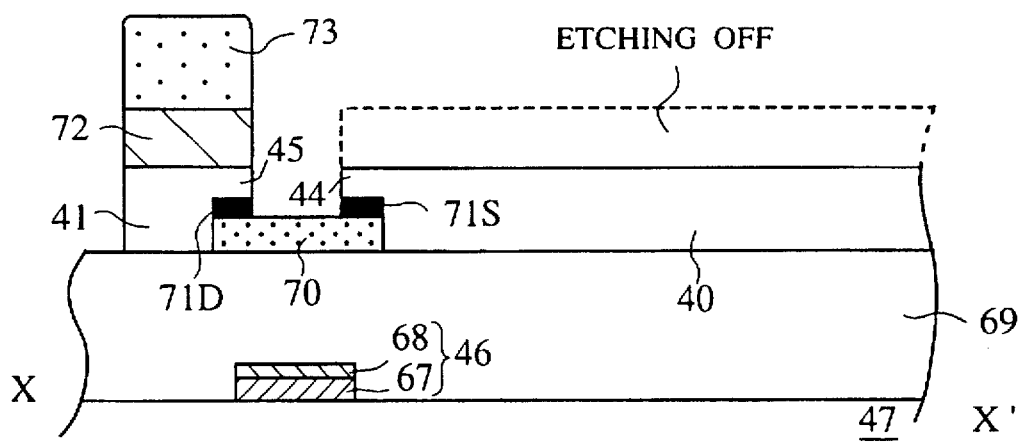

FIGS. 42A to 42C are sectional views of the TFT matrix device along the line X-X' in FIG. 41A in the respective steps of the fabrication method.

First, an about 100 nm-thickness Al film 67 and an about 50 nm-thickness Ti film 68 are formed one on another in the sated order on an insulating substrate 47 by sputtering. Then, these laid films are patterned to form the gate electrode 46 and the gate bus line 42 of the laid Al film 67 and the Ti film 68.

Subsequently the gate insulating film 69 of the 300 nm-thickness SiN film, the about 100 nm-thickness amorphous silicon film, the about 30 nm-thickness P-impurity-doped $n^+$-amorphous silicon film 71 are formed continuously in the stated order by P-CVD, and then the $n^+$-amorphous silicon film 71 and the amorphous silicon film are patterned by the usual lithography to divide the operational semiconductor layer 70 of the amorphous silicon film into devices (FIG. 42A).

Then, the transparent conductor layer of the about 150 nm-thickness ITO film, and the first metal film. 72 of the about 150 nm-thickness Cr film are formed one on another in the stated order. Then, these laid films, and the $n^+$-amorphous silicon film 71 are patterned to form the picture element electrode 40, the source electrode 44, the drain electrode 45, and the drain bus line 41 of the transparent conductor film with the first metal film 72 on the upper surface thereof, and a source electrode contact layer 71S and a drain electrode contact layer 71D of the $n^+$-amorphous silicon film 71 are formed (FIG. 42B).

Figure 40:
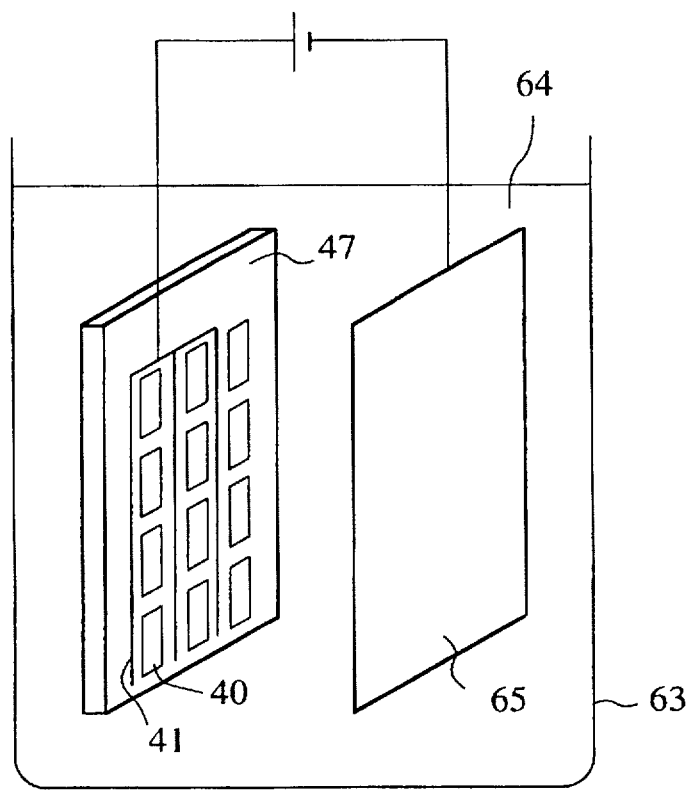
FIG. 40 is a explanatory view of a major part of the electrodeposition apparatus to be used in forming the protecting film.

Then, by the processing of FIG. 40, the insulating substrate 47 is immersed in an electrolyte resist liquid, a 5 d.c.

voltage is applied for about 20 seconds with the drain bus line 41 as the anode, and an about 1 μm-thickness electrodeposited resist film 73 is formed on the first metal film 72 on the drain bus line 41. Then, after a baking at about 80° C., ultraviolet rays are applied to the electrodeposited resist film 73 to harden the same (FIG. 42C).

Then, with the hardened electrodeposited resist film 73 as a mask, the first metal film 72 of the Cr film is etched. Thus, the first metal film 60 on the picture element electrode 40 and the source electrode 44 is selectively etched off to make the picture element electrode region transparent (FIG. 42C). Then, the electrodeposited resist film 73 above the drain bus line 41 is removed, and the TFT matrix device of FIGS. 41A and 41B are completed.

According to the fourteenth embodiment, in the TFT matrix device using inverse staggered TFTs 66 as well, since the first meal film 72 is formed uninterruptedly on the entire drain bus line 41, the drain bus line region can have lower resistance values.

According to the method for fabricating the TFT matrix device according to the fourteenth embodiment, the electrodeposited resist film 73 for masking the drain bus line 41 and the first metal film 72 thereon is formed by self alignment, it is not necessary to allow a margin for the mask matching, and thus the picture element electrode 40 can have a larger area with increased opening ratios.

15. Fifteenth Embodiment

The TFT matrix device according to a fifteenth embodiment of this invention will be explained with reference to FIGS. 43A and 43B.

Figure 43A:
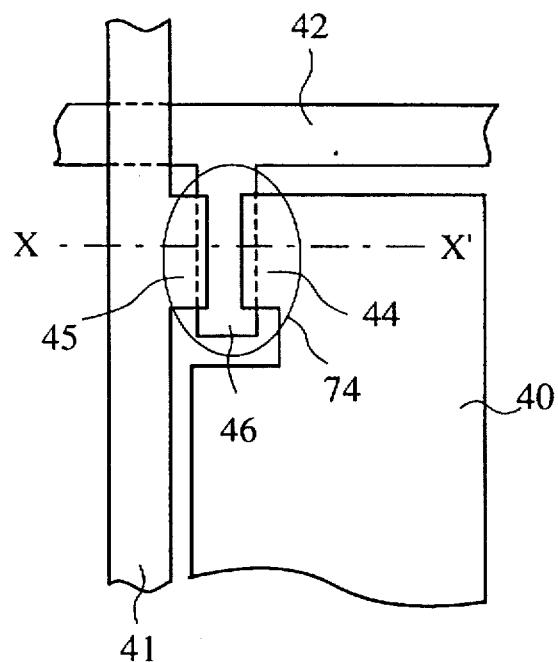
FIG. 43A is the plan view of the TFT matrix device according to the fifteenth embodiment.

FIG. 43A is the plan view of the TFT matrix device according to the fifteenth embodiment. FIG. 43B is a sectional view of the TFT matrix device along the line X-X' in FIG. 43A. Common members of the fifteenth embodiment with the TFT matrix device of FIGS. 41A and 41B have the same reference numerals of those of the latter to omit or simplify their explanation.

A plurality of picture element electrodes 40 are arranged in a matrix. As shown in FIG. 43A, drain bus lines 41 are provided longitudinally between the picture element electrodes 40, and gate bus lines 42 are provided laterally between the picture element electrodes 40. A channel etching stopper-type inverse staggered TFT 74 is provided at each of the intersections between the drain bus lines 41 and the gate bus lines 42.

Figure 43B:
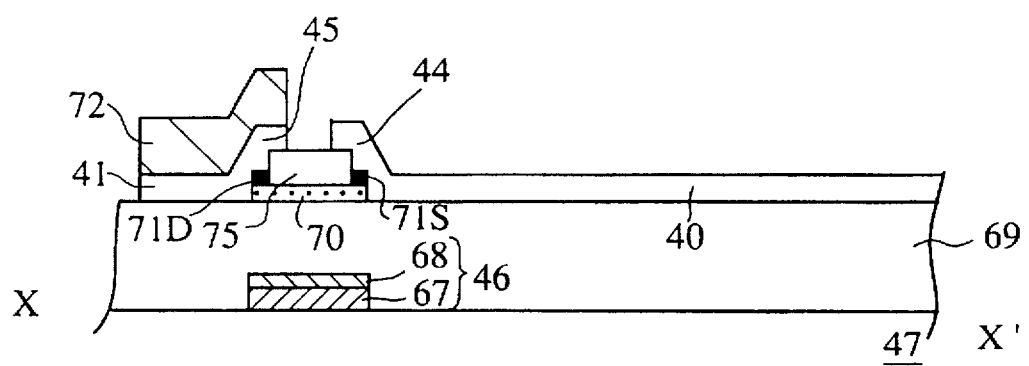
FIG. 43B is a sectional view of the TFT matrix device along the line X-X' in FIG. 43A.

As shown in FIG. 43B, in the channel etching stopper-type inverse staggered TFT 74, the gate electrode 46 and the gate bus line 42 are formed on an insulating substrate 47, and an operational semiconductor layer 70 is formed on the gate electrode 46 through a gate insulating film 69. A channel etching stopper layer 75 of an about 100 nm-thickness SiN film is formed on the operational semiconductor layer 70.

A source electrode contact layer 71S and a drain electrode contact layer 71D are formed on the operational semiconductor layer 70 on both sides of the channel etching stopper layer 75, and the operational semiconductor layer 70 is ohmic contact respectively with the source electrode 44 and the drain electrode 45 through the source electrode contact layer 71S and the drain electrode contact layer 71D.

The source electrode 44 and the drain electrode 45 are connected respectively to the picture element electrode 40 and the drain bus line 41. A first metal film 72 is formed on the drain bus line.

Next, the method for fabricating the TFT matrix device of FIGS. 43A and 43B will be explained with reference to FIGS. 44A to 44D.

FIGS. 44A to 44D are sectional views of the TFT matrix device along the line X-X' in FIG. 43A in the respective steps of the fabrication method.

First, the gate electrode 46 and the gate bus line 42 of the laid Al film 67 and the Ti film 68 one on another is formed on the insulating substrate. 47.

Subsequently the gate insulating film 69 of the SiN film, the amorphous silicon film 70a, the channel etching stopper layer 75 of the SiN film of about an 100 nm are continuously formed in the stated order by P-CVD.

Figure 44A:
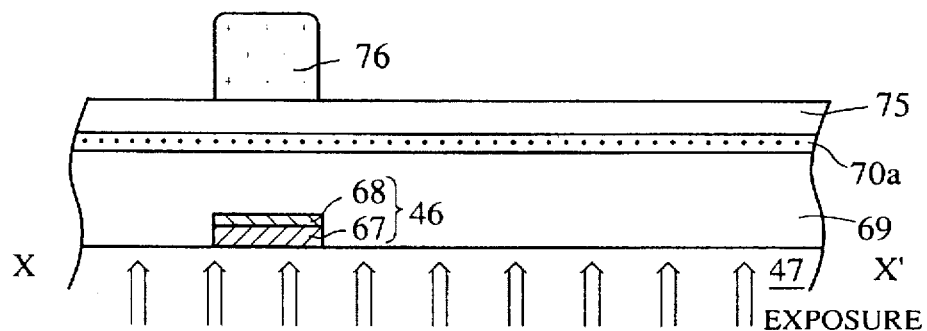
FIGS. 44A to 44D are sectional views of the TFT matrix device along the line X-X' in FIG. 43A in the respective steps of the fabrication method.

Then, a positive resist film 76 is exposed from the back side of the insulating substrate 47 to pattern the positive resist film 76 in a configuration of gate electrode and gate bus line by self alignment (FIG. 44A).

Then, with the patterned resist film 76 with a mask, the channel etching stopper layer 76 is over-etched with an etchant liquid containing hydrogen fluoride. Thus, the channel etching stopper 75 is side-etched by 0.5–1.0 μm from the side edges of the resist film 76.

Figure 44B:
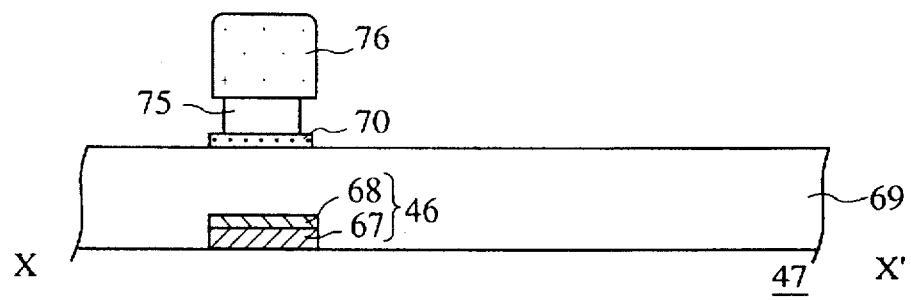

Then, the amorphous silicon film 70a is anisotropically etched with the resist film 76 as a mask by RIE using $CHF_3$ gas and $CF_4$ gas to form the operational semiconductor layer 70 of the amorphous silicon film 70a, and the devices are divided (FIG. 44B).

Subsequently after the resist film 76 is removed, the about 30 nm-thickness $n^+$-amorphous silicon film doped with P-impurity is selectively formed only on the exposed parts of the operational semiconductor layer 70 on both sides of the channel etching stopper layer 75 by P-CVD to form the source electrode contact layer 71S and the drain electrode contact layer 71D of the $n^+$-amorphous silicon film.

Then, the transparent conductor layer of an about 100 nm-thickness ITO film, and the first metal film 72 of the Cr film are formed one on another in the stated order by sputtering. Then, these laid films are patterned by the usual lithography to form the picture element electrode 40, the source electrode 44 and the drain electrode 45 and the drain bus line 41 of the transparent conductor film with the first metal film 72 thereon.

Figure 44C:
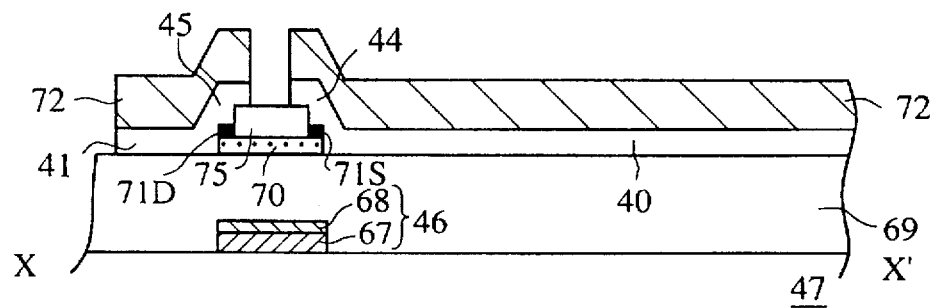

When the first metal film 72 and the transparent conductor film are patterned, the channel etching stopper layer 75 on the operational semiconductor layer 70 function as a protecting layer against the etching to protect the operational semiconductor layer 70 from damages due to the etching (FIG. 44C).

Figure 44D:
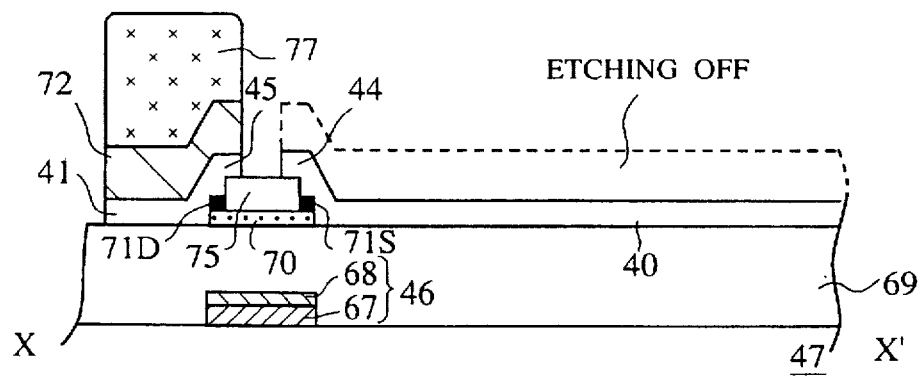

Then, by the electrodeposition of FIG. 40, the insulating substrate 47 is immersed in an electrodeposition resist liquid, 5 d.c. voltage is applied for about 20 seconds with the drain bus line 41 as the anode to selectively form the electrodeposited resist film 77 of an about 1 μm thickness on the first metal film 72 on the drain bus line 41. Then, after a baking at about 80° C., ultraviolet rays are applied to the electrodeposited resist film 77 to harden the same (FIG. 44D).

Subsequently the first metal film 72 of the Cr film is etched with the hardened electrodeposited resist film 77 as a mask. Thus, the first metal film 72 on the picture element electrode 40 and the source electrode 44 is selectively etched off to make the picture element electrode region transparent (FIG. 44D). Subsequently the electrodeposited resist film 77 above the drain bus line 41 is removed, and the TFT matrix device of FIGS. 43A and 43B are completed.

According to the fifteenth embodiment, even in a TFT matrix device using channel etching stopper-type inverse staggered TFTs 74, because of the first metal film 72 formed uninterruptedly on the entire drain bus line 41, the drain bus line region can have lower resistance values.

According to the method for fabricating the TFT matrix device of the fifteenth embodiment, since the electrodeposited resist film 77 for masking the drain bus line 41 and the first metal film 72 thereon is formed by self-alignment, it is not necessary to allow a margin for the mask matching, and accordingly the picture element electrode 40 can have a larger area with increased opening ratios.

16. Sixteenth Embodiment

The TFT matrix device according to a sixteenth embodiment of this invention will be explained with reference to FIGS. 45A and 45B.

Figure 45A:
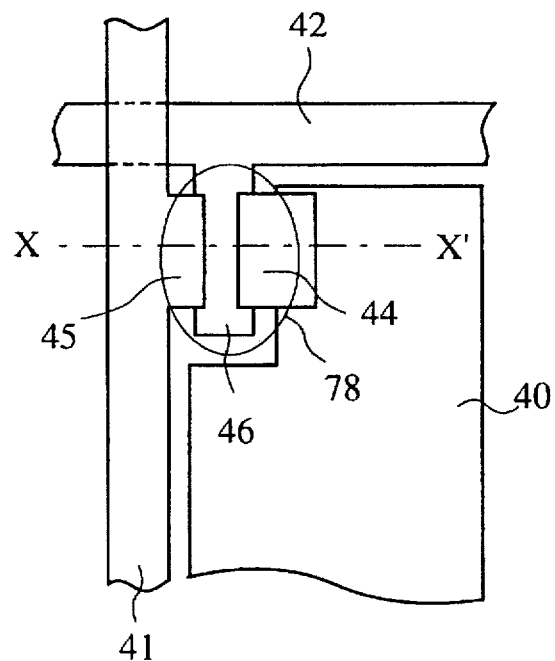
FIG. 45A is the plan view of the TFT matrix device according to the sixteenth embodiment.

FIG. 45A is the plan view of the TFT matrix device according to the sixteenth embodiment. FIG. 45B is a sectional view of the TFT matrix device along the line X-X' in FIG. 45A. Common members of the sixteenth embodiment with the TFT matrix device of FIG. 41 have the same reference numerals as those of the latter to omit or simplify their explanation.

A plurality of picture element electrodes 40 are arranged in a matrix. As shown in FIG. 45A, drain bus lines 41 are provided longitudinally between the picture element electrodes 41, and gate bus lines 42 are provided laterally between the picture element electrodes 40. An inverse staggered TFT 78 is provided at each of the intersections between the drain bus lines 41 and the gate bus lines A gate electrode 46 of the inverse staggered TFT 78 is formed projected from a gate bus line 42. The drain electrode 45 of the TFT 68 is formed in the form of projection from a drain bus line 41 above this gate electrode 46. The source electrode 44 of the TFT 68 is formed opposed to this drain electrode 45.

Figure 45B:
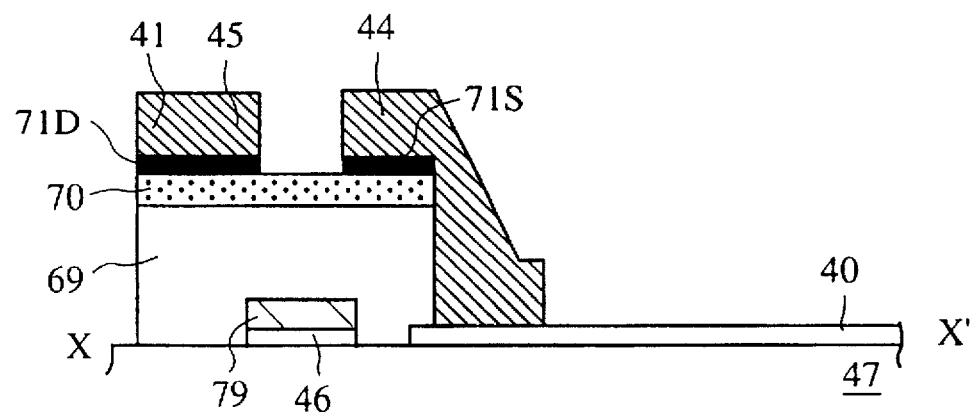
FIG. 45B is a sectional view of the TFT matrix device along the line X-X' in FIG. 45A.

As shown in FIG. 45B, in the inverse staggered TFT 78, the gate electrode 46 and the gate bus line 42 of transparent conductor film of an about 50 nm-thickness ITO film with a first metal film 79 of an about 150 nm-thickness Cr film on the upper surface thereof are formed on the insulating substrate 47. An operational semiconductor layer 70 of an about 100 nm-thickness amorphous silicon film is formed on the gate electrode 46 through a gate insulating film 69 of an about 300 nm-thickness SiN film.

The operational semiconductor layer 70 is ohmic contact with a source electrode 44 and the drain electrode 45 of an about 300 nm-thickness Mo film through a source electrode contact layer 71S and a drain electrode contact layer 71D of an about 30 nm-thickness P-impurity doped $n^+$-amorphous silicon film.

The source electrode 44 is connected to the picture element electrode 40 of the transparent conductor film, and the drain electrode 45 is connected to the drain bus line 41 of the Mo film.

Next, the method for fabricating the TFT matrix device of FIGS. 45A and 45B will be explained with reference to FIGS. 46A to 46C.

Figure 46A:
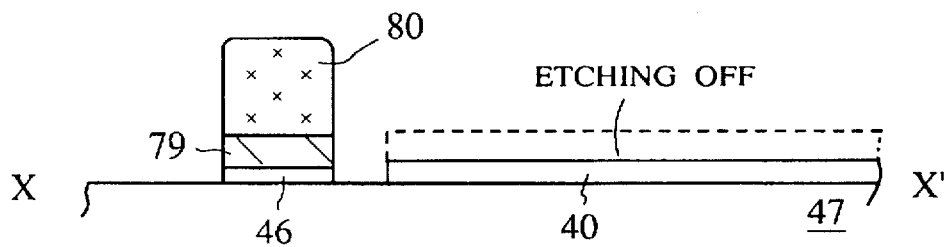
FIGS. 46A to 46C are sectional views of the TFT matrix device along the line X-X' in FIG. 46A in the respective steps of the fabrication method.

FIGS. 45A to 45C are sectional views of the TFT matrix device along the line X-X' in FIG. 46A in the respective steps of the fabrication method.

First, the transparent conductor film of the about 50 nm-thickness ITO film is formed on the insulating substrate 47 by sputtering. Then, the first metal film 79 of the about 150 nm-thickness Cr film is formed on the transparent conductor film.

Then, the laid first metal film 79 and the transparent conductor film are etched to form the picture element electrode 40, the gate electrode 46, the gate bus line 42 of the transparent conductor film with the first metal film 79 on the upper surface thereof.

Then, by electrodeposition, the first metal film 79 on the gate bus line 42 including the gate electrode 46 is selectively coated with an about 1 μm-thickness electrodeposited resist film 80, and after a baking at about 80° C., ultraviolet rays are applied to the electrodeposited resist film 80 to harden the same (FIG. 46A).

Then, with the hardened electrodeposited resist film 80 as a mask, the first metal film 79 of the Cr film is etched. Thus, the first metal film 79 on the picture element electrode 40 is selectively etched off, and the picture element electrode region is made transparent (FIG. 46A).

Then, after the resist film 80 above the gate bus line 42 is removed, the about 300 nm-thickness SiN film, the about 100 nm-thickness amorphous silicon film and the about 30 nm-thickness P-impurity doped $n^+$-amorphous silicon film are formed on the entire surface by P-CVD.

Figure 46B:
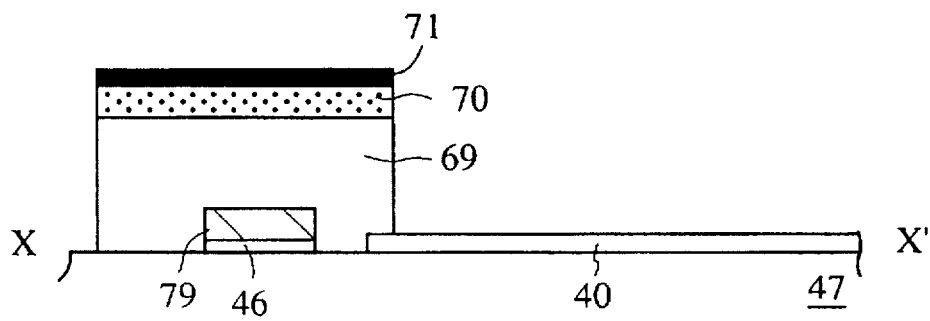
Figure 46C:
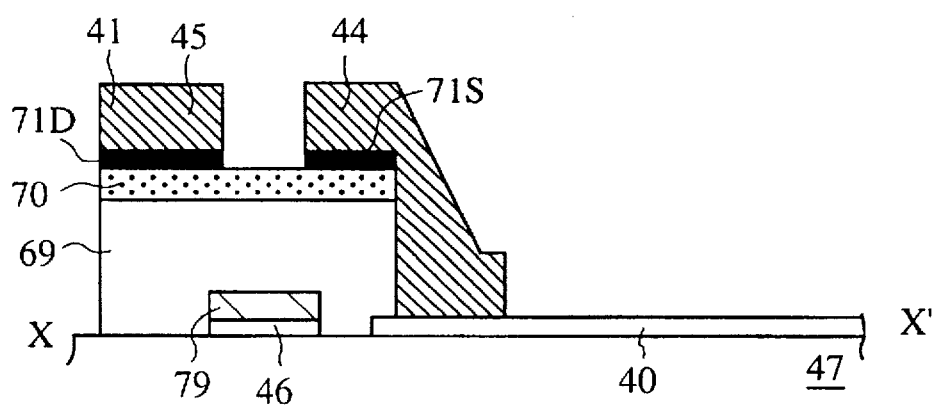

Subsequently, the SiN film, the amorphous silicon film, the $n^+$-amorphous silicon film are patterned in a set configuration by the usual lithography to form the gate insulating film 69 of the SiN film, the operational semiconductor layer 70 of the amorphous film, and the $n^+$-amorphous silicon contact layer 71, and the devices are separated (FIG. 46B).

Then, the about 300 nm-thickness Mo film is formed, and then the Mo film and the $n^+$-amorphous silicon contact layer 71 are patterned in a set configuration to form the drain electrode 45, the drain bus line 41 and the source electrode 44 of the Mo film, and the source electrode contact layer 71S and the drain electrode contact layer 71D of the $n^+$-amorphous silicon contact layer 71 are formed.

That is, the operational semiconductor layer 70 is connected to the source electrode 44 and the drain electrode 45 of the Mo film respectively through the source electrode contact layer 71S and the drain electrode contact layer 71D. The source electrode 44 is connected to the picture element electrode 40 of the transparent conductor film, and the drain electrode 45 is connected to the drain bus line 41 (FIG. 46C). Thus, the TFT matrix device of FIGS. 45A and 45B is completed.

According to the sixteenth embodiment, in a TFT matrix device using inverse staggered TFTs as active devices, since the first metal film 79 is uninterruptedly on the entire gate bus line 42, the gate bus line can have lower resistances.

According to the method for fabricating the sixteenth embodiment, since the electrodeposited resist film 80 for masking the gate bus line 42 is formed by self alignment, it is not necessary to allow a margin for the mask matching, and the picture element electrode region can have larger areas with increased opening ratios.

17. Seventeenth Embodiment

The TFT matrix device according to a seventeenth embodiment of this invention will be explained with reference to FIG. 47, and FIGS. 48A and 48B.

Figure 47:
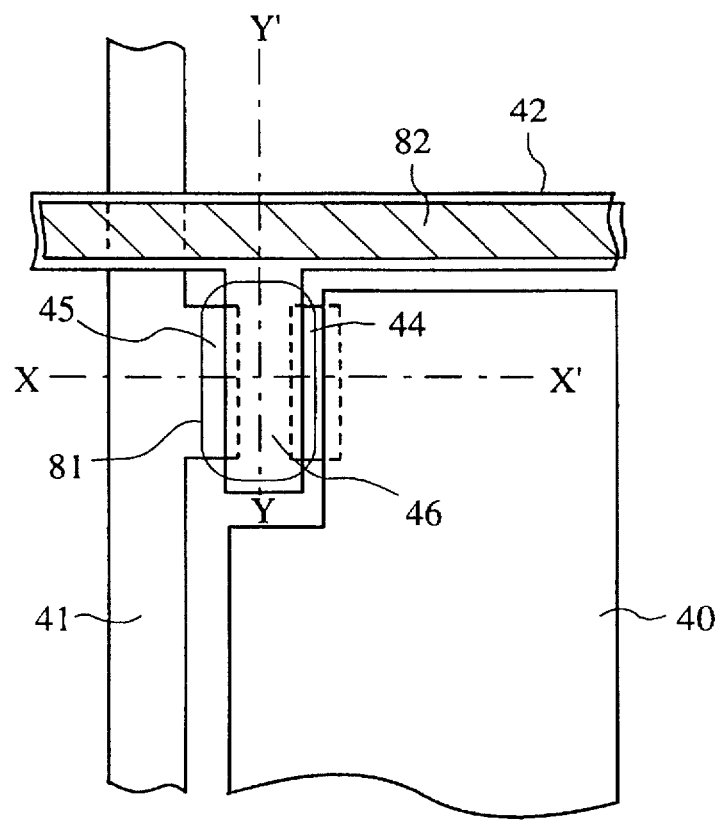
FIG. 47 is the plan view of the TFT matrix device according to a seventeenth embodiment.

FIG. 47 is the plan view of the TFT matrix device according to a seventeenth embodiment. FIG. 48A is a sectional view of the seventeenth embodiment along the line X-X' in FIG. 47. FIG. 48B is a sectional view of the seventeenth embodiment along the line Y-Y' in FIG. 47.

A plurality of picture element electrodes 40 are arranged in a matrix. As shown in FIG. 47, drain bus lines 41 are provided longitudinally between the picture element electrodes 40, and gate bus lines 42 are provided laterally between the picture element electrodes 40. A staggered TFT 81 as an active device is provided at each of the intersections between the drain bus lines 41 and the gate bus lines 42. A first metal film 82 of Mo film is formed on the gate bus lines through a transparent conductor film.

Figure 48A:
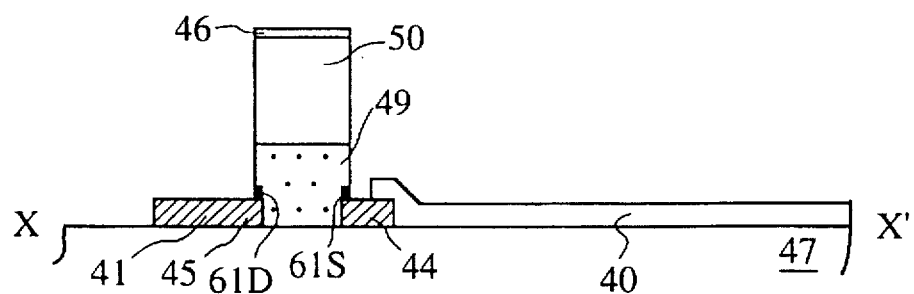
FIG. 48A is a sectional view of the seventeenth embodiment along the line X-X' in FIG. 47.

As shown in FIG. 48A, in the TFT 81, a source electrode 44 and a drain electrode 45 of an about 150 nm-thickness Cr film are formed opposed to each other on an insulating substrate 47. The picture element electrode 40 of an about 100 nm-thickness ITO film is formed in connection with the source electrode 44. The drain bus line 41 is connected to the drain electrode 45.

A source electrode contact layer 61S and a drain electrode contact layer 61D of about 30 nm-thickness n$^+$-amorphous silicon film of doped with P-impurity are formed on the source electrode 44 and the drain electrode 45.

An operational semiconductor layer 49 of an about 50 nm-thickness amorphous silicon film is formed on a part of the insulating substrate 47 between the source electrode 44 and the drain electrode 45, and on the source electrode contact layer 61S and the drain electrode contact layer 61D. The operational semiconductor layer 49 is ohmic contact with the source electrode 44 and the drain electrode 45 respectively through the source electrode contact layer 61S and the drain electrode contact layer 61D.

A gate electrode 46 of an about 50 nm-thickness n$^+$-polycrystal silicon film doped with P-impurity on the operational semiconductor layer 49 through a gate insulating film 50 of an about 300 nm-thickness SiN film.

Figure 48B:
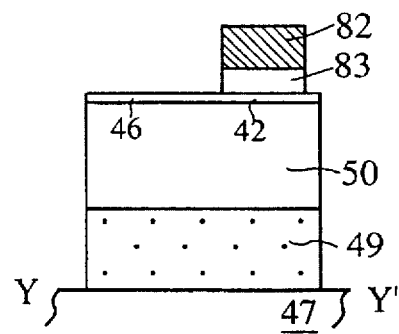
FIG. 48B is a sectional view of the seventeenth embodiment along the line Y-Y' in FIG. 47.

As shown in FIG. 48B, the gate bus line 42 of the TFT 81 is formed continuous with the gate electrode 46. A transparent conductor film 83 of an about 100 nm-thickness ITO film, and a first metal film 82 of an about 200 nm-thickness Mo film are formed on the gate bus line 42 in the stated order.

Next, the method for fabricating the TFT matrix device of FIG. 47 and FIGS. 48A and 48B will be explained with reference to FIGS. 49A1 and 49A2 to FIGS. 50B1 and 50B2.

FIGS. 49A1 and 49A2 to FIGS. 50B1 and 50B2 are sectional views of the TFT matrix device along the line X-X' and the line Y-Y' in FIG. 47 in the respective steps of the fabrication method.

The method for fabricating the TFT matrix according to the seventeenth embodiment, using staggered TFTs 81 as active devices are characterized in that a resist film is electrodeposited on the gate bus lines 42.

First, the about 150 nm-thickness Cr film is formed by sputtering on the insulating substrate 47. Then, the Cr film is patterned in a set configuration by the usual lithography to form the source electrode 44, the drain electrode 45 and the drain bus line 41 of the Cr film.

Subsequently, the about 30 nm-thickness P-impurity doped n$^+$-amorphous silicon film 61a is selectively deposited on the source electrode 44, the drain electrode 45 and the drain bus line 41 by P-CVD.

Then, the 50 nm-thickness amorphous silicon film 49a, and the about 300 nm-thickness SiN film 50a are formed by P-CVD, and then the about 50 nm-thickness P-impurity doped polycrystal silicon film 84 is formed by sputtering.

Then, a negative resist film 85 is spin-coated on the n$^+$-polycrystal silicon film 84. Then, using a photomask 86 opened in configurations of the gate electrode and the gate bus line, the resist film 85 is exposed from the front side of the insulating substrate 72, and the resist film 85 is exposed from the back side of the insulating substrate 72. The resist film 85 is patterned by self alignment into configurations of drain bus line and source electrode which are larger by an overlap width of 0.5–1 μm caused by intrusion of the exposed light (FIGS. 49A1 and 49A2).

Then, with the resist film 85 as a mask, the n$^+$-polycrystal silicon film 84, the SiN film 50A, the amorphous silicon film 49a and the n$^+$-amorphous silicon film 61a are sequentially etched off to form the source electrode contact layer 61S and the drain electrode contact layer 61D of the n$^+$-amorphous silicon film 61a, the operational semiconductor layer 49 of the amorphous silicon film 49a, the gate insulating film 50 of the SiN film 50a, and the gate electrode 46 and the gate bus line 42 of the n$^+$-polycrystal silicon film 84 (FIGS. 49B1 and 49B2).

Then, the transparent conductor film 83 of the about 100 nm-thickness ITO film, and the first metal film 82 of the about 200 nm-thickness Mo film are formed in the stated order by sputtering. Subsequently these laid films are patterned by the usual lithography to form the picture element electrode 40 of the transparent conductor film with the first metal film 82 on the upper surface thereof, and a laid film of the transparent conductor film 83 and the first metal film 82 on the gate bus line 42 (FIGS. 50A1 and 50A2).

Subsequently, the gate electrode 46, and the first metal film 82 on the gate bus line 42 are selectively coated with an about 1 μm-thickness electrodeposited resist film 87. Then, after a baking at 80° C., ultraviolet rays are applied to the electrodeposited resist film 87 to harden the same (FIGS. 50B1 and 50B2).

Then, with the hardened electrodeposited resist film 87 as a mask, the first metal film 82 of the Mo film is etched. Thus, the first metal film 82 on the picture element electrode 40 is selectively etched off to make the picture element electrode region transparent (FIGS. 50B1 and 50B2). Then, the electrodeposited resist film 87 on the gate electrode 46 and above the gate bus line 42 is removed, and the TFT matrix device of FIG. 47, and FIGS. 48A and 48B is completed.

According to the seventeenth embodiment, in the TFT matrix device using staggered TFTs 81 as active devices, since the transparent conductor film 83 and the first metal film 82 are uninterruptedly formed on the entire gate bus line 42, the gate bus line region can have lower resistance values.

According to the method for fabricating the TFT matrix device according to the seventeenth embodiment, since the electrodeposited resist film 87 for masking the gate bus line 42 is formed by self alignment, it is not necessary to allow a margin for the mask matching, and the picture element electrode region can have large areas with increased opening ratios.

Figure 51B:
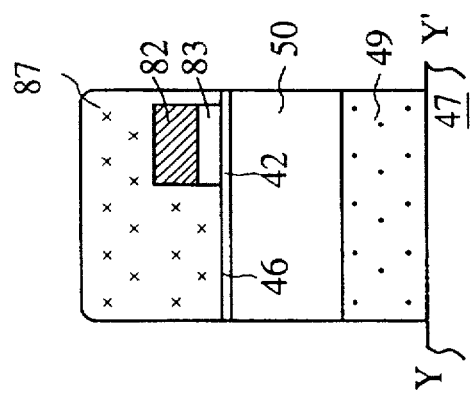
FIGS. 51A and 51B are sectional views of the TFT to explain the modification method of the seventeenth embodiment.
Figure 51A:
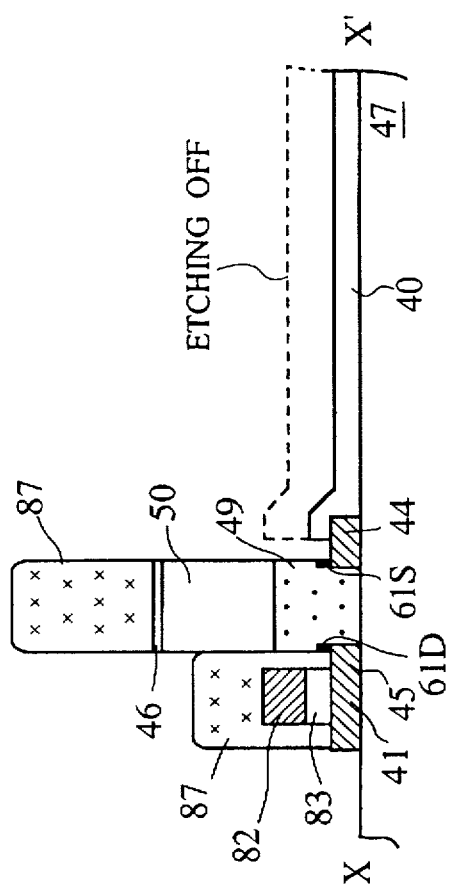

In the steps of the method for fabricating the sixteenth embodiment, which are shown in FIGS. 50A1 and 50A2, and FIGS. 50B1 and 50B2, in place of forming the transparent conductor film 83 and the first metal film 82 only on the gate bus line 42, the transparent conductor film 83 and the first metal film 82 may be formed not only on the gate bus line 42 but also on the drain bus line 41, as shown in FIGS. 51A and 51B. And then, the picture element electrode region can be made transparent by coating the first metal film 82 not only on the gate bus line 42 but also on the drain bus line 41 with the electrodeposited film 87, and by etching off the first metal film 82 on the picture element electrode 40 selectively with the electrodeposited resist film 87 as a mask (FIGS. 51A1 and 51A2).

The laid film of the transparent conductor film 83 and the first metal film 82 is thus formed on the part of the drain bus line 41 other than its intersection with the gate bus line 42, whereby the drain bus line 41 can be made less resistive, and the metal film 79 of the Cr film can be made thinner.

Figure 52A:
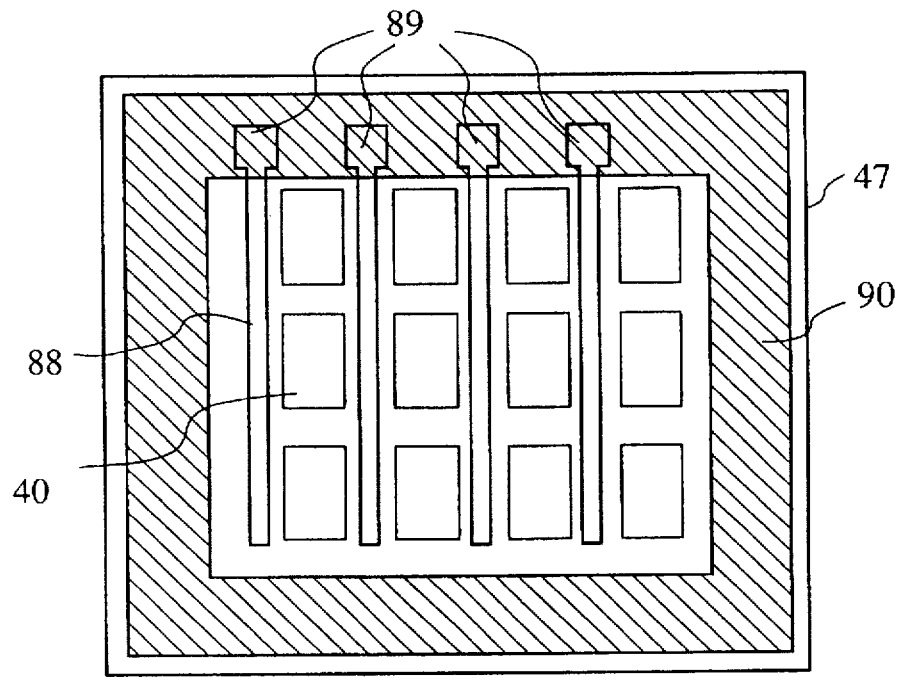
FIGS. 52A and 52B are sectional views of the TFT to explain the another modification method of the thirteenth to the seventeenth embodiment.
Figure 52B:
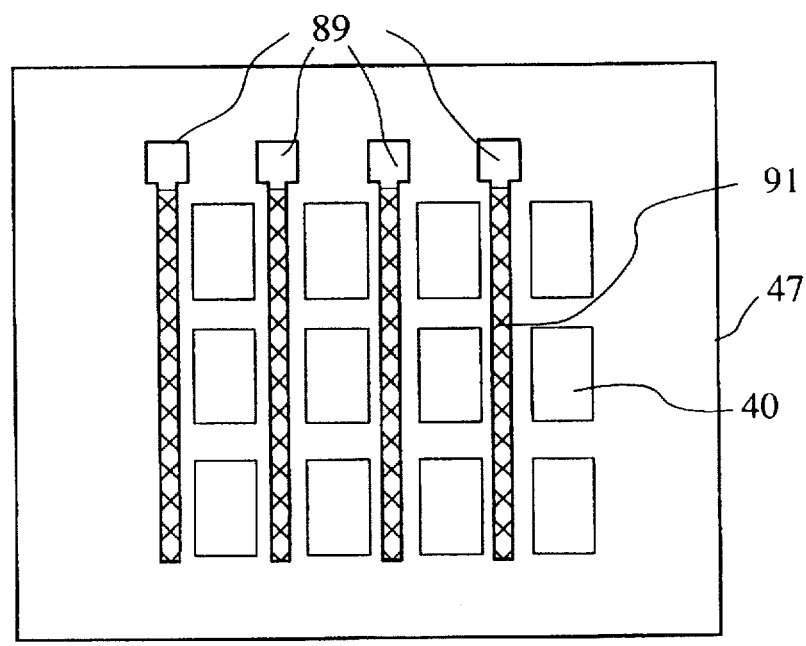

In the thirteenth to the seventeenth embodiments, the electrodeposited resist film is electrodeposited, then is baked and is irradiated with ultraviolet rays to be hardened. But it is possible that when ultraviolet rays are applied to the electrodeposited resist film 91 with a mask 90, as shown in FIG. 52B, to shield the bus line terminals 89 of the bus lines 88 composed of the drain bus lines 41 and/or gate bus lines 42, and then the electrodeposited resist film 91 is developed, whereby as shown in FIG. 52B, the electrodeposited resist film 91 on the bus line terminals 89 is removed to expose the transparent conductor ITO film as the bus line terminals 89.

18. Eighteenth Embodiment

Figure 53A:
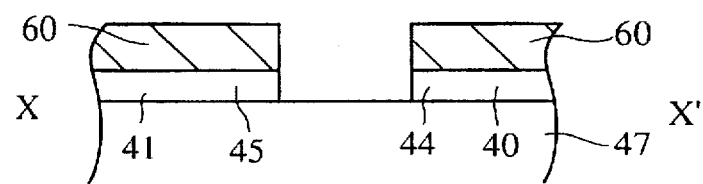
FIGS. 53A to 53D are sectional views of the TFT matrix device corresponding to the sectional views along the line X-X' of FIG. 38A in the respective steps of the fabrication method.

The method for fabricating the TFT matrix device according to an eighteenth embodiment of this invention will be explained with reference to FIGS. 53A and 55B.

As detailed in the above-described seventh to the seventeenth embodiments, by the use of the electrodeposited resist film, a number of the photomasks used in the photolithographic steps can be reduced, drain bus line resistances can be lowered, and areas of the display electrode patterns can be increased with higher opening ratios. But, depending on electrodeposition conditions, optimum resist films cannot be always formed. Here in the eighteenth embodiment, optimum electrodeposition conditions will be specifically discussed.

FIGS. 53A to 53D show the fabrication steps used in discussing electrodeposition conditions in this embodiment. These fabrication steps are the same as those for the TFT matrix device of FIGS. 39A to 39C. Accordingly FIGS. 53A to 53D correspond to the sectional views along the line X-X' of FIG. 38A.

First, a transparent conductor film of a 50 nm-film thickness ITO film, and a first metal film 60 of a 150 nm-film thickness Cr film are formed on an insulating substrate 47 by sputtering. Then, the laid films are patterned to form a picture element electrode 40, a source electrode 44, a drain electrode 45 and a drain bus line 41 of the transparent conductor film with the first metal film 60 on the upper surface thereof (FIG. 53A).

Figure 53B:
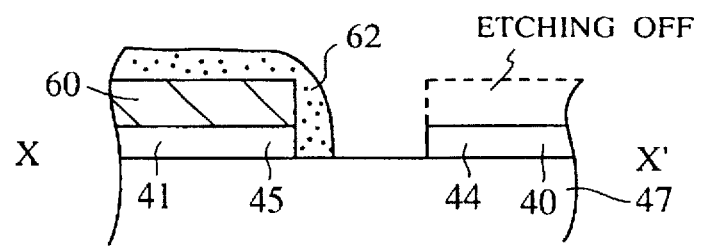

Then, the first metal film 60 on the drain bus line 41 is selectively coated with an about 1 μm-thickness electrodeposited resist film 62. Then, after a baking at about 80° C., ultraviolet rays are applied to harden the electrodeposited resist film 62 (FIG. 53B).

Subsequently the first metal film 60 is etched with the hardened electrodeposited resist film 62 as a mask. Thus, the first metal film 60 on the picture element electrode 40 and the source electrode 44 is selectively etched off to make the picture element electrode region transparent (FIG. 53B).

Figure 53C:
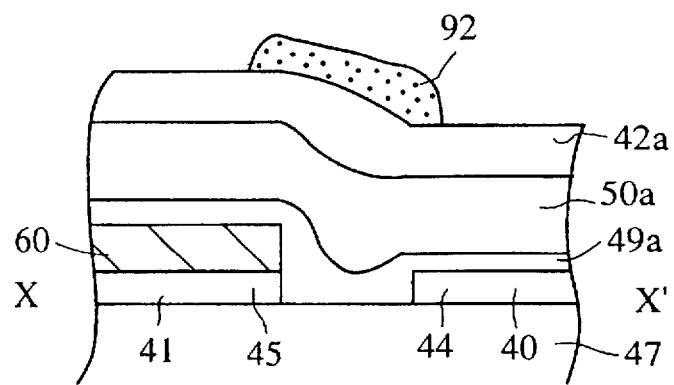

Then, after the electrodeposited resist film 62 is removed, an about 30 nm-thickness P-impurity doped n⁺-amorphous silicon film (not shown), an about 50 nm-thickness amorphous silicon film 49a, an about 300 nm-thickness SiN film 50a are formed by P-CVD. Then, a gate film 42a of an about 200 nm-thickness Cr film is formed on the SiN film 50a by sputtering. Then, a resist film 92 patterned in a configuration of a gate bus line including a gate electrode is formed on the gate film 42a (FIG. 53C).

Figure 53D:
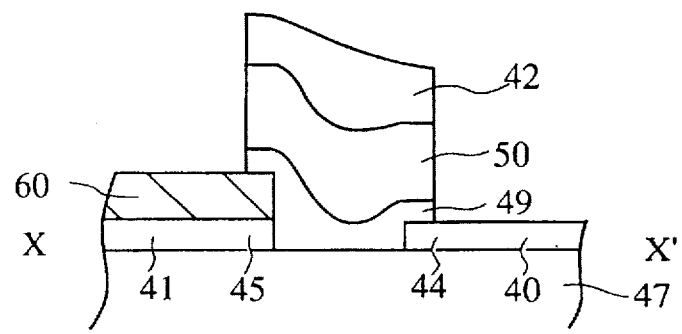

Then, with the resist film 92 as a mask, the gate film 42a, the SiN film 50a, the amorphous silicon film 49a and the n⁺-amorphous silicon film are sequentially etched off to form a source electrode contact layer (not shown) and a drain electrode contact layer (not shown) of the n⁺-amorphous silicon film, an operational semiconductor layer 49 of the amorphous silicon film 49a, a gate insulating film 50 of the SiN film 50a, and the gate bus line 42 including the gate electrode of the gate film 42a (FIG. 53D). Thus the TFT matrix device is completed.

In the method according to the eighteenth embodiment, electrodeposited states of the electrodeposited resist film 62 vary depending on electrodeposition conditions in the step of FIG. 53B. Various electrodeposited states are shown in FIGS. 54A to 54C.

Figure 54A:
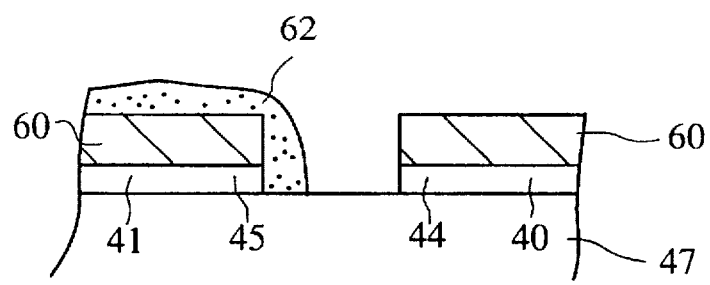
FIGS. 54A to 54C are sectional views of the TFT matrix device to show various electrodeposited states.

When the electrodeposited resist film 62 is electrodeposited on suitable conditions, as shown in FIG. 54A, the electrodeposited resist film 62 is electrodeposited only around the first metal film 60 on the drain bus line 41 and the drain electrode 45.

Figure 54B:
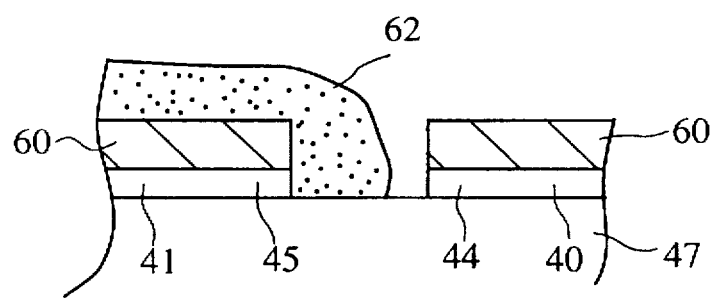

Depending on electrodeposition conditions, as shown in FIG. 54B, the electrodeposited resist film 62 becomes so thick that it intrudes into a region for a channel to be formed between the source electrode 44 and the drain electrode 45.

Figure 54C:
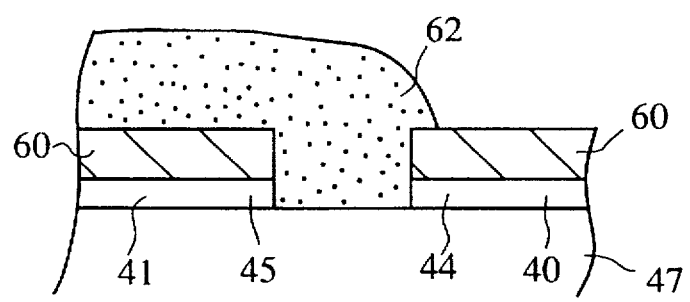

When the electrodeposited resist film 62 is thick as shown in FIG. 54C, the intruding electrodeposited resist film 62 reaches even above the source electrode 44 and the picture element electrode 40. In such state, the electrodeposited resist film 62 cannot ben selectively deposited between the drain bus line 41 and the picture element electrode 40, with the result that the first metal film 60 on the picture element electrode 40 cannot be selectively etched off.

In this embodiment, among the electrodeposition conditions, temperatures of the electrodeposition resist solution, electrodeposition voltages applied for the electrodeposition, and drying temperatures after the electrodeposition were discussed.

For example, in the electrodeposition apparatus of FIG. 40, the insulating substrate 47 was immersed in an electrodeposition resist solution 64 of 15° C., and an electrodeposition voltage was 10 Vdc. That is, when 10 Vdc is applied with the drain bus line 41 on the insulating substrate 47 as the anode, an electrodeposited resist film 62 as thin as about 1–2 μm was precipitated. The electrodeposited resist film 62 was not substantially beyond the charged drain bus line 41. Selectivity between the drain bus line 41 and the picture element electrode 40 could be improved.

Figure 55A:
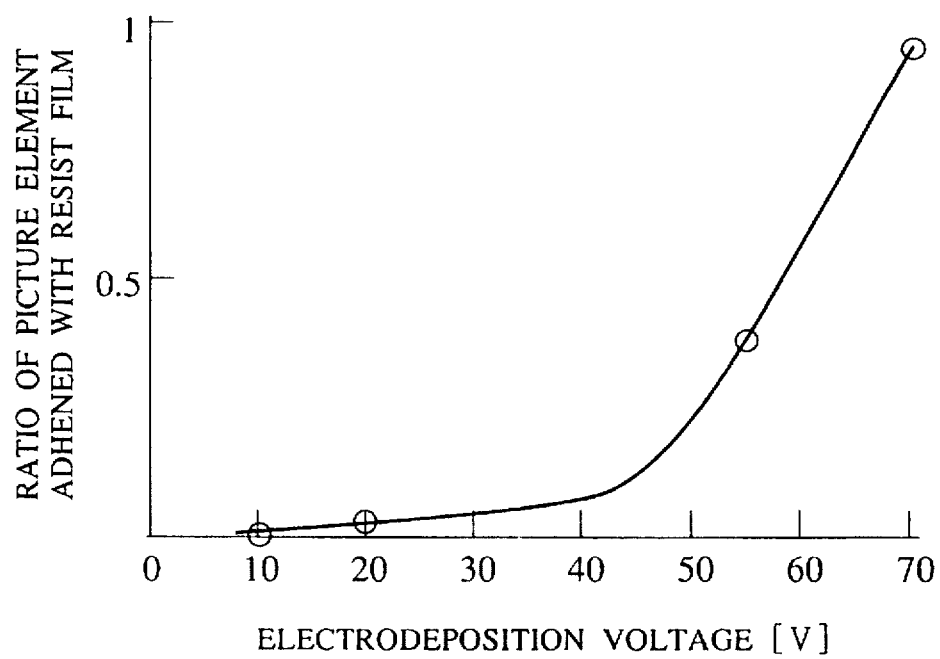
FIG. 55A is a graph to show ratios of the precipitation of the electrodeposited resist film on picture element electrodes corresponding to electrodeposition voltages.

The graph of FIG. 55A shows ratios of the precipitation of the electrodeposited resist film 62 on picture element electrodes 40 corresponding to electrodeposition voltage of 10 to 70 Vdc. A gap between the drain bus lines 41 and the picture element electrodes 40 was 5 μm.

It was found that when an electrodeposition voltage is 70 V, the electrodeposited resist film 62 stays on most of the picture element electrodes 40, but when the electrodeposition voltage is 10 to 20 Vdc, a ratio of the picture element electrodes 40 with the electrodeposited resist film staying is very low, and good selectivity can be provided.

It was also found that by setting a temperature of the electrodeposition solution 64 lower at 5°–20° C., an electric resistance of the electrodeposited resist film 62 when the electrodeposition is conducted can be raised, and a thickness of the electrodeposited resist film 62 can be made thinner when the other electrodeposition conditions are the same.

It was found that the electrodeposited resist film 62 is dried for about 5 minutes in an oven after the electrodeposition, and by drying the electrodeposited resist film 62 at lower temperature than the usual drying temperature, the so-called reflow phenomena that the electrodeposited resist film 62 flows to the pattern sides is small, with the result that improved electrodeposition precision can be provided.

Figure 55B:
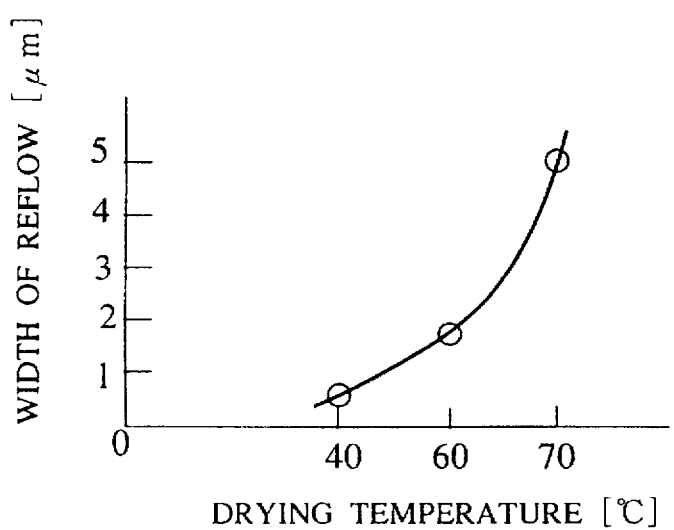
FIG. 55B is a graph to show reflow widths of the electrodeposited resist film from a design pattern corresponding to drying temperatures of the electrodeposited resist film.
Figure 56:
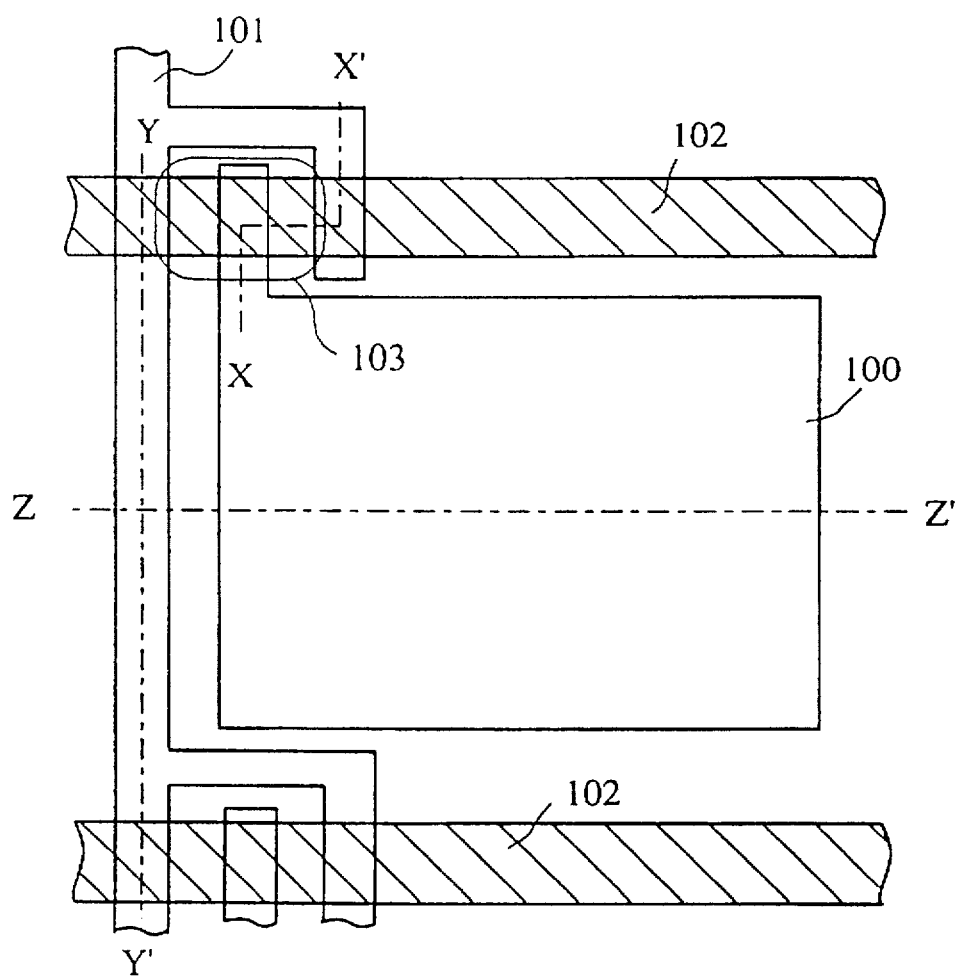
FIG. 56 is a sectional view of the conventional TFT matrix device.
Figure 57A:
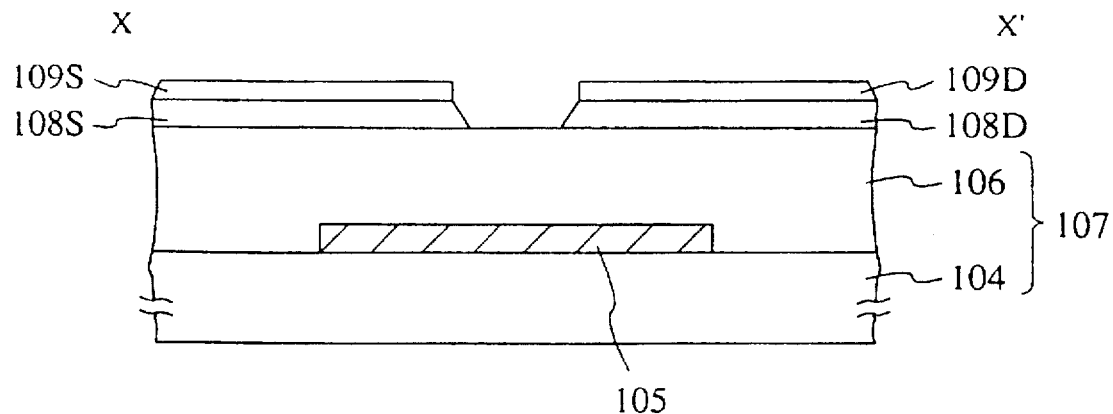
FIGS. 57A, 57B, 58A and 58B and 58C and 58D are sectional views of the TFT matrix device along the line X-X' in FIG. 56 in the respective steps of the fabrication method.
Figure 57B:
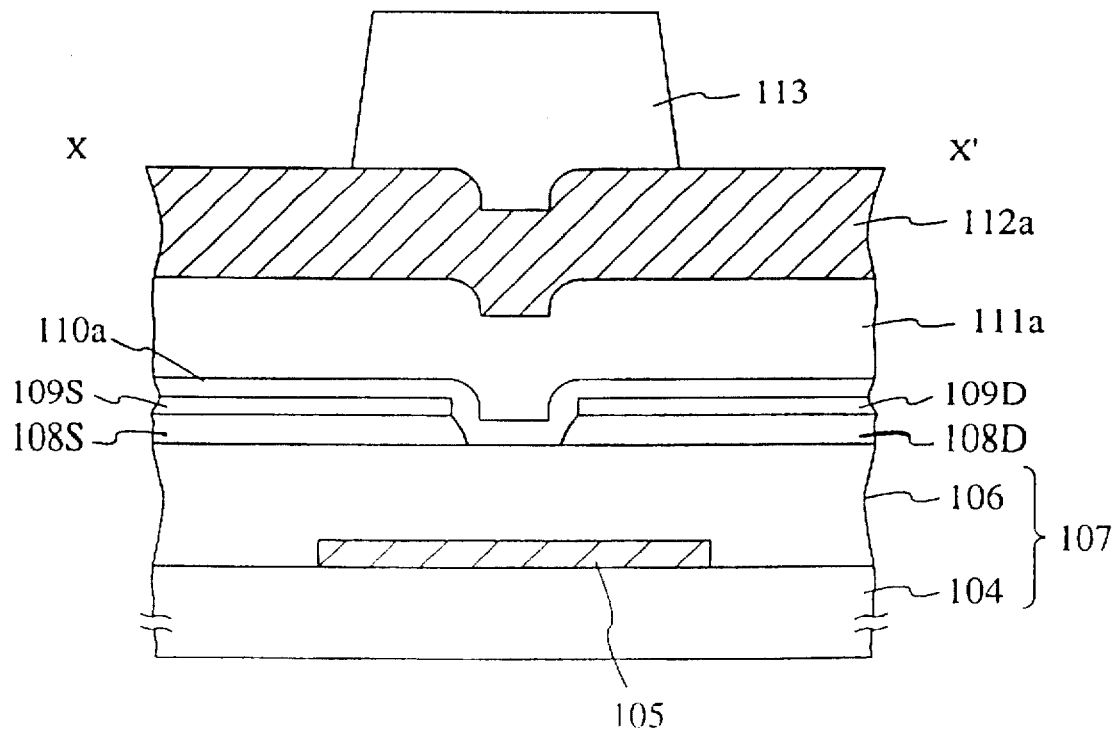
Figure 58A:
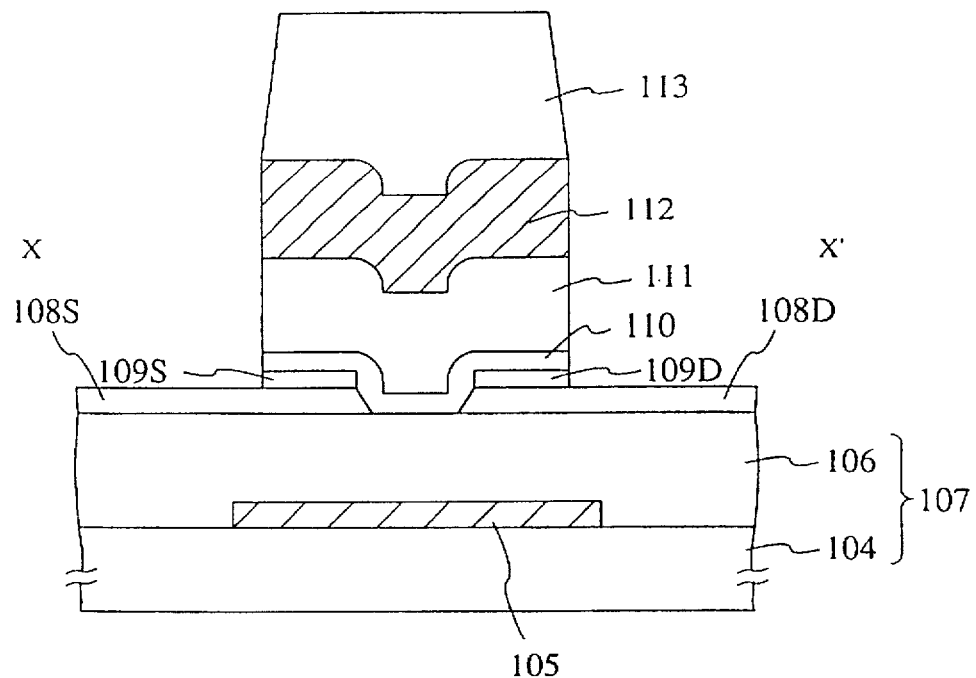
Figure 58B:
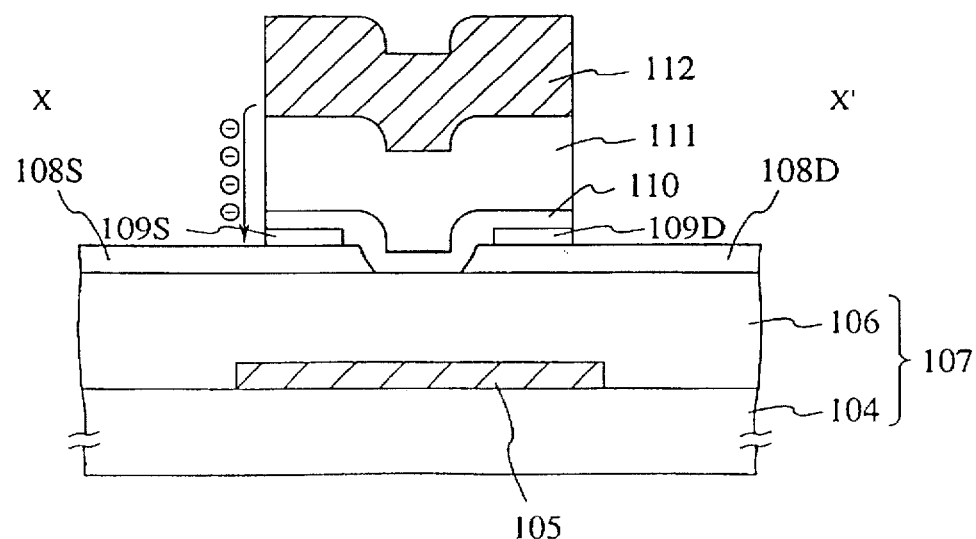
Figure 58C:
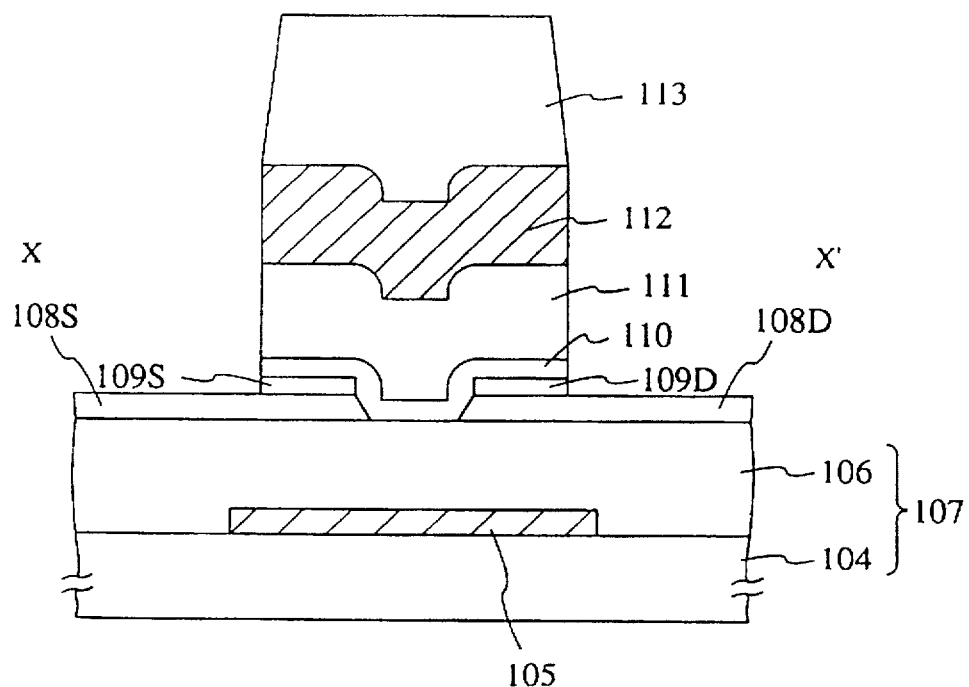
Figure 58D:
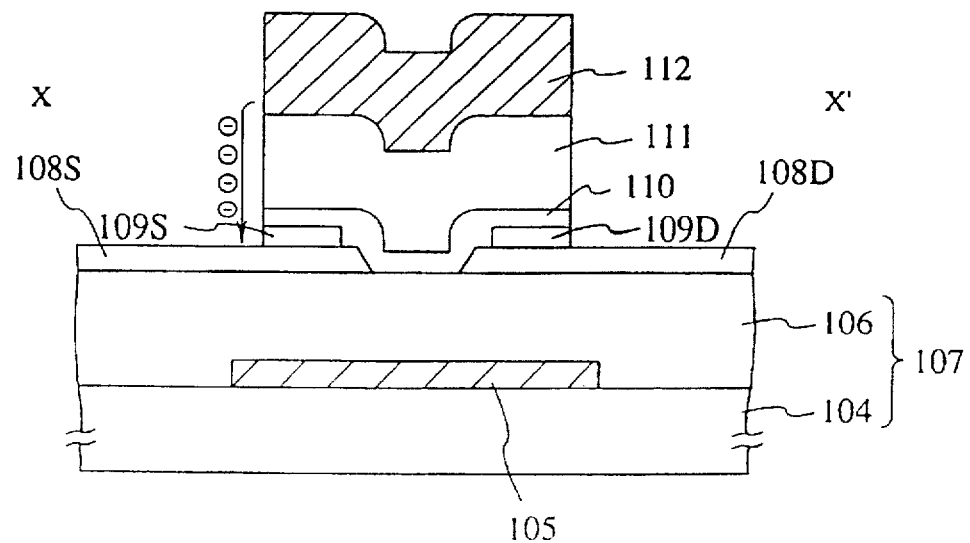
Figure 59A:
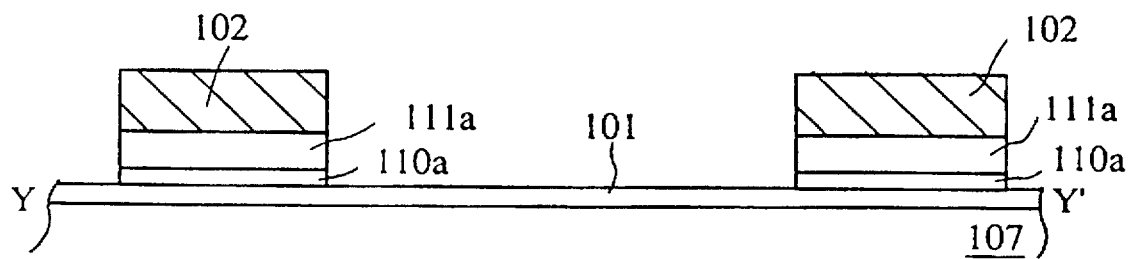
FIG. 59A is a sectional view of the TFT matrix device along the line Y-Y' in FIG. 56.
Figure 59B:
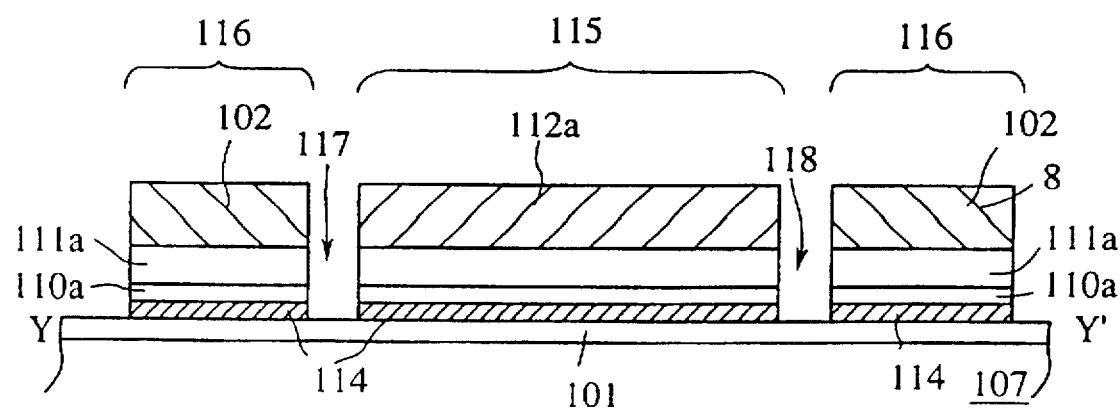
FIG. 59B is the modification of the conventional TFT matrix device shown in FIG. 59A.
Figure 60A:
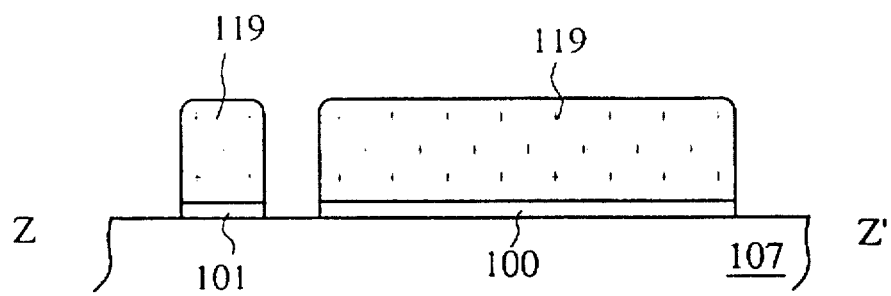
FIGS. 60A to 60C are sectional views of the TFT matrix device along the line Z-Z' in FIG. 56 in the respective steps of the fabrication method.
Figure 60B:
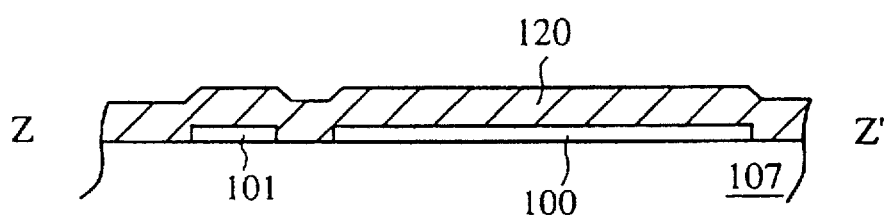
Figure 60C:
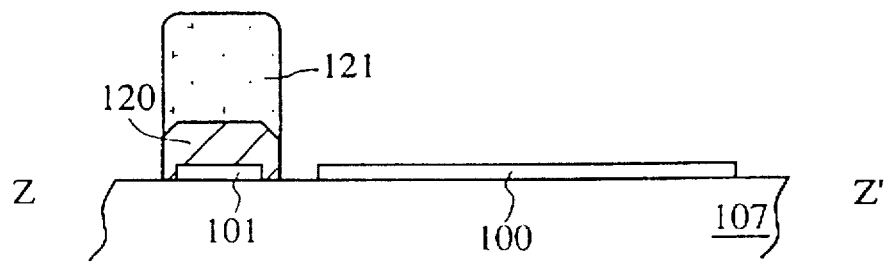

The graph of FIG. 55B shows fellow widths of the electrodeposited resist film 62 from a design pattern corresponding to drying temperatures of the electrodeposited resist film 62 with a temperature of the electrodeposited resist solution set at 15° C. and an electrodeposition voltage set at 15 V.

It was found that by lowering a drying temperature of the electrodeposited resist film 62 from 80° C. to 40° C., a reflow width can be reduced from 5 μm to 1 μm.

According to the eighteenth embodiment, in selectively forming an electrodeposited resist film 62 for a micronized electrode pattern for a TFT matrix device, a thickness of the electrodeposited resist film 62 can be reduced by lowering an electrodeposition voltage to 3–50 V, and the electrodeposition can be made with high precision for a design pattern.

By setting a temperature of the electrodeposition solution for the electrodeposition at 5°–20° C., a resist film resistance can be raised, and the electrodeposited resist film 62 can be made thinner.

Furthermore, by lowering a drying temperature after the electrodeposition to 40°–75° C., reflow widths of the electrodeposited resist film 62 from a design pattern can be made small.

What is claimed is:

1. A method for fabricating a thin film transistor matrix device comprising the steps of:

forming a transparent conductor film and a metal film on an insulating substrate in the stated order;

together patterning the metal film and the transparent conductor film into a configuration which contains at least the picture element electrodes, and drain bus lines or gate bus lines;

applying a current to the drain bus or the gate bus lines in an electrolyte solution to selectively form a protecting film on the drain bus lines or the gate bus lines and on patterns electrically connected to the drain bus lines or the gate bus lines; and etching off the metal film on the picture element electrodes with the protecting film as a mask.

2. A method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the thin film transistors, the method comprising steps of:

forming a transparent conductor film and a metal film on the insulating substrate in the stated order, and together patterning the metal film and the transparent conductor film into a configuration which contains at least the picture element electrodes, and the drain bus lines or the gate bus lines;

applying a current to the drain bus or the gate bus lines in an electrolyte solution to selectively form a protecting film on the drain bus lines or the gate bus lines and on patterns electrically connected to the drain bus lines or the gate bus lines; and etching off the metal film on the picture element electrodes with the protecting film as a mask.

3. A method for fabricating a thin film transistor matrix device according to claim 2, wherein the step of forming the protecting film is a step of forming an electrodeposited resin film as the protecting film by using an electrodeposition process.

4. A method for fabricating a thin film transistor matrix device according to claim 2, wherein the step of forming the protecting film is a step of forming an anodic oxidation film as the protecting film by using an anodic oxidation process.

5. A method for fabricating a thin film transistor matrix device according to claim 2, wherein the step of forming the protecting film is a step of forming a metal film as the protecting film by using an electrodeposition process.

6. A method for fabricating a thin film transistor matrix device according to claim 2, wherein the step of forming the protecting film is a step of forming an electrodeposited resist by using an electrodeposition process.

7. A method for fabricating a thin film transistor matrix device according to claim 6, wherein the drain bus lines or gate bus lines have bus line terminals;

the step of forming the protecting film includes the substeps of:

after the electrodeposited resist is electrodeposited, shielding the bus line terminals of the drain bus lines or the gate bus lines from ultraviolet rays, irradiating the electrodeposited resist with ultraviolet rays with the bus line terminals shielded to harden the electrodeposited resist, and after irradiating the electrodeposited resist, removing the electrodeposited resist from the bus line terminals; and when the metal film on the picture element electrodes is etched off with the electrodeposited resist as a mask, the metal film on the bus line terminals is also etched off to expose the transparent conductor film of the bus line terminals.

8. A method for fabricating a thin film transistor matrix device according to claim 6, wherein when the electrodeposited resist is electrodeposited, an electrodeposition voltage is set to about 3–50 V.

9. A method for fabricating a thin film transistor matrix device according to claim 6, wherein when the electrodeposited resist is electrodeposited, a temperature of the electrodeposited resist is set to about 5°–20° C.

10. A method for fabricating a thin film transistor matrix device according to claim 6, wherein after the electrodeposited resist is electrodeposited, the electrodeposited resist is dried in an atmosphere having a temperature of about 40°–75° C.

11. A method for fabricating a thin film transistor matrix device comprising the steps of:

forming a transparent conductor film and a metal film on an insulating substrate in the stated order;

together patterning the metal film and the transparent conductor film in a set configuration to form picture element electrodes, source electrodes, drain electrodes and drain bus lines from the transparent conductor film such that the picture element electrodes, the source electrodes, the drain electrodes and the drain bus lines have upper surfaces covered by the metal film;

forming a semiconductor layer, an insulating film and a conductor film on the entire surface in the stated order;

patterning the conductor film, the insulating film and the semiconductor layer in a set configuration to form an active layer from the semiconductor layer, gate insulating films from the film, and the gate electrodes and the gate bus lines from the conductor film, while exposing the metal film on the picture element electrodes and the drain bus lines;

applying a current to the drain bus lines in an electrolyte solution to selectively form a protecting film on the metal film of the drain bus lines; and etching off the metal film on the picture element electrodes with the protecting film as a mask to expose the transparent conductor film of the picture element electrodes.

12. A method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the thin film transistors, the method comprising:

- a first step of forming a transparent conductor film and a metal film on the insulating substrate in the stated order, and together patterning the metal film and the transparent conductor film in a set configuration to form the picture element electrodes, the source electrodes, the drain electrodes and the drain bus lines which are formed of the transparent conductor film and have the metal film on upper surfaces thereof;
- a second step of forming a semiconductor layer, an insulating film and a conductor film on the entire surface in the stated order, patterning the conductor film, the insulating film and the semiconductor layer in a set configuration to form an active layer from the semiconductor layer, gate insulating films from the insulating film, and the gate electrodes and the gate bus lines from the conductor film, while exposing the metal film on the picture element electrodes and the drain bus lines;
- a third step of applying a current to the drain bus lines in an electrolyte solution to selectively form a protecting film on the metal film of the drain bus lines; and
- a fourth step of etching off the metal film on the picture element electrodes with the protecting film as a mask to expose the transparent conductor film of the picture element electrodes.

13. A method for fabricating a thin film transistor matrix device according to claim 12, wherein the step of forming the protecting film is a step of forming an electrodeposited resin film as the protecting film by using an electrodeposition process.

14. A method for fabricating a thin film transistor matrix device according to claim 12, wherein the step of forming the protecting film is a step of forming an anodic oxidation film as the protecting film by using an anodic oxidation process.

15. A method for fabricating a thin film transistor matrix device according to claim 12, wherein the step of forming the protecting film is a step of forming a metal film as the protecting film by using an electrodeposition process.

16. A method for fabricating a thin film transistor matrix device according to claim 12, wherein the step of forming the protecting film is a step of forming an electrodeposited resist by using an electrodeposition process.

17. A method for fabricating a thin film transistor matrix device according to claim 12, wherein the third step is for applying a current to the drain bus lines and the gate bus lines in the electrolyte solution to selectively form protecting films on the metal film on the drain bus lines, and on the conductor film of the gate bus lines.

18. A method for fabricating a thin film transistor matrix device according to claim 17, wherein the step of forming the protecting film is a step of forming an electrodeposited resin film as the protecting film by using an electrodeposition process.

19. A method for fabricating a thin film transistor matrix device according to claim 17, wherein the step of forming the protecting film is a step of forming an anodic oxidation film as the protecting film by using an anodic oxidation process.

20. A method for fabricating a thin film transistor matrix device according to claim 17, wherein the step of forming the protecting film is a step of forming a metal film as the protecting film by using an electrodeposition process.

21. A method for fabricating a thin film transistor matrix device according to claim 17, wherein the step of forming the protecting film is a step of forming an electrodeposited resist by using an electrodeposition process.

22. A method for fabricating a thin film transistor matrix device comprising the steps of:

forming a transparent conductor film and a first metal film on an insulating substrate in the stated order;

patterning the first metal film and the transparent conductor film in a set configuration to form picture element electrodes, source electrodes, drain electrodes and drain bus lines from the transparent conductor film such that picture element electrodes, the source electrodes, the drain electrodes and the drain bus lines have upper surfaces with the first metal film formed thereon;

forming a semiconductor layer, an insulating film and a conductor film on the entire surface in the stated order;

patterning the conductor film, the insulating film, the semiconductor layer and the first metal film in a set configuration to form an active layer from the semiconductor layer, gate insulating films from the insulating film, and gate electrodes and gate bus lines from the conductor film, while exposing the transparent conductor film of the picture element electrodes and of the drain bus lines; and applying a current to the drain bus lines in an electrolyte solution to selectively form a second metal film on a surface of the transparent conductor film of the drain bus lines.

23. A method for fabricating a thin film transistor matrix device comprising an insulating substrate, a plurality of picture element electrodes arranged in a matrix on the insulating substrate; a plurality of thin film transistors having source electrodes connected to the respective picture element electrodes; drain bus lines provided between the picture element electrodes in a first direction, and commonly connected to drain electrodes of the respective thin film transistors; gate bus lines intersecting the drain bus lines between the picture element electrodes in a second direction which normally intersects the first direction, and commonly connected to gate electrodes of the respective thin film transistors, the method comprising:

a first step of forming a transparent conductor film and a first metal film on the insulating substrate in the stated order, and patterning the first metal film and the transparent conductor film in a set configuration to form the picture element electrodes, the source electrodes, the drain electrodes and the drain bus lines which are formed of the transparent conductor film and have the first metal film on upper surfaces thereof;

a second step of forming a semiconductor layer, an insulating film and a conductor film on the entire surface in the stated order and patterning the conductor film, the insulating film, the semiconductor layer and the first metal film in a set configuration to form an active layer from the semiconductor layer, gate insulating rims from the insulating film, and the gate electrodes and the gate bus lines from the conductor film, while exposing the transparent conductor film of the picture element electrodes and of the drain bus lines; and a third step of applying a current to the drain bus lines in an electrolyte solution to selectively form a second metal film on a surface of the transparent conductor film of the drain bus lines.

* * * * *